US008108759B2

(12) United States Patent
Moon et al.

(10) Patent No.: US 8,108,759 B2
(45) Date of Patent: Jan. 31, 2012

(54) ERROR DETECTION AND CORRECTION USING ERROR PATTERN CORRECTING CODES

(75) Inventors: Jaekyun Moon, Plymouth, MN (US); Jihoon Park, San Jose, CA (US)

(73) Assignee: Regents of the University of Minnesota, St. Paul, MN (US)

( * ) Notice: Subject to any disclaimer, the term of this patent is extended or adjusted under 35 U.S.C. 154(b) by 1091 days.

(21) Appl. No.: 11/999,263

(22) Filed: Dec. 4, 2007

(65) Prior Publication Data
US 2008/0148129 A1    Jun. 19, 2008

Related U.S. Application Data

(60) Provisional application No. 60/874,861, filed on Dec. 14, 2006, provisional application No. 60/939,047, filed on May 18, 2007, provisional application No. 60/939,058, filed on May 19, 2007, provisional application No. 60/943,727, filed on Jun. 13, 2007.

(51) Int. Cl.
*H03M 13/00* (2006.01)
(52) U.S. Cl. ...................................................... 714/781
(58) Field of Classification Search ................... 714/781, 714/758, 785
See application file for complete search history.

(56) References Cited

U.S. PATENT DOCUMENTS

| | | | | |
|---|---|---|---|---|
| 4,512,020 A | * | 4/1985 | Krol et al. | 714/781 |
| 4,868,828 A | * | 9/1989 | Shao et al. | 714/704 |
| 5,428,629 A | * | 6/1995 | Gutman et al. | 714/758 |
| 5,459,740 A | * | 10/1995 | Glaise | 714/755 |
| 5,778,009 A | * | 7/1998 | Fredrickson et al. | 714/752 |
| 6,427,220 B1 | | 7/2002 | Vityaev | |
| 6,460,150 B1 | | 10/2002 | Cideciyan et al. | |
| 6,581,182 B1 | | 6/2003 | Lee | |
| 6,604,222 B1 | | 8/2003 | Jensen | |
| 6,754,871 B1 | | 6/2004 | Pines et al. | |
| 6,931,585 B1 | | 8/2005 | Burd et al. | |
| 6,986,092 B2 | | 1/2006 | Butler et al. | |
| 6,990,625 B2 | | 1/2006 | Fujiwara et al. | |
| 7,127,660 B2 | | 10/2006 | Blaum | |

(Continued)

OTHER PUBLICATIONS

Office Action from ROC (Taiwan) Patent Application No. 096148132 dated Jan. 20, 2011 with English Translation, 13 pp.

(Continued)

*Primary Examiner* — James C Kerveros
(74) *Attorney, Agent, or Firm* — Shumaker & Sieffert, P.A.

(57) ABSTRACT

In general, the disclosure describes techniques for detecting and correcting single or multiple occurrences of data error patterns. This disclosure discusses the generation and application of high-rate error-pattern-correcting codes to correct single instances of targeted error patterns in codewords, and to further correct a significant portion of multiple instances of targeted error patterns, with the least redundancy. In accordance with the techniques, a lowest-degree generator polynomial may be constructed that targets a set of dominant error patterns that make up a very large percentage of all observed occurrences of errors. The lowest-degree generator polynomial produces distinct, non-overlapping syndrome sets for the target error patterns. The lowest-degree generator polynomial may be constructed such that no two error patterns within the list of dominant error patterns map to the same syndrome set, and the single occurrence and starting position of any of the target error patterns can be successfully identified.

24 Claims, 16 Drawing Sheets

U.S. PATENT DOCUMENTS

| | | | | |
|---|---|---|---|---|
| 7,134,067 | B2 * | 11/2006 | Gallezot et al. | 714/793 |
| 7,278,085 | B1 * | 10/2007 | Weng et al. | 714/766 |
| 2006/0080587 | A1 | 4/2006 | Moon et al. | |
| 2006/0085721 | A1 | 4/2006 | Moon et al. | |
| 2006/0164263 | A1 | 7/2006 | Park et al. | |
| 2007/0061689 | A1 | 3/2007 | Park et al. | |
| 2007/0079209 | A1 | 4/2007 | Park et al. | |
| 2008/0109707 | A1 * | 5/2008 | Dell et al. | 714/776 |
| 2008/0115035 | A1 | 5/2008 | Lee et al. | |
| 2008/0115041 | A1 | 5/2008 | Park et al. | |

OTHER PUBLICATIONS

Notification of Transmittal of the International Search Report and the Written Opinion of the International Searching Authority for corresponding patent application No. PCT/US2007/024793, mailed Jul. 10, 2008, 11 pages.

Moon et al., "Cyclic Redundancy Check Code Based High-Rate Error-Detection Code for Perpendicular Recording," IEEE Transaction on Magnetics, vol. 42, No. 5, pp. 1626-1628, May 2006.

Moon et al., "Detection of Prescribed Error Events: Application to Perpendicular Recording," IEEE International Conference on Communications, Seoul, Korea, pp. 2057-2062, May 16, 2005.

"Error Conrol Coding," 5 pages, www.eecs.berkeley.edu, Spring 2005.

The Notification of the International Preliminary Report on Patentability and Written Opinion for corresponding PCT application No. PCT/US2007/024793, mailed on Jun. 25, 2009 (8 pgs).

J. Park et al., "High-Rate Error-Correction Codes Targeting Dominant Error Patterns," IEEE Transactions on Magnetics, vol. 42, No. 10, pp. 2573-2575, pp. 2573-2575, Oct. 2006.

J. Park et al., "Cyclic Codes Tailored to a Known Set of Error Patterns," Procedures IEEE GLOBECOM 2006, Gen03-4, pp. 1-5, Nov. 2006.

J. Park et al., "A New Class of Error-Pattern-Correcting Cyclic Codes Capable of Handling Multiple Error Occurrences," IEEE Transactions on Magnetics, vol. 43, No. 6, pp. 2268-2270, pp. 2268-2270, Jun. 2007.

\* cited by examiner

ERROR DETECTION AND CORRECTION USING ERROR PATTERN CORRECTING CODES

This application claims the benefit of U.S. Provisional Application No. 60/874,861, filed Dec. 14, 2006, U.S. Provisional Application No. 60/939,047, filed May 18, 2007, U.S. Provisional Application No. 60/939,058, filed May 19, 2007, and U.S. Provisional Application No. 60/943,727, filed Jun. 13, 2007, the entire content of each of which is incorporated herein by reference.

TECHNICAL FIELD

The invention relates to data error detection and correction.

BACKGROUND

Error detection and correction are important features of most modern electronic data communication systems, including wired and wireless telecommunication systems and data recording systems. Electronic communication systems, such as data recording systems, use a variety of error detection coding techniques to permit correction of bit errors in transmitted and recorded symbols that are written to and read from data recording media, also referred to as data storage media. For example, magnetic recording systems, such as tape drives or disk drives, read data from a magnetic medium with a read head and transmit the recovered data to a signal processor, such as a Viterbi detector. Magnetic recording systems typically include error detection coding and error correction to ensure accuracy of the detected data sequences.

Magnetic media, such as magnetic hard drives, magnetic diskettes, magnetic tapes, magnetic tape cartridges, and magnetic-optical disks, can be categorized as either longitudinal or perpendicular. In longitudinal media, magnetic anisotropy extends parallel to the plane of the medium. In other words, in longitudinal media, the magnetic orientation of individual magnetic domains is generally parallel to the surface of the medium. In perpendicular media, on the other hand, magnetic anisotropy is perpendicular to the plane of the medium. In particular, in perpendicular media, the magnetic orientation of individual magnetic domains is perpendicular to the medium surface. Perpendicular media generally allow for a much higher storage density than can be achieved in longitudinal media.

Error detection coding in a magnetic recording system may include a parity bit check. For example, the most significant error events in longitudinal media contain an odd number of erroneous bits. Therefore, the magnetic recording system may include a single parity bit check to detect the error events. However, in perpendicular media, the critical error events may take different forms, as the inter-symbol interference ("ISI") characteristics are substantially different from those present in longitudinal media. Therefore, a single parity bit check may not be able to detect most of the error events in perpendicular media.

SUMMARY

In general, the disclosure describes techniques for detecting and correcting single or multiple occurrences of data error patterns. For example, the techniques may be applied to correct error patterns in data codewords in a communication system, such as a wired or wireless telecommunication system or a data recording system. This disclosure discusses the generation and application of high-rate error-pattern-correcting codes to correct single instances of targeted error patterns in codewords, and to further correct a significant portion of multiple instances of targeted error patterns, with the least redundancy. In accordance with the techniques, a lowest-degree generator polynomial may be constructed that targets a set of dominant error patterns that make up a very large percentage of all observed occurrences of errors. The lowest-degree generator polynomial produces distinct, non-overlapping syndrome sets for the target error patterns. The lowest-degree generator polynomial may be constructed such that no two error patterns within the list of dominant error patterns map to the same syndrome set, and the single occurrence and starting position of any of the target error patterns can be successfully identified with either probability one or with an extremely high probability.

As described in this disclosure, a codeword based on a generator polynomial that produces a distinct, non-overlapping syndrome set for each error pattern in the target set can support high rate error detection and correction performance. By tailoring the generator polynomial specifically to the set of dominant error patterns, the code can be highly effective in handling both single and multiple occurrences of the dominant error patterns at a high code rate.

In addition, the generator polynomial may include an external factor that produces distinct syndrome sets that virtually guarantee correction of a single occurrence of the target error patterns. Furthermore, by multiplying the generator polynomial by the external factor, there may be more available syndrome sets for highly-probable multiple occurrences. This may allow a wide variety of codeword lengths.

When a detector receives a word that was generated using such a generator polynomial, the received word may include errors. Such errors may be attributable to inter-symbol interference, additive white Gaussian noise, or other factors. For this reason, the detector may use the received word to generate an estimated codeword. The estimated codeword is an estimate of the original codeword that is free of the inter-symbol interference errors, additive white Gaussian noise, and errors attributable to other factors. However, the estimated codeword may still include errors that conform to one or more of the dominant error patterns. In order to detect and correct errors in the estimated codeword that conform to one or more of the dominant error patterns, the decoder may generate a list of test words. Each test word may be equal to the estimated codeword plus one or more error events. After generating the set of test words, the decoder may perform decoding in parallel on the test words, thereby generating a set of syndrome polynomials. After decoding the test words, the decoder may identify codewords that correspond to the ones of the test words that, when decoded, generate syndrome polynomials that are equal to zero. For purposes of explanation, this disclosure refers the codewords that correspond to the ones of the test words that, when decoded, generate syndrome polynomials that are equal to zero as "valid codewords." However, not all test words are necessary valid codewords. If the decoder identifies more than one valid codeword, the decoder may select the one of the identified codewords that is deemed to be most likely. Otherwise, if the decoder identifies only a single valid codeword, the decoder may select this codeword. After selecting a codeword, the decoder may reconstruct the message based on the selected codeword.

In one embodiment, a method comprises receiving an estimated codeword in an electronic data communication system and detecting an error event in the estimated codeword using a code based on a generator polynomial $g(x)$ that contains an irreducible factor that is present in a set of targeted error polynomials that represent one or more targeted error patterns.

In another embodiment, a method comprises receiving a message in an electronic communication system and generating a codeword based on the message and a generator polynomial g(x) that contains an irreducible factor that is present in a set of targeted error polynomials that represent one or more targeted error patterns.

In another embodiment, a device comprises a codeword reception unit that receives an estimated codeword representing encoded data and a decoding module that detects an error event in the estimated codeword using a code based on a generator polynomial g(x) that contains an irreducible factor that is present in a set of targeted error polynomials that represent one or more targeted error patterns.

In another embodiment, a computer-readable medium comprises instructions that cause one or more processors of to receive an estimated codeword and detect an error event in the estimated codeword using a code based on a generator polynomial g(x) that contains an irreducible factor that is present in a set of targeted error polynomials that represent one or more targeted error patterns.

In another embodiment, a device comprises an encoding module that receives a message and generates a codeword based on the message and a generator polynomial g(x) that contains an irreducible factor that is present in a set of targeted error polynomials that represent one or more targeted error patterns.

In another embodiment, means for receiving an estimated codeword in an electronic data communication system and means for detecting an error event in the estimated codeword using a code based on a generator polynomial g(x) that contains an irreducible factor that is present in a set of targeted error polynomials that represent one or more targeted error patterns. The generator polynomial g(x) is of a form $g(x)=g'(x)p'(x)$, where $g'(x)$ is a preliminary generator polynomial selected such that there exist a plurality of distinct syndrome sets for the targeted error patterns, and $p'(x)$ is an external factor that is not a factor of any error polynomial in the set of targeted error polynomials.

In another embodiment, a computer-readable medium comprises instructions that cause one or more processors of to receive a message in an electronic communication system and generate a codeword based on the message and a generator polynomial g(x) that contains an irreducible factor that is present in a set of targeted error polynomials that represent one or more targeted error patterns In another embodiment, a method comprises receiving an estimated codeword in an electronic data communication system, computing probability measures of each of a plurality of target error patterns at different positions within a length of the estimated codeword using a finite-window correlator, and utilizing the computed probability measures for soft-input decoding purposes.

Other exemplary embodiments may include, but are not limited to, a data storage system, a data storage method for writing data to a data storage medium, a data storage method for reading data from a data storage medium, a method for transmitting data in a wired or wireless communication system, and a method for receiving data in a wired or wireless communication system.

The details of one or more embodiments of the invention are set forth in the accompanying drawings and the description below. Other features, objects, and advantages of the invention will be apparent from the description and drawings, and from the claims.

DETAILED DESCRIPTION

Figure 1A:
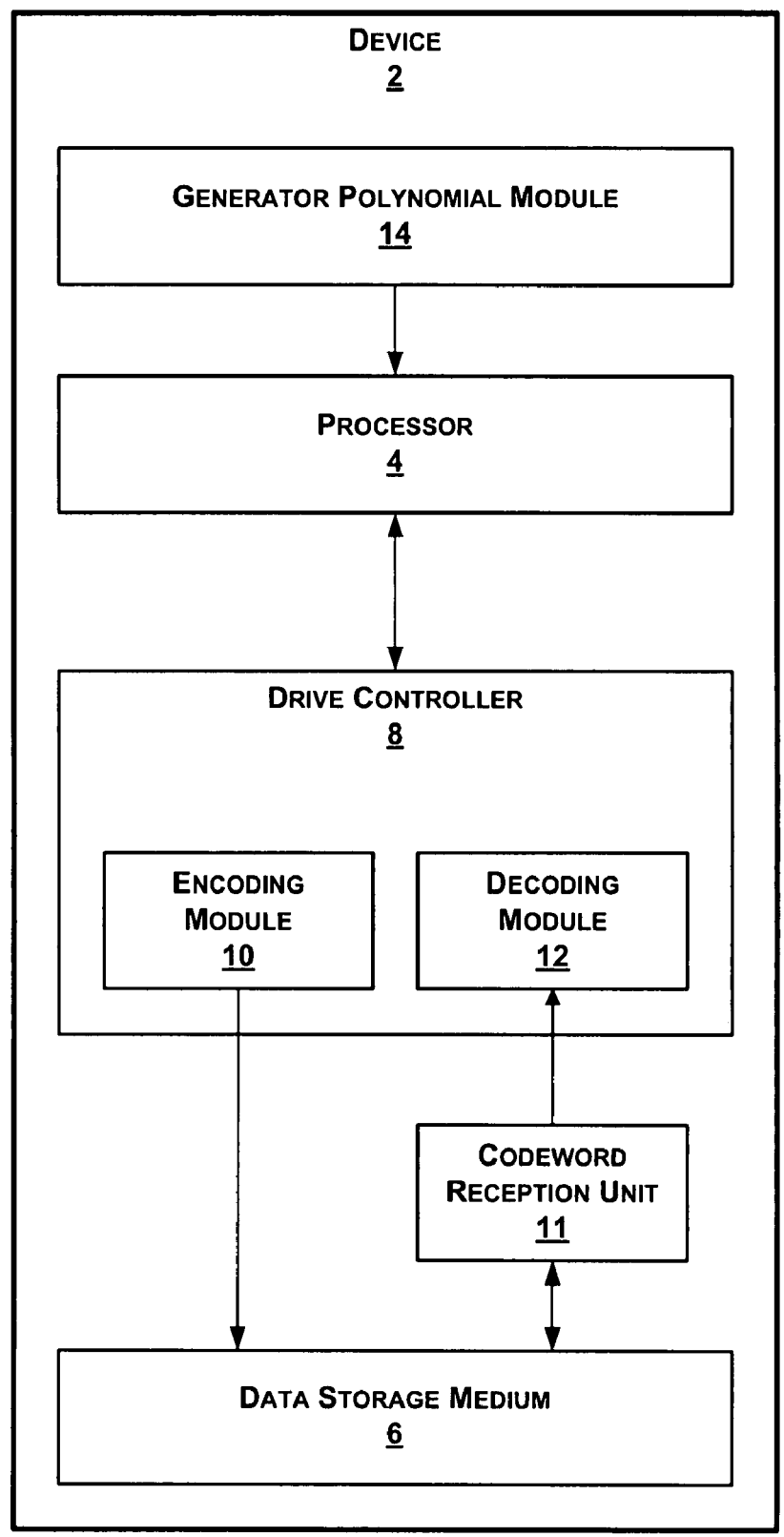
FIG. 1A is a block diagram illustrating an exemplary device that uses error detection and correction techniques.

FIG. 1A is a block diagram illustrating an exemplary device 2 that uses error detection and correction techniques. Device 2 may be a wide variety of devices. For instance, device 2 may be personal computer, a server, a handheld device, a device integrated into a vehicle, a television set-top box, a digital cinema device, a mobile telephone, an intermediate network device, a telephone, an electronic data communication device, or another type of device.

As illustrated in the example of FIG. 1A, device 2 includes a processor 4 and a data storage medium 6. Processor 4 is an integrated circuit that executes software instructions. For instance, processor 4 may be a general-purpose microprocessor, a digital signal processor, an application-specific integrated circuit, or another type of integrated circuit, or a combination of one or more of any of the foregoing components. Data storage medium 6 may be any of a variety of different types of data storage media. For instance, data storage medium 6 may comprise a hard disk, a flash memory unit, a read-only memory unit, a floppy disk, a magnetic tape, an optical disc, a magneto-optical disc, an ultra density optical disc storage medium, a holographic storage medium, a molecular memory medium, a phase-change memory medium, or another type of data storage memory. Magnetic data storage media will be described for purposes of illustration. Data in a magnetic storage medium may be stored in perpendicular or parallel fashions. Furthermore, in the example of FIG. 1A, device 2 includes a drive controller 8. Drive controller 8 controls the reading of data from and the writing of data to data storage medium 6. Processor 4 may use drive controller 8 to read data from or write data to data storage medium 6.

Data retrieved from data storage medium 6 by drive controller 8 may include an error event. For example, processor 4 may use drive controller 8 to write the pattern "0100" to a location in data storage medium 6. However, when processor 4 subsequently uses drive controller 8 to read the data stored at the location in data storage medium 6, drive controller 8 may, despite of the fact that processor 4 has not used drive controller 8 to write any additional data to the location in data storage medium 6, return the pattern "1100". The difference in the first bit of the pattern represents an "error event."

A variety of factors may cause drive controller 8 to return data that contains an error event. For example, the data may have been written to data storage medium 6 incorrectly. In a second example, the data may have been written to data storage medium 6 correctly, but subsequently changed. In a third example, the data may have been written to data storage medium 6 correctly, but was read from data storage medium 6 incorrectly. In the context of a data storage medium, the difference between a word that was written to a location of the data storage medium and the word subsequently read from the location of the data storage medium is the "error event" of the word.

In some cases, an error event of a word may be characterized as containing one or more instances of one or more "error patterns." As used in this disclosure, an "error pattern" is a previously recognized sequence one or more consecutive or non-consecutive incorrect bits. For example, a sequence of two consecutive incorrect bits may constitute a first error pattern. In another example, a sequence of three consecutive incorrect bits followed by five correct bits followed by three consecutive incorrect bits may constitute a second error pattern. An error event may, for example, include an instance of the first error pattern and an instance of the second error pattern.

In order to detect and correct such error events, an encoding module 10 in drive controller 8 uses an error correcting coding scheme to encode data words when processor 4 instructs drive controller 8 to write the data words to data storage medium 6. As used in this disclosure, a "codeword" is an encoded data word. After encoding module 10 encodes a data word (i.e., generates a codeword from a data word), drive controller 8 writes the codeword to a location on data storage medium 6. Subsequently, when processor 4 instructs drive controller 8 to retrieve the data word from the location on data storage medium 6, a codeword reception unit 11 may receive a codeword at the location on data storage medium 6 and may provide the codeword to drive controller 8 retrieves the codeword stored. Codeword reception unit 11 may, for example, comprise one or more disk drive read heads.

As discussed above, the retrieved word may differ from the codeword stored to the location of data storage medium 6. After drive controller 8 retrieves the codeword, a decoding module 12 in drive controller 8 applies the error correction coding scheme to the retrieved word, thereby recreating the original data word. When decoding module 12 applies the error correction coding scheme to the retrieved word, decoding module 12 may detect and correct error events in the retrieved word such that decoding module 12 successfully recreates the original data word. After decoding module 12 recreates the original data word, drive controller 8 may provide the original data word to processor 4.

In the error correction coding scheme applied by encoding module 10, individual data words are characterized as individual "message polynomials." Each term in a message polynomial associated with a data word has a coefficient that is equal to a bit of the data word. For example, let "0100101" be a simple data word. In this example, the message polynomial $m(x)$ associated with the data word is $(0)x^0+(1)x^1+(0)x^2+(0)x^3+(1)x^4+(0)x^5+(1)x^6=x^1+x^4+x^6$. Given a message polynomial $m(x)$, encoding module 10 may generate a codeword polynomial $c(x)$ by multiplying message polynomial $m(x)$ by a polynomial $g(x)$. In other words, $c(x)=m(x) g(x)$. This disclosure refers to the polynomial $g(x)$ as a "generator polynomial." As discussed in detail below, the selection of the generator polynomial may have important impacts on the types of error events that decoding module 12 is able to detect and correct. After encoding module 10 generates a codeword polynomial $c(x)$, encoding module 10 may output the coefficients of each term of the codeword polynomial as a data codeword c that drive controller 8 writes to data storage medium 6. For example, encoding module 10 may generate the data codeword polynomial $c(x)=(1)x^0+(0)x^1+(0)x^2+(1)x^3$. In this example, encoding module may output the data codeword c=1001 based on this codeword polynomial $c(x)$. Note that in this disclosure, bold-faced letters (e.g., c) denote vectors of data.

In general, because a codeword may be produced by multiplying a message polynomial $m(x)$ by a generator polynomial $g(x)$, the number of symbols in a codeword is equal to the maximum allowable degree of a message polynomial $m(x)$ plus the degree of the generator polynomial $g(x)$. The "order" $\Omega$ of a generator polynomial $g(x)$ is defined as the smallest positive integer such that a polynomial of the form $(x^\Omega+1)$ is divided by the generator polynomial $g(x)$. As an illustration, consider the generator polynomial $g(x)=1+x+x^2$: the polynomial $(x^1+1)$ divided by $g(x)$ results in a remainder and the polynomial $(x^2+1)$ divided by $g(x)$ results in a remainder, but the polynomial $(x^3+1)$ divided by $g(x)$ does not result in a remainder. Hence, the order of generator polynomial $g(x)=1+x+x^2$ is 3.

When drive controller 8 retrieves a word r from data storage medium 6, decoding module 12 may characterize the retrieved word r as a "retrieved word polynomial" $r(x)$. For instance, if word r is equal to "1011," decoding module 12 may characterize word r as the retrieved word polynomial $r(x)=(1)x^0+(0)x^1+(1)x^2+(1)x^3=1+x^2+x^4$. When drive controller 8 retrieves the word r from a location on data storage medium 6, retrieved word r may differ from an original codeword c that was written to the location on data storage medium 6. Continuing the previous example, the retrieved word r may be equal to "1011" and the original codeword c generated by encoding module 10 may be equal to "1001".

Note that there is a difference between the third bit of retrieved word r and original codeword c. This difference is an "error event." Continuing the previous example, the error event e=0010 indicates the differences between the retrieved word r=1011 and original codeword c. An error event may be characterized as an "error polynomial." The coefficients of the terms of an error polynomial are equal to the values in an error event. Continuing the previous example, the error event e=0010 may be characterized by the error polynomial $e(x)=(0)x^0+(0)x^1+(1)x^2+(0)x^3=x^2$. Note that the original codeword polynomial $c(x)$ plus the error polynomial $e(x)$ is equal to the retrieved word polynomial $r(x)$ in the Galois field of two ("GF(2)"). Otherwise stated, when the coefficients of the polynomials are either 0 or 1, $c(x)+e(x)=r(x)$. Rearranging this equation shows that $c(x)=r(x)-e(x)$.

Because the original codeword polynomial $c(x)$ is equal to the retrieved word polynomial $r(x)$ minus the error polynomial $e(x)$, decoding module 12 may obtain the original codeword polynomial $c(x)$ by subtracting the error polynomial e(x) from the retrieved word polynomial r(x). Once decoding module 12 obtains the original codeword polynomial c(x), decoding module 12 may reconstruct the original message polynomial m(x). Decoding module 12 may reconstruct the original message polynomial m(x) in a variety of ways. For instance, decoding module 12 may reconstruct the original message polynomial m(x) by dropping the parity bits from the original codeword polynomial c(x). However, in order to subtract the error polynomial e(x) from the retrieved word polynomial r(x), decoding module 12 must first identify error polynomial e(x).

In general terms, decoding module 12 may identify an error polynomial e(x) by first dividing a retrieved word polynomial r(x) by a generator polynomial g(x) that was used to generate the original codeword polynomial c(x). Dividing the retrieved word polynomial r(x) by the generator polynomial g(x) yields a "quotient polynomial" q(x) and a "syndrome polynomial" s(x). A quotient polynomial q(x) is a polynomial that represents the whole number of times that the generator polynomial g(x) divides the retrieved word polynomial r(x). A syndrome polynomial s(x) is a polynomial that represents a remainder that results from a division of a retrieved word polynomial r(x) by a generator polynomial g(x). Otherwise stated, $$\frac{r(x)}{g(x)} = q(x) + \frac{s(x)}{g(x)}.$$

Syndrome polynomial s(x) may also be expressed as (r(x) modulo g(x)). Specific syndrome polynomials s(x) may be associated with specific error polynomials e(x). Decoding module 12 may store a map that specifies which syndrome polynomials are associated with which error polynomials. Thus, by calculating the syndrome polynomial s(x) associated with the retrieved word polynomial r(x), and by using the map that specifies associations between error polynomials and syndrome polynomials, decoding module 12 may identify the error polynomial e(x).

Encoding module 10 and decoding module 12 use a generator polynomial g(x) that is tailored to detect instances of a limited number of "dominant" error patterns. Distance analyses and simulation reveal that, in certain types of data storage or data transmission media, most error events tend to conform to a relatively small number of "error patterns." This may be especially true in interference-dominant channels. This disclosure refers to the most prevalent error patterns as "dominant error patterns." For example, error events in a certain type of data storage medium may conform to an error pattern in which two incorrect bits are followed by a correct bit that is followed by two more incorrect bits. In a second example, in perpendicular magnetic media, dominant error events tend to take the form ±{2 −2} and ±{2 −2 0 2 −2} at medium to high linear densities, and ±{2 −2 0 0 2 −2} at very high linear densities. The above nomenclature refers to an erroneous change in bit value, from the original values to the detected values. For example, ±{2 −2} indicates an erroneous change in two bits, ±{2 −2 0 2 −2} indicates erroneous changes in two bit values, followed by a correct bit, and then followed by erroneous changes in two bit values, and ±{2 −2 0 0 2 −2} indicates erroneous changes in two bit values, followed by two correct bits, and then followed by erroneous changes in two bit values. In this example, a standard parity check may not reveal the presence of the error event because these error events do not change the parity value of the retrieved word. The parity value of the retrieved word does not change because the erroneous bit value changes offset one another.

Table 1, below, lists a set of exemplary dominant error patterns along with corresponding error polynomials that arise in perpendicular magnetic disk drives at the output of a Viterbi detector, in descending order of occurrence frequencies. In the example of Table 1, the inter-symbol interference channel response of $5+6D-D^3$ under 100% additive white Gaussian noise is used to model errors produced by perpendicular magnetic disk drives at the output of the Viterbi detector.

TABLE 1

| Dominant Error Pattern | Error Polynomial |
| --- | --- |
| ±{2} | 1 |
| ±{2 −2} | (1 + x) |
| ±{2 −2 2} | (1 + x + $x^2$) |
| ±{2 −2 2 −2} | (1 + x + $x^2$ + $x^3$) |
| ±{2 −2 2 −2 2} | (1 + x + $x^2$ + $x^3$ + $x^4$) |
| ±{2 −2 2 −2 2 −2} | (1 + x + $x^2$ + $x^3$ + $x^4$ + $x^5$) |
| ±{2 −2 2 −2 2 −2 2} | (1 + x + $x^2$ + $x^3$ + $x^4$ + $x^5$ + $x^6$) |
| ±{2 −2 2 −2 2 −2 2 −2} | (1 + x + $x^2$ + $x^3$ + $x^4$ + $x^5$ + $x^6$ + $x^7$) |
| ±{2 −2 2 −2 2 −2 2 −2 2} | (1 + x + $x^2$ + $x^3$ + $x^4$ + $x^5$ + $x^6$ + $x^7$ + $x^8$) |
| ±{2 −2 2 −2 2 −2 2 −2 2 −2} | (1 + x + $x^2$ + $x^3$ + $x^4$ + $x^5$ + $x^6$ + $x^7$ + $x^8$ + $x^9$) |

An instance of a dominant error pattern may start at any position within a retrieved word r. For example, in a retrieved word r that includes 30 bits, an instance of the error pattern ±{2 −2 0 2 −2} may start at the first bit of the retrieved word r. In this example, the instance of this error pattern may be characterized as the polynomial $e^{(0)}(x)=(1)x^0+(1)x^1+(0)x^2+(1)x^3+(1)x^4=1+x+x^3+x^4$. Furthermore, instances of a given error pattern may be at any given location within a retrieved word r. For example, in a retrieved word r that includes 30 bits, an instance of the error pattern ±{2 −2 0 2 −2} may start at the second bit of the retrieved word r. In this example, this error pattern may be characterized as the polynomial $e^{(1)}(x)=(1)x^1+(1)x^2+(0)x^3+(1)x^4+(1)x^5=x+x^2+x^4+x^5$. This disclosure uses the term "error polynomial set of an error pattern" to refer to the set of error polynomials that characterize each instance of the error pattern that can occur in a codeword. For instance, in the previous examples, the error polynomial set of the error pattern ±{2 −2 0 2 −2} includes the error polynomials $e^{(0)}(x)=1+x+x^3+x^4$, $e^{(1)}(x)=x+x^2+x^4+x^5$, and so on.

This disclosure uses the term "syndrome polynomial set of an error pattern" to refer to a set of syndrome polynomials produced from the division of error polynomials in an error polynomial set of the error pattern by a generator polynomial. For example, retrieved word r may include 30 bits and the error polynomial set of the error pattern ±{2 −2 2} includes the error polynomial $e^{(0)}(x)=1+x+x^2$, $e^{(1)}(x)=x+x^2+x^3$, ..., $e^{(9)}(x)=x^9+x^{10}+x^{11}$, .... In this example, dividing $e^{(0)}(x)$ by the generator polynomial $g(x)=x^8+x^5+x^3+1$ results in the syndrome polynomial $s^{(0)}(x)=1+x+x^2$, dividing $e^{(1)}(x)$ by g(x) results in the syndrome polynomial $s^{(1)}(x)=x+x^2+x^3$, and dividing $e^{(9)}(x)$ by g(x) results in the syndrome polynomial $S^{(9)}(x)=1+x+x^2+x^4+x^7$. Hence, the syndrome polynomials $s^{(0)}(x)$, $s^{(1)}(x)$, $s^{(9)}(x)$ are included (along with syndrome polynomials $s^{(2)}(x)$ through $s^{(8)}(x)$ and $s^{(10)}(x)$ through $s^{(29)}(x)$) in the syndrome polynomial set of the error pattern ±{2 −2 2}.

Syndrome polynomials may be summarized in decimal notation. When a syndrome polynomial is summarized in decimal notation, the coefficient of the lowest-powered term of the syndrome polynomial is associated with the greatest significant bit of a binary number and progressively higher-powered terms of syndrome polynomial are associated with progressively less significant bits of the binary number. This binary number is then converted into a decimal number. For example, 11101001 is the binary number associated with the syndrome polynomial $s^{(9)}(x)=1+x+x^2+x^4+x^7$ of the example in the previous paragraph. The decimal representation of the binary number 11101001 is equal to 233.

Two or more error polynomials in the set of error polynomials of a single dominant error pattern, when divided by a generator polynomial g(x), may result in a common syndrome polynomial. For example, let generator polynomial $g(x)=1+x^3+x^5+x^8$. In this example, the error polynomial $e^{(0)}(x)=1+x+x^2$ and the error polynomial $e^{(10)}(x)=x^{10}+x^{11}+x^{12}$ are error polynomials in the set of error polynomials of the error pattern ±{2 −2 2}. Furthermore, in this example, dividing $e^{(0)}(x)$ by g(x) results in the syndrome polynomial $s^{(0)}(x)=1+x+x^2$ and dividing $e^{(10)}(x)$ by g'(x) results in the syndrome polynomial $s^{(10)}(x)=1+x+x^2$. Notice, in this example, that syndrome polynomials $s^{(0)}(x)$ and $s^{(10)}(x)$ are equal, but error polynomials $e^{(0)}(x)$ and $e^{(10)}(x)$ are not equal.

The number of positions an instance of an error pattern can be shifted within a codeword before the instance of the error pattern is associated with a common syndrome is referred to herein as the "period of the syndrome polynomial set." Otherwise stated, the number of unique syndrome polynomials in a syndrome polynomial set is the period of the syndrome polynomial set. For example, let error pattern $e_{10}$=±{2 −2 2 −2 2 −2 2 −2 2 −2} be one of the dominant error patterns and let $g(x)=1+x^3+x^5+x^8$ be the generator polynomial. In this example, error polynomial $e_{10}^{(0)}(=(1+x+x^2+x^3+x^4+x^5+x^6+x^7+x^8+x^9)$, error polynomial $e_{10}^{(1)}=(x+x^2+x^3+x^4+x^5+x^6+x^7+x^8+x^9+x^{10})$, error polynomial $e_{10}^{(2)}=(x^2+x^3+x^4+x^5+x^6+x^7+x^8+x^9+x^{10}+x^{11})$, and error polynomial $e_{10}^{(3)}=(x^3+x^4+x^5+x^6+x^7+x^8+x^9+x^{10}+x^{11}+x^{12})$. Furthermore, in this example, the resulting syndrome polynomials are $s_{10}^{(0)}(x)=1+x^5$, $S_{10}^{(1)}(x)=x^2+x^7$, $S_{10}^{(2)}(x)=x+x^6$, and $S_{10}^{(3)}(x)=1+x^5$. Hence, in this example, the period of the syndrome polynomial set produced by $g(x)=1+x^3+x^5+x^8$ for error pattern $e_{10}$=±{2 '12 2 −2 2 −2 2 −2 2 −2} is equal to 3. Table 2 below summarizes the periods of syndrome polynomial sets produced when a retrieved codeword containing instances the error polynomials listed in Table 1 are divided by the generator polynomial $g(x)=1+x^3+x^5+x^8$.

Under some circumstances, the "period" of a syndrome polynomial set may be less than the number of positions in a retrieved word r. For instance, as shown in Table 2, a retrieved word r may include 30 symbols and the period of the syndrome polynomial set generated by generator polynomial $g(x)=1+x^3+x^5+x^8$ for error pattern $e_{10}$±{2 −2 2 −2 2 −2 2 −2 2 −2} is equal to 3. Because the period of a syndrome polynomial set may be less than the number of symbols in a retrieved word r, the starting location of error pattern $e_{10}$ may not be immediately apparent given a syndrome polynomial. For example, if decoding module 12 calculates a syndrome polynomial $s(x)=1+x^5$ (i.e., 33 in decimal notation), it may be unclear whether an instance of error pattern $e_{10}$ starts at the first, fourth, seventh, tenth, thirteenth, sixteenth, nineteenth, twenty-second, twenty-fifth, or the twenty-eighth symbol of the retrieved codeword.

Encoding module 10 and decoding module 12 use a generator polynomial g(x) that includes a preliminary generator polynomial g'(x) and an external factor p'(x). The preliminary generator polynomial g'(x) has the property that, for any given first targeted error pattern $e_i$ and second targeted error pattern $e_j$, there does not exist an error polynomial of the first targeted error pattern $e_i$ and an error polynomial of the second targeted error pattern $e_j$ that, when divided by the preliminary generator polynomial g'(x), results in a common syndrome polynomial. Otherwise stated, for any given error polynomials $e_i(x)$ and $e_j(x)$ in a set of targeted error polynomials, $(e_i(x) \bmod g'(x))$ is equal to $(e_j(x) \bmod g'(x))$ only when $e_i(x)$ is equal to $e_j(x)$.

For example, the dominant error patterns of a channel (e.g., data storage medium 6) may comprise the set of targeted error patterns. In this example, the dominant error patterns consists of the error pattern $e_3$=±{2 −2 2} and the error pattern $e_4$=±{2 −2 2 −2}. Furthermore, in this example, when the preliminary generator polynomial g'(x) is used, the syndrome polynomial set of error pattern ±{2 −2 2} and the syndrome polynomial set of error pattern +{2 −2 2 −2} do not share a common syndrome polynomial. In another example, encoding module 10 and decoding module 12 may use the generator polynomial $g(x)=1+x^3+x^5+x^8$ of Table 2 as the preliminary generator polynomial g'(x) because the generator polynomial $g(x)=1+x^3+x^5+x^8$ produces syndrome polynomial sets in which no two syndrome polynomial sets include a common syndrome polynomial.

TABLE 2

| TARGET ERROR POLYNOMIAL | Syndrome set in decimal notation | | | | | | | | | | | | |
|---|---|---|---|---|---|---|---|---|---|---|---|---|---|
| | $S^{(0)}$ | $S^{(1)}$ | $S^{(2)}$ | $S^{(3)}$ | $S^{(4)}$ | $S^{(5)}$ | ... | $S^{(9)}$ | ... | $S^{(14)}$ | ... | $S^{(29)}$ | Period |
| 1 | 128 | 64 | 32 | 16 | 8 | 4 | ... | 74 | ... | 206 | | 41 | 30 |
| (1 + x) | 192 | 96 | 48 | 24 | 12 | 6 | ... | 111 | ... | 169 | | | 15 |
| (1 + x + $x^2$) | 223 | 112 | 56 | 28 | 14 | 7 | ... | 233 | | | | | 10 |
| (1 + x + $x^2$ + $x^3$) | 240 | 120 | 60 | 30 | 15 | 147 | ... | 170 | ... | 201 | | | 15 |
| (1 + x + $x^2$ + $x^3$ + $x^4$) | 248 | 124 | 62 | 31 | 155 | 217 | | | | | | | 6 |
| (1 + x + $x^2$ + $x^3$ + $x^4$ + $x^5$) | 252 | 126 | 63 | 139 | 209 | | | | | | | | 5 |
| (1 + x + $x^2$ + $x^3$ + $x^4$ + $x^5$ + $x^6$) | 254 | 127 | 171 | 193 | 244 | 122 | ... | 182 | ... | 50 | ... | 213 | 30 |
| (1 + x + $x^2$ + $x^3$ + $x^4$ + $x^5$ + $x^6$ + $x^7$) | 255 | 235 | 225 | 228 | 114 | 57 | ... | 17 | ... | 215 | | | 15 |
| (1 + x + $x^2$ + $x^3$ + $x^4$ + $x^5$ + $x^6$ + $x^7$ + $x^8$) | 107 | 161 | 196 | 98 | 49 | 140 | ... | 214 | | | | | 10 |
| (1 + x + $x^2$ + $x^3$ + $x^4$ + $x^5$ + $x^6$ + $x^7$ + $x^8$ + $x^9$) | 33 | 132 | 66 | | | | | | | | | | 3 |

Mathematical analysis shows that if each of the greatest common divisors of preliminary generator polynomial g'(x) and the error polynomials are different, then no two syndrome polynomial sets produced using preliminary generator polynomial g'(x) contain a common syndrome polynomial. For instance, let $d_i(x)$ be the greatest common divisor of preliminary generator polynomial g'(x) and an error polynomial $e_i(x)$ in a set of error polynomials of a dominant error pattern. In this instance, $e_i(x)=d_i(x) e'(x)$ and $g'(x)=d_i(x) g''(x)$. Hence, the syndrome polynomial $s_i(x)=d_i(x)[e'(x)+g''(x) Q_i(x)]$, where $Q_i(x)$ is the quotient when e'(x) is divided by g''(x).

To illustrate why no two syndrome polynomial sets produced using preliminary generator polynomial g'(x) contain a common syndrome polynomial when each of the greatest common divisors of the error polynomials and preliminary generator polynomial g'(x) are different, consider the case in which $d_i(x)$ and $d_j(x)$ are two different greatest common denominators. In this case, the syndrome polynomials in syndrome polynomial set $[s_i(x)]$ for an error polynomial $e_i(x)$ and syndrome polynomial set $[s_j(x)]$ for an error polynomial $e_j(x)$ are given by:

$$S_i^{(\rho)}=d_i(x)[x^\rho e_i'(x)+g_i'(x)Q_i(x)]$$

$$S_j^{(\mu)}=d_j(x)[x^\mu e_j'(x)+g_j'(x)Q_j(x)]$$

for any non-negative integers ρ and μ. Furthermore, assume that syndrome polynomial set $[s_i(x)]$ and syndrome polynomial set $[s_j(x)]$ are the same. In other words, assume that syndrome polynomial set $[s_i(x)]$ and syndrome polynomials set $[s_j(x)]$ contain exactly the same syndrome polynomials. If syndrome polynomial set $[s_i(x)]$ and syndrome polynomial set $[s_j(x)]$ are the same, then $d_i(x)$ must be a factor of any given syndrome polynomial $s_j^{(\mu)}(x)$ in syndrome polynomial set $[s_i(x)]$. That is, $$[x^\mu e_j'(x)+g_j'(x)Q_j(x)]=a(x)d_i(x)$$

where a(x) is a polynomial over GF(2). Because $g'(x)=d_i(x) g''(x)=d_j(x) g''(x)=d_j(x)[d_i(x) g_j'''(x)]$, $$[x^\mu e_j'(x)+g_j'(x)Q_j(x)]=a(x)d_i(x)$$

can be rewritten as $$x^\mu e_j'(x)=c_i(x)[a(x)+g_j''(x)Q_j(x)]$$

However, the equality does not hold for any value of μ or any polynomial a(x) because $$c_i(x) \neq GCD[e_j(x), g(x)]$$

and $x^\mu e_j'(x)$ can not have a factor $d_i(x)$. This is a contradiction of the assumption. Thus, syndrome polynomial set $[s_i(x)]$ and syndrome polynomial set $[S_j(x)]$ are different.

Because no two syndrome polynomial sets produced using preliminary generator polynomial g'(x) contain a common syndrome polynomial when each of the greatest common divisors of the preliminary generator polynomial g'(x) and the error polynomials are different, a generator polynomial module 14 in device 2 may identify preliminary generator polynomial g'(x) such that preliminary generator polynomial g'(x) always gives different greatest common divisors for each error polynomial set associated with the dominant error patterns. In one exemplary implementation, generator polynomial module 14 may be a software module that is executed by processor 4. In another exemplary implementation, generator polynomial module 14 may be a hardware unit within device 2. In yet another exemplary implementation, generator polynomial module 14 may be a software and/or hardware unit in device other than device 2.

In order to identify preliminary generator polynomial g'(x), consider that each error polynomial associated with a dominant error pattern may be factored into one or more irreducible polynomials. As used in this disclosure, an "irreducible polynomial" is a polynomial that, when divided by any polynomial other than 1 and itself, results in a non-zero remainder. For example, an instance of the error pattern $e_7=\pm\{2\ -2\ 2\ -2\ 2\ -2\ 2\}$ at the first bit of a codeword may be characterized by the error polynomial $e_7(x)=1+x+x^2+x^3+x^4+x^5+x^6=(1+x+x^3)(1+x^2+x^3)$. In this example, $(1+x+x^3)$ and $(1+x^2+x^3)$ are irreducible polynomials of $(1+x+x^2+x^3+x^4+x^5+x^6)$.

Furthermore, consider that the factors of some error polynomials may include multiple instances of a single irreducible polynomial. For example, an instance of the error pattern $e_8\pm\{2\ -2\ 2\ -2\ 2\ -2\ 2\ -2\}$ at the first bit of a codeword may be characterized by the error polynomial $e_8(x)=+x+x^2+x^3+x^4+x^5+x^6+x^7$. In this example, $e_8(x)$ may be factored as $(1+x)(1+x)(1+x)(1+x)(1+x)(1+x)(1+x)=(1+x)^7$. $(1+x)$ is an irreducible polynomial. Hence, in this example, the factors of error polynomial $e_8(x)$ include seven instances of the irreducible polynomial $(1+x)$.

In addition, consider that a single irreducible polynomial may be a factor of two or more error polynomials associated with different error patterns. For example, an instance of the error pattern $\pm\{2\ -2\}$ at the first bit of a codeword may be characterized by the error polynomial $e_2(x)=(1+x)$ and an instance of the error pattern $\pm\{2\ -2\ 2\ -2\ 2\ -2\ 2\ -2\}$ at the first bit of a codeword may be characterized by the error polynomial $e_8(x)=1+x+x^2+x^3+x^4+x^5+x^6+x^7=(1+x)^7$. In this example, $(1+x)$ is an irreducible polynomial that is a factor of two or more error polynomials associated with different error patterns.

Taking these considerations into account, generator polynomial module 14 may identify the preliminary generator polynomial g'(x) as $g'(x)=p_1^{d_1}(x)p_2^{d_2}(x)\ldots p_k^{d_k}\ldots p_K^{d_K}(x)$, where k ranges from 1 to K and where each $p_k(x)$ represents a distinct irreducible polynomial that is a factor of one or more of the error polynomials, where K is equal to the number of distinct irreducible polynomials that are factors of one or more of the error polynomials, and where each $d_k$ is equal to the maximum power in which irreducible factor $p_k(x)$ appears in any error polynomial $e_i(x)$, for $i=1, 2, \ldots, L$, in the error polynomial sets of the dominant error patterns.

For example, Table 3 below specifies the irreducible polynomials associated with each dominant error pattern listed in Table 1.

TABLE 3

| Dominant Error Pattern | Error Polynomial |
| --- | --- |
| ±{2} | 1 |
| ±{2 −2 2} | $(1 + x + x^2)$ |
| ±{2 −2} | $(1 + x)$ |
| ±{2 −2 2 −2} | $(1 + x + x^2 + x^3) = (1 + x)^3$ |
| ±{2 −2 2 −2 2} | $(1 + x + x^2 + x^3 + x^4)$ |
| ±{2 −2 2 −2 2 −2} | $(1 + x + x^2 + x^3 + x^4 + x^5) = (1 + x)(1 + x + x^2)^2$ |
| ±{2 −2 2 −2 2 −2 2} | $(1 + x + x^2 + x^3 + x^4 + x^5 + x^6) = (1 + x + x^3)(1 + x^2 + x^3)$ |
| ±{2 −2 2 −2 2 −2 2 −2} | $(1 + x + x^2 + x^3 + x^4 + x^5 + x^6 + x^7) = (1 + x)^7$ |
| ±{2 −2 2 −2 2 −2 2 −2 2} | $(1 + x + x^2 + x^3 + x^4 + x^5 + x^6 + x^7 + x^8) = (1 + x + x^2)(1 + x^3 + x^6)$ |
| ±{2 −2 2 −2 2 −2 2 −2 2 −2} | $(1 + x + x^2 + x^3 + x^4 + x^5 + x^6 + x^7 + x^8 + x^9) = (1 + x)(1 + x + x^2 + x^3 + x^4)^2$ |

In this example, the error polynomials associated with the dominant error patterns consist of six distinct irreducible polynomials: $p_1(x)=(1+x), p_2(x)=(1+x+x^2), p_3(x)=(1+x+x^2+x^3+x^4), p_4(x)=(1+x+x^3), p_5(x)=(1+x^2+x^3), p_6(x)=(1+x^3+x^6)$. Furthermore, each distinct irreducible polynomial in the error polynomials has a maximum power. In this example, the maximum power $d_1$ of irreducible polynomial $p_1(x)$ is equal to 7, the maximum power $d_2$ of irreducible polynomial $p_2(x)$ is equal to 2, the maximum power $d_3$ of irreducible polynomial $p_3(x)$ is equal to 2, the maximum power $d_4$ of irreducible polynomial $p_4(x)$ is equal to 1, the maximum power $d_5$ of irreducible polynomial $p_5(x)$ is equal to 1, and the maximum power $d_6$ of irreducible polynomial $p_6(x)$ is equal to 1. Table 4, below, presents the irreducible polynomials presented in Table 3 along with their maximum powers.

TABLE 4

| Irreducible polynomial | Maximum power |
|---|---|
| $p_1(x) = (1 + x)$ | 7 |
| $p_2(x) = (1 + x + x^2)$ | 2 |
| $p_3(x) = (1 + x + x^2 + x^3 + x^4)$ | 2 |
| $p_4(x) = (1 + x + x^3)$ | 1 |
| $p_5(x) = (1 + x^2 + x^3)$ | 1 |
| $p_6(x) = (1 + x^3 + x^6)$ | 1 |

As discussed above, a preliminary generator polynomial of the form $g'(x)=p_1^{d_1}(x)p_2^{d_2}(x) \ldots p_K^{d_K}(x)$ yields distinct syndrome sets for each of the dominant error patterns. Hence, in the example of tables 3 and 4, by applying irreducible polynomials $p_1(x)$ through $p_6(x)$ and maximum powers $d_1$ through $d_6$, generator polynomial module 14 may derive the preliminary generator polynomial $g'(x)=(1+x)^7 (1+x+x^2)^2 (1+x+x^2+x^3+x^4)^2 (1+x+x^3) (1++x^2+x^3)(1+x^3+x^6)$. In this example, the degree of preliminary generator polynomial $g'(x)$ is 31.

In some circumstances, generator polynomial module 14 may identify a lower-degree preliminary generator polynomial that yields distinct syndrome sets of each of the dominant error patterns. To illustrate why a lower-degree preliminary generator polynomial may be identified, consider that it has been shown that different GCDs for all $e_i(x)$'s guarantee distinct syndrome sets. However, the converse is not necessarily true. Although $e_i(x)$ and $e_j(x)$ have common factors to $g(x)$, i.e., the same GCDs, the corresponding syndrome polynomial sets $[s_i(x)]$ and $[s_j(x)]$ can be different. Assuming greatest common divisor $d_i(x)$ is equal to greatest common divisor $d_j(x)$, where $1<i, j<L$, for syndrome polynomial $s_i^{(\rho)}(x)$ and syndrome polynomial $s_j^{(\mu)}(x)$ to be identical, the following equality must hold:

$$d_i(x)[x^\rho e'_i(x)+g''_i(x)Q_i(x)]=c_j(x)[x^\mu e'_j(x)+g''_j(x)Q_j(x)]$$

Rearranging the above equality yields the following equality:

$$[x^\rho e_i(x)+x^\mu e_j(x)]=g(x)[Q_i(x)+Q_j(x)]$$

Thus, syndrome polynomial set $[s_i(x)]$ is equal to syndrome polynomial set $[s_j(x)]$ only if $x^\rho e_i(x)+x^\mu e_j(x)$ is a multiple of preliminary generator polynomial $g'(x)$. Without loss of generality, it can be said that if $e_i(x)+x^\mu e_j(x)$ is not a multiple of preliminary generator polynomial $g'(x)$ for any non-negative integer $\mu$, then syndrome polynomial set $[s_i(x)]$ and syndrome polynomial set $[s_j(x)]$ are different. This means that there can exist lower-degree generator polynomials that yield distinct syndrome sets for the target error polynomials, because each power $d_k$, $k=1, 2, \ldots, K$, can be smaller.

Figure 15:
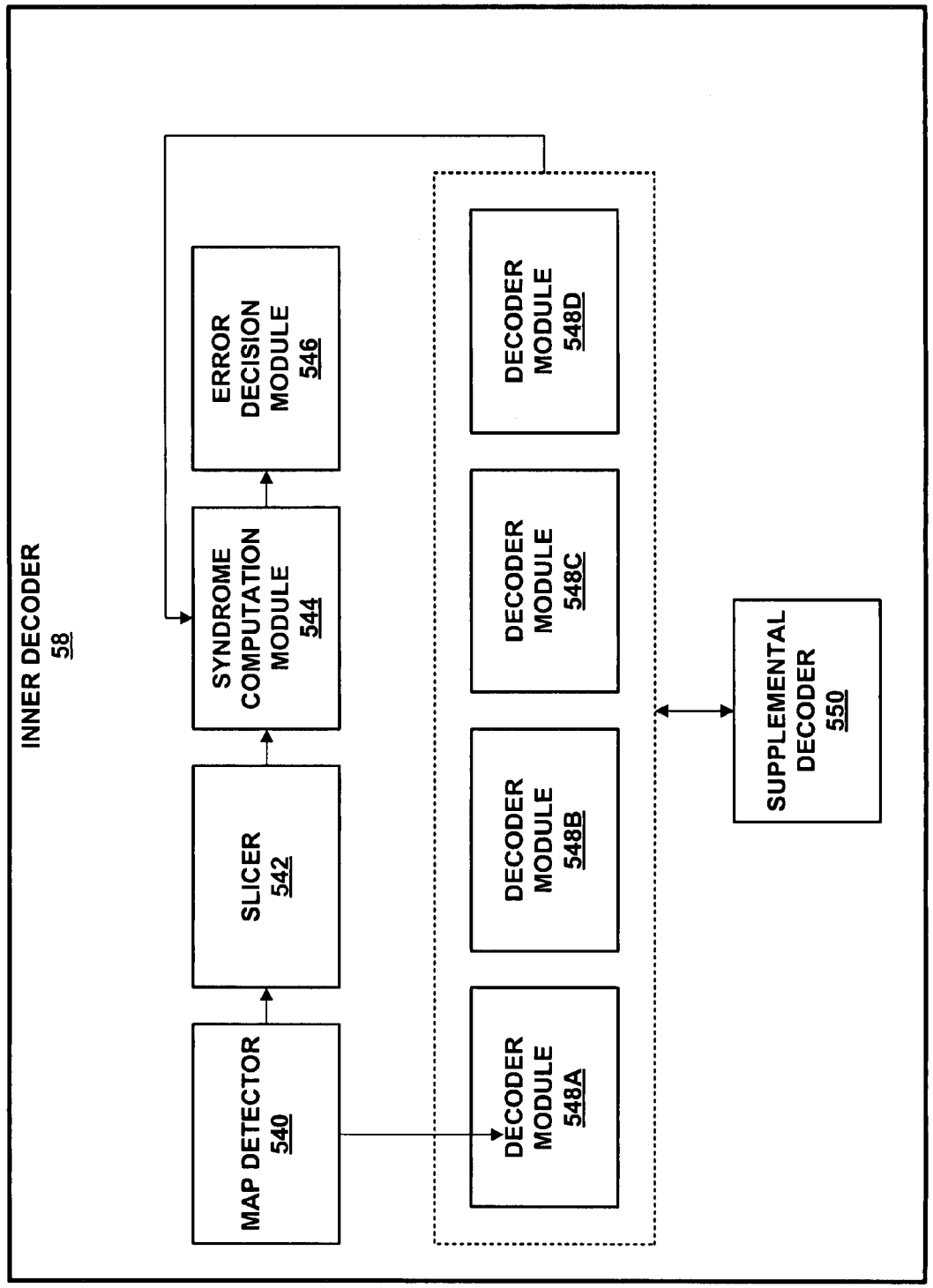
FIG. 15 is a block diagram illustrating an alternate implementation of the inner decoder.

For example, generator polynomial module 14 may identify the preliminary generator polynomial $g'(x)=1+x^3+x^5+x^8$. In this example, the preliminary generator polynomial $g'(x) =1+x^3+x^5+x^8$ yields distinct syndrome sets for each of the dominant error patterns listed in Table 1, above. The use of a lower-degree preliminary generator polynomial may be advantageous because hardware implementations of decoding module 12 that use lower-degree preliminary generator polynomials may be less complex than hardware implementations of decoding module 12 that use preliminary generator polynomials of the form $g'(x)=p_1^{d_1}(x)p_2^{d_2}(x) \ldots p_K^{d_K}(x)$. In addition, the use of a lower-degree preliminary generator polynomial may also improve the code rate. FIGS. 15 and 16 below illustrate exemplary operations by which generator polynomial module 14 may identify such a lower-degree preliminary generator polynomial.

After generator polynomial module 14 identifies the preliminary generator polynomial $g'(x)$, encoding module 10 may use the preliminary generator polynomial $g'(x)$ to generate codewords that are $\Omega_{preliminary}$ symbols long based on messages that are $(\Omega_{preliminary}-\delta_{preliminary})$ symbols long, where $\Omega_{preliminary}$ is equal to the order of preliminary generator polynomial $g'(x)$ and where $\delta_{preliminary}$ is equal to the degree of preliminary generator polynomial $g'(x)$. In other words, encoding module 10 may use preliminary generator polynomial $g'(x)$ to produce $(\Omega_{preliminary}, \Omega_{preliminary}-\delta_{preliminary})$ cyclic codes.

In another alternative, decoder 12 may use a generator polynomial $g(x)$ that is equal to the preliminary generator polynomial $g'(x)$ multiplied by an external factor $p'(x)$. External factor $p'(x)$ is a degree-m primitive polynomial that is not a factor of any of error polynomials in the set of targeted error polynomials. The use of a generator polynomial $g(x)$ that includes external factor $p'(x)$ may resolve a number of issues that may arise if decoder 12 were to use a generator polynomial that is equal to the preliminary generator polynomials discussed above. These issues include, for example, the fact that the "code rate" of a code based on the preliminary generator polynomial alone may be too low to be useful in data storage medium 6. As used in this disclosure, the term "code rate" refers to the total number of bits in a codeword compared to the number of bits that are represented by the codeword. For example, the code rate of a code based on preliminary generator polynomial $g'(x)=1+x^3+x^5+x^8$ is (30, 22), meaning that a 30-bit codeword represents 22 bits of encoded information. That is, only about 73% of information in a codeword represents encoded information and about 27% of information in a codeword is added for purposes of error detection and correction. Another issue that may arise if decoding module 12 were to use a generator polynomial that is equal to the preliminary generator polynomials discussed above is that the "periods" of some syndrome polynomial sets produced by the preliminary generator polynomials are less than the codeword length.

Multiplying the preliminary generator polynomial $g'(x)$ by external factor $p'(x)$ may increase the code rate to a level at which a code is useful in data storage medium 6. For instance, let a set of L dominant error patterns be characterized as error polynomial sets $[e_1(x)]$ through $[e_L(x)]$ and let $g'(x)$ be a degree-r preliminary generator polynomial that yields distinct syndrome polynomial sets for error polynomials sets $[e_1(x)]$ through $[e_L(x)]$. In this instance, decoding module 12 may use the generator polynomial $g(x)=g'(x) p'(x)$. Furthermore, in this instance, external factor $p'(x)$ is a degree-m primitive polynomial that is not a factor of any of error polynomial in error polynomial sets $[e_1(x)]$ through $[e_L(x)]$. The order $\Omega_{external}$ of external factor $p'(x)$ is greater than the order $\Omega_{preliminary}$ of preliminary generator polynomial $g'(x)$. Given order $\Omega_{external}$ and order $\Omega_{preliminary}$ the order $\Omega_{final}$ of final generator polynomial $g(x)$ is equal to the lowest common multiple of order $\Omega_{external}$ and order $\Omega_{preliminary}$. In other words, order $\Omega_{final}$ is the smallest integer such that both preliminary generator polynomial $g'(x)$ and external factor $p'(x)$ are factors of a polynomial $(x^{\Omega_{final}}+1)$.

Because the order $\Omega_{external}$ and order $\Omega_{preliminary}$ are non-negative integers that are not equal, the lowest common multiple of order $\Omega_{external}$ and order $\Omega_{preliminary}$ (i.e., $\Omega_{final}$) is greater than either $\Omega_{external}$ and $\Omega_{preliminary}$. Because order $\Omega_{final}$ is greater than either order $\Omega_{eternal}$ and order $\Omega_{preliminary}$, and because the maximum degree $\delta_m$ of a message polynomial m(x) is set such that the maximum degree $\delta_m$ of the message polynomial m(x) is equal to the order $\Omega_{final}$ minus the degree of the final generator polynomial g(x), a codeword produced by multiplying a message polynomial m(x) by final generator polynomial g(x) may include more bits than a codeword produced by multiplying the message polynomial m(x) by a preliminary generator polynomial g'(x). For example, let preliminary generator polynomial $g'(x)=(1+x^3+x^5+x^8)$ and let external factor $p'(x)=(1+x+x^6)$. In this example, the order $\Omega_{preliminary}$ of g'(x) is 30 and the order $\Omega_{external}$ of p'(x) is equal to 63. Consequently, in this example, if encoding module 10 and decoding module 12 were to use preliminary generator polynomial g'(x) as the generator polynomial, the maximum degree of message polynomial m(x) is 22 (i.e., 30−8). The lowest common multiple of 30 and 63 is 630. Consequently, in this example, if encoding module 10 and decoding module 12 use a generator polynomial g(x) that is equal to g'(x) p'(x), the degree $\delta_{final}$ of generator polynomial g(x) is equal to 14 (i.e., $\delta_{preliminary}+\delta_{external}=8+6=14$). Furthermore, in this example, because the degree $\delta_{final}$ of final generator polynomial g(x) is 14, the maximum degree of message polynomial m(x) is 616 (i.e., $\Omega_{final}-\delta_{final}=630-14=616$).

The code rate of a codeword produced by multiplying a message polynomial m(x) by the final generator polynomial g(x) may be greater than the code rate of a codeword produced by multiplying a message polynomial m(x) by preliminary generator polynomial g'(x). In the example of the previous paragraph, the code rate of a codeword produced by multiplying a message polynomial m(x) by final generator polynomial g(x) is 0.98 (i.e., 616/630). In contrast, in the previous example, the code rate of a codeword produced by multiplying a message polynomial m(x) by preliminary generator polynomial g'(x) is 0.73 (i.e., 22/30).

Because external factor p'(x) is not a factor of an error polynomial associated with a dominant error pattern and because preliminary generator polynomial g'(x) produces distinct syndrome polynomial sets for each dominant error pattern, the final generator polynomial g(x) also produces distinct syndrome polynomial sets for each dominant error pattern. In addition, the periods of each of the syndrome polynomial sets produced by final generator polynomial g(x) may have periods that are greater than the periods of syndrome polynomial sets produced by the preliminary generator polynomial g'(x). For instance, let $S_i'$ be a syndrome polynomial set associated with an error pattern $e_i$ produced by preliminary generator polynomial g'(x) and let $S_i$ be a syndrome polynomial set associated with the error pattern $e_i$ produced by final generator polynomial g(x). In this instance, the period of syndrome polynomial set $S_i$ may be obtained by identifying the lowest common multiple of the period of syndrome polynomial set $S_i'$ and the order of external factor p'(x). For example, let the period of syndrome polynomial set $S_i'$ be equal to 15 and let the order of external factor p'(x) be equal to 63. In this example, the period of syndrome polynomial set $S_i$ is equal to 315. Table 5, below, presents the periods of syndrome polynomial sets $S_i'$ and $S_i$ for each of the dominant error patterns presented in Table 1 when final generator polynomial $g(x)=g'(x)p'(x)=(1+x^3+x^5+x^8)(1+x^6)=1+x+x^3+x^4+x^5+x^8+x^{11}+x^{14}$.

TABLE 5

| Error pattern index | Target Error Pattern | Period of $S_i'$ | Period of $S_i$ |
|---|---|---|---|
| 1 | ±{2} | 30 | 630 |
| 2 | ±{2 −2 2} | 10 | 630 |
| 3 | ±{2 −2} | 15 | 315 |
| 4 | ±{2 −2 2 −2} | 15 | 315 |
| 5 | ±{2 −2 2 −2 2} | 6 | 126 |
| 6 | ±{2 −2 2 −2 2 −2} | 5 | 315 |
| 7 | ±{2 −2 2 −2 2 −2 2} | 30 | 630 |
| 8 | ±{2 −2 2 −2 2 −2 2 −2} | 15 | 315 |
| 9 | ±{2 −2 2 −2 2 −2 2 −2 2} | 10 | 630 |
| 10 | ±{2 −2 2 −2 2 −2 2 −2 2 −2} | 3 | 63 |

When the period of a syndrome polynomial set $S_i$ associated with an error pattern $e_i$ produced by a final generator polynomial g(x) is equal to the order $\Omega_{final}$ of final generator polynomial g(x), decoding module 12 may detect and correct instances of error pattern $e_i$ that begin at any position of a retrieved word r without the significant possibility of mis-correction. For example, note that the exemplary periods of syndrome polynomial sets $S_1, S_2, S_7$, and $S_9$ specified in Table 5 are equal to the order $\Omega_{final}$ of final generator polynomial $g(x)=1+x+x^3+x^4+x^5+x^8+x^{11}+x^{14}$. Because the periods of syndrome polynomial sets $S_1, S_2, S_7$, and $S_9$ are equal to the order $\Omega_{final}$ of final generator polynomial g(x), instances of error patterns $e_1, e_2, e_7$, and $e_9$ at any position in a retrieved word r may be associated with distinct syndrome polynomials. Because instances of error patterns $e_1, e_2, e_7$, and $e_9$ at any position in a retrieved word r may be associated with distinct syndrome polynomials, decoding module 12 may detect and correct instances of error patterns $e_1, e_2, e_7$, and $e_9$ at any position in the retrieved word r without any significant likelihood of mis-correction. Empirical research has shown that for channels (e.g., media storage medium 6) that have an inter-symbol interference channel response of $5+6D-D^3$ under 100% additive white Gaussian noise, errors conforming to error patterns $e_1, e_2, e_7$, and $e_9$ constitute 64.924% of overall instances of all error.

When the period of a syndrome polynomial set $S_i$ associated with an error pattern $e_i$ produced by a final generator polynomial g(x) is less than the order $\Omega_{final}$ of final generator polynomial g(x), a single syndrome polynomial $s_i(x)$ may be associated with two or more instances of error pattern $e_i$ that start at different positions within retrieved word r. When a single syndrome polynomial $s_i(x)$ may be associated with two or more instances of an error pattern $e_i$ that start at different positions within a retrieved word r, there remains a possibility that decoding module 12 may mis-correct instances of error pattern $e_i$ that begin at the two or more positions in retrieved word r. For example, note that the exemplary periods of syndrome polynomial sets $S_3, S_4, S_5, S_6, S_8$, and $S_{10}$ specified in Table 5 are less than the order $\Omega_{final}$ of final generator polynomial $g(x)=1+x+x^3+x^4+x^5+x^8+x^{11}+x^{14}$. Because the periods of syndrome polynomial sets $S_3, S_4, S_5, S_6, S_8$, and $S_{10}$ are less than the order $\Omega_{final}$ of final generator polynomial g(x), instances of error patterns $e_3, e_4, e_5, e_6$, and $e_8$, and $e_{10}$ may start at two or more different positions within retrieved word r. Because instances of error patterns $e_3, e_4, e_5, e_6$, and $e_8$, and $e_{10}$ may start at two or more different positions within retrieved word r, decoding module 12 may mis-correct instances of error patterns $e_3, e_4, e_5, e_6$, and $e_8$, and $e_{10}$. In order to reduce the probability of miscorrection, decoder 12 may, as described below, use reliability measures to determine locations that are most likely to contain instances of the error patterns.

Decoding module 12 may use a bit-polarity check on a retrieved word r to reduce the number of possible positions within retrieved word r at which an instance of an error pattern may start. Reducing the number of possible positions within retrieved word r at which an instance of an error pattern may start may reduce the possibility of decoding module 12 miscorrecting instances of error patterns that are associated with syndrome polynomials sets having periods that are less than the order $\Omega_{final}$ of final generator polynomial g(x). For example, given the final generator polynomial $g(x)=1+x+x^3+x^4+x^5+x^8+x^{11}+x^{14}$, there are two possible positions within a retrieved word r at which error pattern $e_{10}=\pm\{2\ -2\ 2\ -2\ 2\ -2\ 2\ -2\ 2\ -2\}$ may begin. Furthermore, in this example, if the first one of these positions does not contain either [1, 0, 1, 0, 1, 01, 0, 1, 0] or [0, 1, 0, 1, 0, 1, 0, 1, 0, 1], then the other position is likely to contain the instance of error pattern $e_{10}$.

Conventional codes may be able to algebraically correct frequently observed, dominant error patterns of length t or less within a retrieved word. However, the correction power is not effectively utilized when some of the target error patterns have very long lengths, or the number of the target error patterns is relatively small (but their occurrence frequencies are significant), compared to $(2^t-1)$ possible error patterns of length t or less. This is because the conventional burst-error-correcting cyclic codes are designed based on the maximum length t of burst errors to be corrected, regardless of a set of dominant error patterns. Moreover, as the maximum length t increases, the codeword lengths become impractically longer, and multiple error patterns that are beyond the correction capability inevitably occur.

With error-pattern-correcting codewords constructed in accordance with the techniques described in this disclosure, syndrome polynomials associated with the codewords may completely identify any single occurrence of a target error pattern, as well as highly-probable multiple occurrences, among the target error patterns. The codewords can algebraically offer complete error correction capability if the precise position is yielded; otherwise, the final decision of the actual error position is made based on certain reliability measures of the few possible positions. Afterwards, the syndrome re-check may confirm the error position with a high probability of accuracy, thereby virtually preventing mis-correction.

The electronic communication and/or storage techniques described in this disclosure, including generating distinct syndrome sets for target error patterns, may be particularly useful for cyclic codes because of their practical advantages in allowing low implementation complexity. However, such coding schemes may be equally applicable to non-cyclic codes. Accordingly, the techniques can be used to construct cyclic codes or non-cyclic codes that are effective in correcting known error cluster patterns.

Figure 1B:
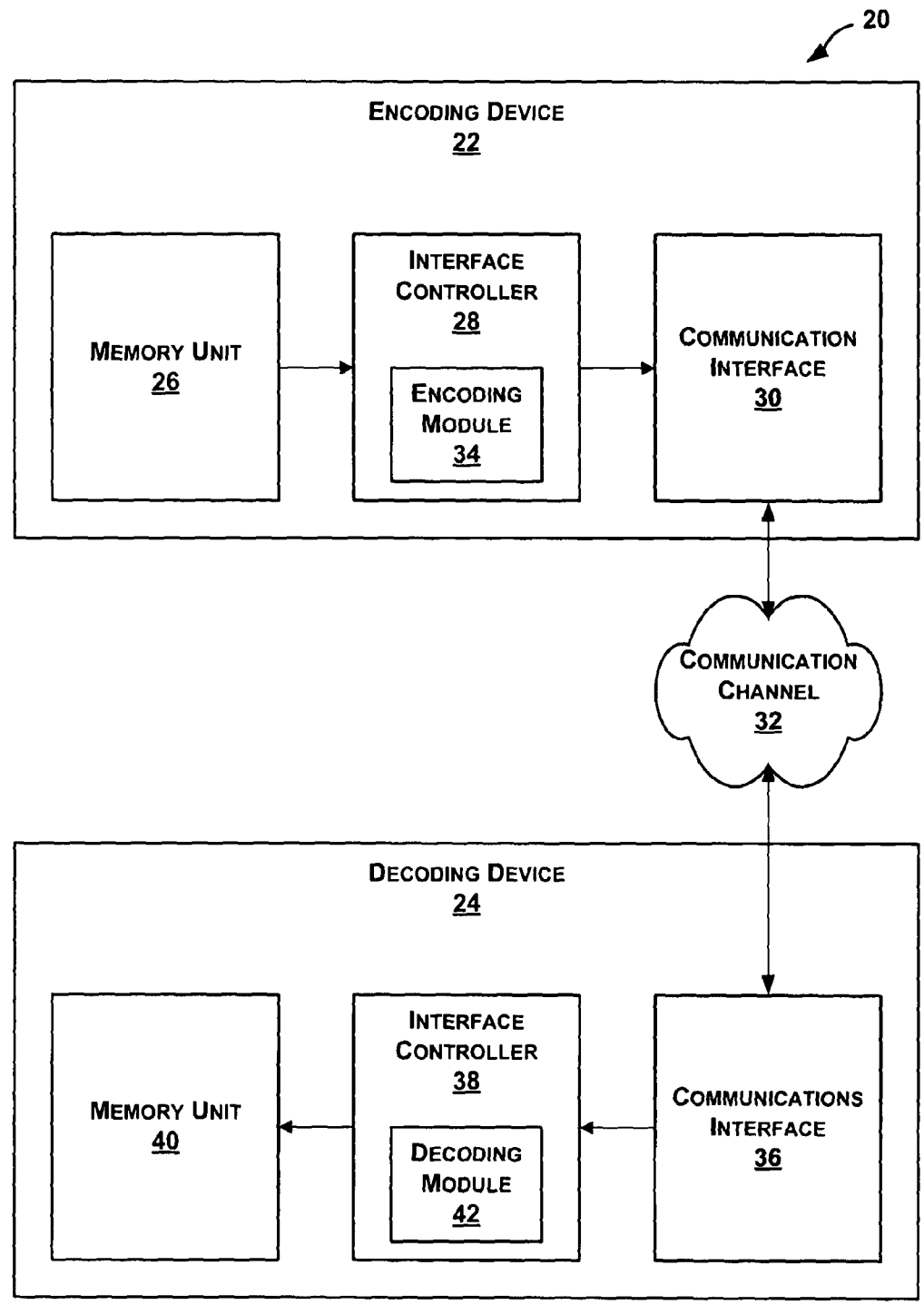
FIG. 1B is a block diagram illustrating an exemplary system in which devices use error detection and correction techniques.

FIG. 1B is a block diagram illustrating an exemplary system 20 in which an encoding device 22 and a decoding device 24 use error detection and correction techniques in an electronic data communication process.

In the example of FIG. 1B, encoding device 22 and decoding device 24 may be a wide variety of different types of devices. For instance, either or both of encoding device 22 and decoding device 24 may be personal computers, servers, handheld devices, devices integrated into a vehicle, television set-top boxes, digital cinema devices, mobile telephones, intermediate network devices, telephones, or other types of devices.

In the example of FIG. 1B, encoding device 22 includes a memory unit 26, an interface controller 28, and a communications interface 30. Memory unit 26 may be a variety of different types of data storage media. For instance, memory unit 26 may be a random access memory ("RAM") unit, a magnetic disk, an optical disc, or another type of data storage medium. Communications interface 30 enables encoding device 22 to receive data from and send data on a communications channel 32. For example, communications channel 32 may be a computer network. In this example, communication interface 30 may be an Ethernet card, a token ring interface, an asynchronous transfer mode ("ATM") interface, a fiber optic network interface, a wireless interface (e.g., Wi-Fi, Bluetooth, WiMax, Wireless Broadband, etc.), a modem interface, or another type of network interface. In a second example, communication channel may be a device connection channel. In this second example, communications interface 30 may be a Universal Serial Bus ("USB") interface, a Firewire interface, a serial interface, or another type of device connection interface.

Interface controller 28 may cause communications interface 30 to send data stored in memory unit 26. For example, interface controller 28 may be a software driver that enables a processor (not shown) of encoding device 22 to communicate with communications interface 30. In this example, the processor of encoding device 22 may retrieve data from memory unit 26 and instruct interface controller 28 to cause communications interface 30 to send the data on communications channel 32.

As illustrated in the example of FIG. 1B, interface controller 28 may include an encoding module 34. Encoding module 34 may function in a manner similar to encoding module 10 (FIG. 1A). That is, encoding module 34 may encode data to be sent on communications channel 32 using a generator polynomial of the form g(x)=g'(x)p'(x), where g'(x) is a preliminary generator polynomial that, for any given error polynomials $e_i(x)$ and $e_j(x)$ in a set of targeted error polynomials, $(e_i(x) \bmod g'(x))$ is equal to $(e_j(x) \bmod g'(x))$ only when $e_i(x)$ is equal to $e_j(x)$; and where p'(x) is an external factor that is not a factor of any error polynomial in the set of targeted error polynomials.

Furthermore, as illustrated in the example of FIG. 1B, decoding device 24 includes a communications interface 36, an interface controller 38, and a memory unit 40. Communications interface 36, like communications interface 30 may be a network interface, a device connection interface, or another type of communications interface. Communications interface 36 may constitute a codeword reception unit because communications interface 36 may receive a codeword. Moreover, memory unit 40, like memory unit 26 may be a RAM unit, a magnetic disk, an optical disc, or another type of data storage medium. Interface controller 38, like interface controller 28 may be a software driver that enables a processor (not shown) of decoding device 24 to communicate with communications interface 36.

As illustrated in the example of FIG. 1B, interface controller 38 may include a decoding module 42. When communications interface 36 receives data via communications channel 32, decoding module 42 may decode the data using the generator polynomial g(x). After decoding module 42 decodes the data, interface controller 38 may store the decoded data into memory unit 40.

The foregoing techniques may be implemented individually, or two or more of such techniques, or all of such techniques, may be implemented together. The components of device 2, encoding device 22 and decoding device 24 are exemplary of those applicable to implement the techniques described herein. Any or all of device 2, encoding device 22 and decoding device 24 may, however, include many other components, if desired, as well as fewer components that combine the functionality of one or more of the modules described above. The components in device 2, encoding device 22 and decoding device 24 may be implemented as one or more processors, digital signal processors, application specific integrated circuits (ASICs), field programmable gate arrays (FPGAs), discrete logic, software, hardware, firmware, or any combinations thereof. Depiction of different features as modules is intended to highlight different functional aspects of device 2, encoding device 22 and decoding device 24 and does not necessarily imply that such modules must be realized by separate hardware or software components. Rather, functionality associated with one or more modules may be integrated within common or separate hardware or software components.

Figure 2:
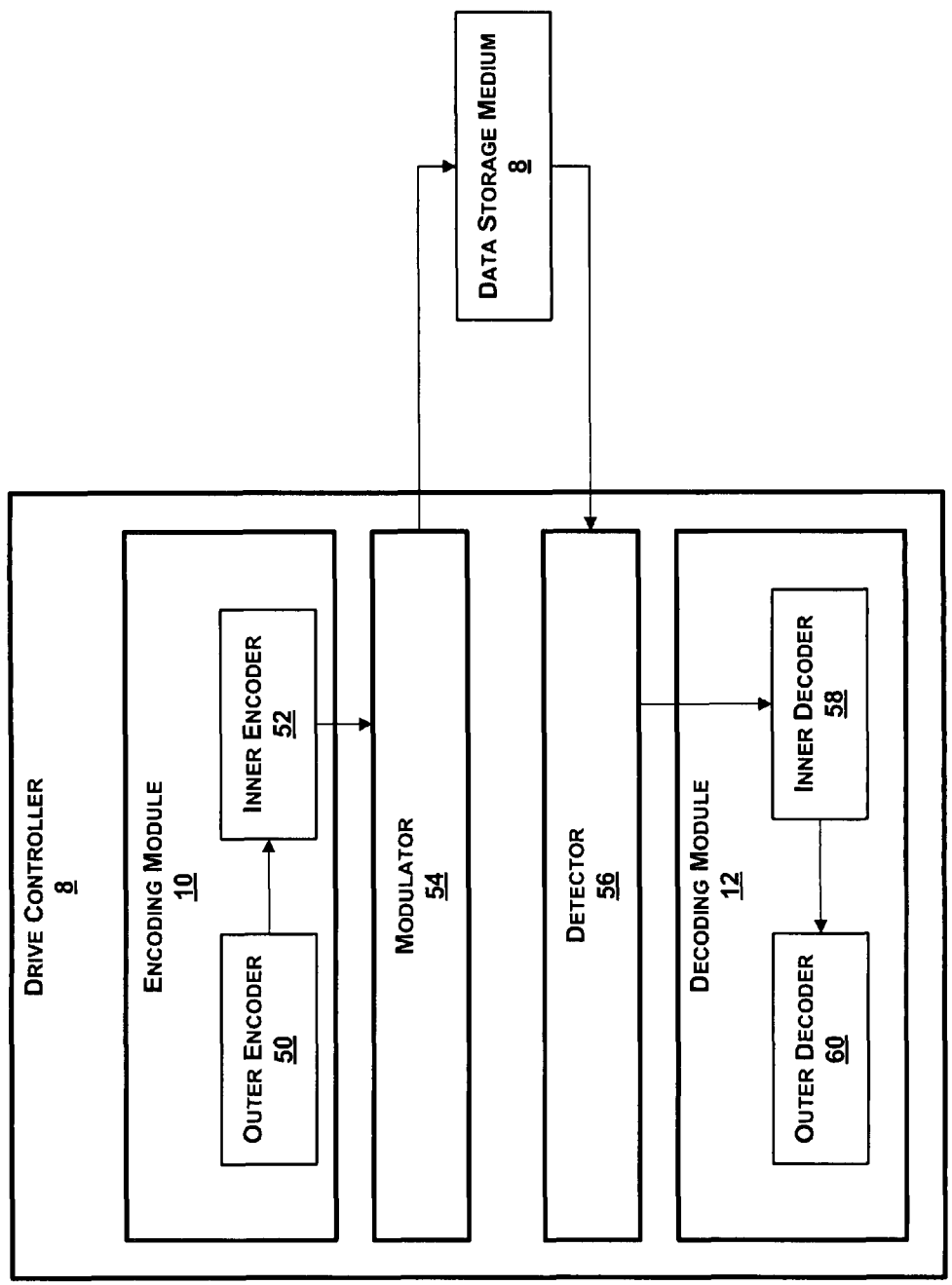
FIG. 2 is a block diagram illustrating exemplary details of a drive controller.

FIG. 2 is a block diagram illustrating exemplary details of encoding module 10 and decoding module 12. Although FIG. 2 is explained with reference drive controller 8 of FIG. 1A, the exemplary details of encoding module 10 and decoding module 12 illustrated in FIG. 2 may be equally applicable to encoding module 34 and decoding module 42 in FIG. 1B.

In the example of FIG. 2, encoding module 10 includes an outer encoder 50 and an inner encoder 52. Outer encoder 50 may use a first encoding scheme to encode data. For example, outer encoder 50 may use a Reed-Solomon error-correcting coding scheme to encode the data. The Reed-Solomon error-correcting coding scheme is an error-correcting code that works by oversampling a polynomial constructed from the data. In another example, outer encoder 50 may use a Turbo error-correcting coding scheme to encode the data. Outer encoder 50 may pass encoded data to inner encoder 52.

When inner encoder 52 receives data (e.g., data encoded by outer encoder 50), inner encoder uses a generator polynomial $g(x)$ of the form $g(x)=g'(x)p'(x)$, where $g'(x)$ is a preliminary generator polynomial that, for any given error polynomials $e_i(x)$ and $e_j(x)$ in a set of targeted error polynomials, $(e_i(x) \mod g'(x))$ is equal to $(e_j(x) \mod g'(x))$ only when $e_i(x)$ is equal to $e_j(x)$; and where $p'(x)$ is an external factor that is not a factor of any error polynomial in the set of targeted error polynomials. When inner encoder 52 generates encoded data, inner encoder 52 may store the encoded data to a location in data storage medium 6.

In the example of FIG. 2, drive controller 8 includes a modulator 54. Modulator 54 receives bits from inner encoder 52 and translates the bits into electrical impulses. For example, modulator 54 may receive the bits 10110 from inner encoder 52. In this example, if a voltage transition indicates a bit with the value of 1, modulator 54 may output electrical impulses that include voltage transitions in first, third, and fourth time periods and no voltage transitions in the second and fifth time periods.

In the example of FIG. 2, drive controller 8 includes a detector 56. Detector 56 receives electrical impulses from data storage medium 6 and translates the electrical impulses into bits. For example, detector 56 may receive electrical impulses from data storage medium 6. The voltage levels of these electrical impulses may form a readback waveform that includes a voltage transition during a first, third, and fourth time periods and no voltage transitions during second and fifth time periods. In this example, if a voltage transition indicates a bit with the value of 1, when detector 56 receives these electrical impulses, detector 56 may output the bits 10110. Detector 56 may use a Viterbi algorithm to translate the electrical impulses into bits.

In the example of FIG. 2, decoding module 12 includes an inner decoder 58 and an outer decoder 60. When inner decoder 58 receives bits from detector 56, inner decoder 58 uses the generator polynomial $g(x)$. After inner decoder 58 decodes the received data, inner decoder 58 may pass the decoded data to outer decoder 60. Furthermore, when inner decoder 58 decodes the received data, inner decoder 58 may generate bit-level "soft-outputs" for bits of the decoded data. A soft-output for a bit of the decoded data indicates a level of confidence in the correctness of the bit.

Outer decoder 60 may use the first encoding scheme to decode the data that inner decoder 58 provided to outer decoder 60. For instance, if outer encoder 50 used the Reed-Solomon error correcting encoding scheme to encode the data, outer decoder 60 may use the Reed-Solomon error correcting coding scheme to decode the data. The use of the Reed-Solomon error correcting coding scheme may be useful in the detection and correction of bitwise errors that do not conform to one of the dominant error patterns. Alternatively, outer decoder 60 may use iterative coding and signal processing schemes such as low-density parity check codes, turbo codes, and turbo equalizers. When outer decoder 60 has finished decoding the data that inner decoder 58 provided to outer decoder 60, outer decoder 60 may, in accordance with the example of FIG. 1, provide the decoded data to processor 4.

In some implementations, outer decoder 60 may require "soft values" as inputs. Accordingly, inner decoder 58 may output "soft values" to output decoder 60. As used in this disclosure, "soft values" are values that are associated with bit-level probabilities. For example, inner decoder 58 may decode the value "00110010." In this example, the value of the first bit (i.e., 0) may be associated with the probability of 0.98, the value of the second bit (i.e., 0) may be associated with the probability of 0.76, the value of the third bit (i.e., 1) may be associated with the probability of 0.84, and so on.

Modulator 54 may use run-length-limited coding when translating bits received from inner encoder 52 into electrical impulses. Modulator 54 may use run-length-limited coding for a variety of reasons. In a first example, detector 56 may include timing circuitry that requires occasional voltage transitions in a readback waveform in order to accurately measure time periods. In other words, the timing circuitry may cease to accurately measure time periods when the readback waveform includes a long period of a constant voltage level. In a second example, detector 56 may use a Viterbi algorithm to translate a readback waveform into discrete bits. In this instance, detector 56 may require the use of significant amounts of memory to store path histories associated with long error patterns. The use of significant amounts of memory may complicate hardware-based implementations of detector 56. Run-length-limited coding may eliminate the problems described in the first example and the second example.

When modulator 54 uses run-length-limited coding, modulator 54 modifies the bits received from inner encoder 52 such that the resulting bits satisfy a parameter k and a parameter g. Parameter k controls the maximum length of any run of identical binary symbols in the data. For instance, when modulator 54 applies run-length-limited coding to input data using a non-return-to-zero convention when parameter k=20, the input data is modified such that the resulting data does not include a string of twenty-one or more 0's or a string of twenty-one or more 1's. The value of parameter k may be established such that the resulting string of bits causes the readback waveform to include sufficient voltage transitions to ensure that the timing circuitry in detector 56 accurately measures time periods. Parameter g controls the maximum length of any run of alternating binary symbols in the data. For instance, when modulator 54 applies run-length-limited coding when parameter g=10, the input data is modified such that the resulting data does not include a string of more than 10 alternating 0's and 1's.

Under some circumstances, it may be advantageous not to use run-length-limited coding because run-length-limited coding may cause error propagation when miscorrection occurs during the decoding process. For this reason, alternate implementations of modulator 54 may use one or more data communication and/or storage techniques that may obviate the need to use run-length-limited coding when translating bits received from inner encoder 52 into electrical impulses.

In accordance with a first exemplary technique, modulator 54 may receive a set of codewords from inner encoder 52. In this example, modulator 54 may determine whether the set of codewords includes a long string of either 1's or 0's. If the set of codewords includes a long string of either 1's or 0's, modulator 54 may deliberately force an instance of one of the dominant error patterns into the string of 1's or 0's. Modulator 54 may then, in this example, translate the set of codewords, including the instance of the dominant error pattern, into electrical waveforms that are subsequently recorded in data storage medium 6. Forcing an instance of a dominant error pattern into a long string of 1's injects 0's into the long string of 1's and forcing an instance of a dominant error pattern into a long string of 0's injects 1's into the long string of 0's. The timing circuitry of detector 56 may use these injected 1's or 0's to maintain correct time. However, because the pattern of injected 1's or 0's conform to one of the dominant error patterns, inner decoder 58 may correct (i.e., remove) the injected 1's or 0's during decoding. For this reason, forcing of the instance of the dominant error pattern may prevent the problems that long strings of 1's or 0's cause when the timing circuitry of detector 56 is driven by signal-level changes in the readback waveform.

Furthermore, in accordance with the first exemplary technique, modulator 54 may determine whether the set of codewords includes a string of bits that is prone to long error events. For instance, detector 56 may output long strings of alternating bits (i.e., 01010101010 . . . ) that frequently include instances of the error pattern (−2, 2, −2, 2, −2, 2, −2, 2, . . . ). If modulator 54 determines that the set of codewords includes a string of bits that is prone to long error events, modulator 54 may force an instance of a dominant error pattern into the string of bits that inner decoder 58 can, at a high level of probability, detect and correct. When inner decoder 58 receives the string of bits with the forced instance of the dominant error pattern, inner decoder 58 may correct and detect the instance of the dominant error pattern in the string of bits.

Forcing of an instance of a dominant error pattern into a string of bits that is prone to long error events may cause some bits that would otherwise be decoded incorrectly to be decoded correctly. These correctly decoded bits effectively break up an instance of a long error pattern into two or more instances of shorter error patterns. For example, a string of bits may initially include forty alternating 1's and 0's. In this example, forcing the instance of the dominant error pattern may cause detector 56 to decode 1 at the twentieth position of the string, whereas without forcing of the dominant error pattern, an error would have caused detector 56 to decode a 0 at the twentieth position of the string. As a result, no error pattern in this string includes more than twenty symbols. As discussed above, long error patterns may require detector 56 to maintain significant memory depth. Because the set of codewords now includes shorter error patterns, detector 56 may not need to maintain such significant memory depth. For these reasons, it may be unnecessary to use run-length-limited coding in situations in which the forced instances of dominant error patterns into long strings of either 1's or 0's resolves timing circuitry problems in detector 56 and in which the forced instances of dominant error patterns into strings of bits that are prone to long error patterns obviates the need to maintain significant memory depth. Outer decoder 60 may be able to detect and correct any forced bits not detected and corrected by inner decoder 58. Although described above as forcing one of the dominant error patterns into a bit sequence, in some embodiments, the forced error pattern may be an error pattern not within the syndrome list. In this case, one or more correlators of the receiving device may be set to the forced error pattern to correct the forced error pattern in the bit sequence.

In some embodiments, it may be advantageous to place a pattern removal block at the receiver side so that an error signal can be constructed that can drive a correlator that is matched to the forced pattern. A pattern removal block may be placed after the channel detector and before the channel ISI filter (not shown in FIG. 2). The difference between the channel ISI filter output and the detector input forms the error signal that drives the error correlator bank. The syndrome computation block operates' directly on the channel detector output without any pattern removal. It is possible that the inserted error pattern does not match any of existing correlators. If this is the case, then an additional error-pattern correlator that matches to the inserted pattern may be added to the correlator bank.

Figure 3:
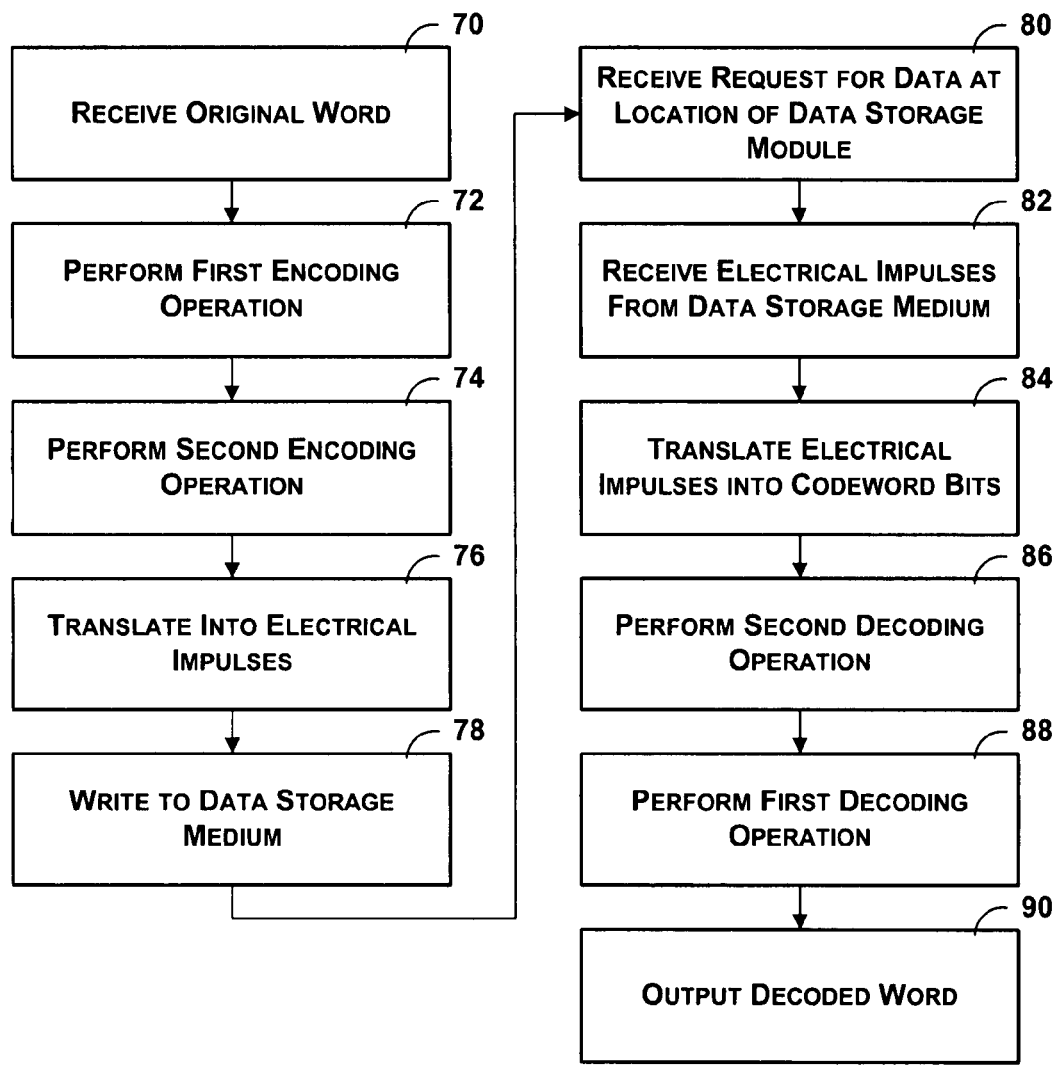
FIG. 3 is a flowchart illustrating exemplary operation of the drive controller illustrated in the example of FIG. 2.

FIG. 3 is a flowchart illustrating an exemplary operation of drive controller 8. This exemplary operation may begin when drive controller 8 receives an original unencoded word (i.e., a message) from processor 4 (70). For example, drive controller 8 may receive from processor 4 a 32-bit word along with instructions to write the 32-bit word to a particular location in data storage medium 6. When drive controller 8 receives the original unencoded word, outer encoder 50 in drive controller 8 generates an initial codeword by performing a first encoding operation on the original unencoded word (72). For instance, outer encoder 50 may generate the initial codeword by performing a Reed-Solomon encoding operation on the original unencoded word.

After outer encoder 50 generates the initial codeword, inner encoder 52 in drive controller 8 may generate a final codeword by performing a second encoding operation on the initial codeword (74). As described briefly above, the second encoding operation generates a codeword based on the message and a generator polynomial g(x) of the form $g(x)=g'(x)p'(x)$, where g'(x) is a preliminary generator polynomial that, for any given error polynomials $e_i(x)$ and $e_j(x)$ in a set of targeted error polynomials, $(e_i(x) \bmod g'(x))$ is equal to $(e_j(x) \bmod g'(x))$ only when $e_i(x)$ is equal to $e_j(x)$; and where p'(x) is an external factor that is not a factor of any error polynomial in the set of targeted error polynomials.

Once inner encoder 52 has generated the final codeword, modulator 54 may translate the final codeword into electrical impulses (76). For instance, modulator 54 may translate the final codeword into a bipolar voltage waveform. As indicated above, a bipolar voltage waveform is a voltage waveform in which a zero voltage level indicates the symbol 0 and a positive 1 or negative 1 voltage level indicates the symbol 1. One or more write heads of data storage medium 6 write these electrical impulses to data storage medium 6 (78). In some examples, the write heads may be magnetic or optical write heads.

Subsequently, drive controller 8 may receive a request to retrieve a word from a particular location in data storage medium 6 (80). When drive controller 8 receives the request to retrieve the word from the particular location in data storage medium 6, one or more read heads of data storage medium 6 output electrical impulses associated with the particular location in data storage medium 6 (82). For instance, the read heads of data storage medium 6 may output a bipolar voltage waveform. Next, detector 56 in drive controller 8 translates the electrical impulses into a set of discrete bits (84).

After detector 56 translates the electrical impulses into a codeword consisting of a set of discrete bits, inner decoder 58 generates an initial decoded word by performing a first decoding operation on the codeword that corresponds to the encoding operation performed by inner encoder 52 (86). As discussed above and discussed in further detail below, inner decoder 58 performs a decoding operation in which inner decoder 58 detects an error event in the codeword with a code based on generator polynomial g(x)=g'(x)p'(x). Alternatively, inner decoder 58 may perform a decoding operation in which inner decoder 58 detects an error event in the codeword with a code based on a parity check matrix that corresponds to the generator polynomial g(x)=g'(x)p'(x).

When inner decoder 58 generates the initial decoded word, outer decoder 60 generates a final decoded word by performing a second decoding operation on the initial decoded word (88). The second decoding operation corresponds to the encoding operation performed by outer encoder 50. For instance, outer decoder 60 may generate a final decoded word by performing a Reed-Solomon decoding operation on the initial decoded word. After outer decoder 60 generates the decoded word, drive controller 8 may output the final decoded word to processor 4 (90).

Figure 4:
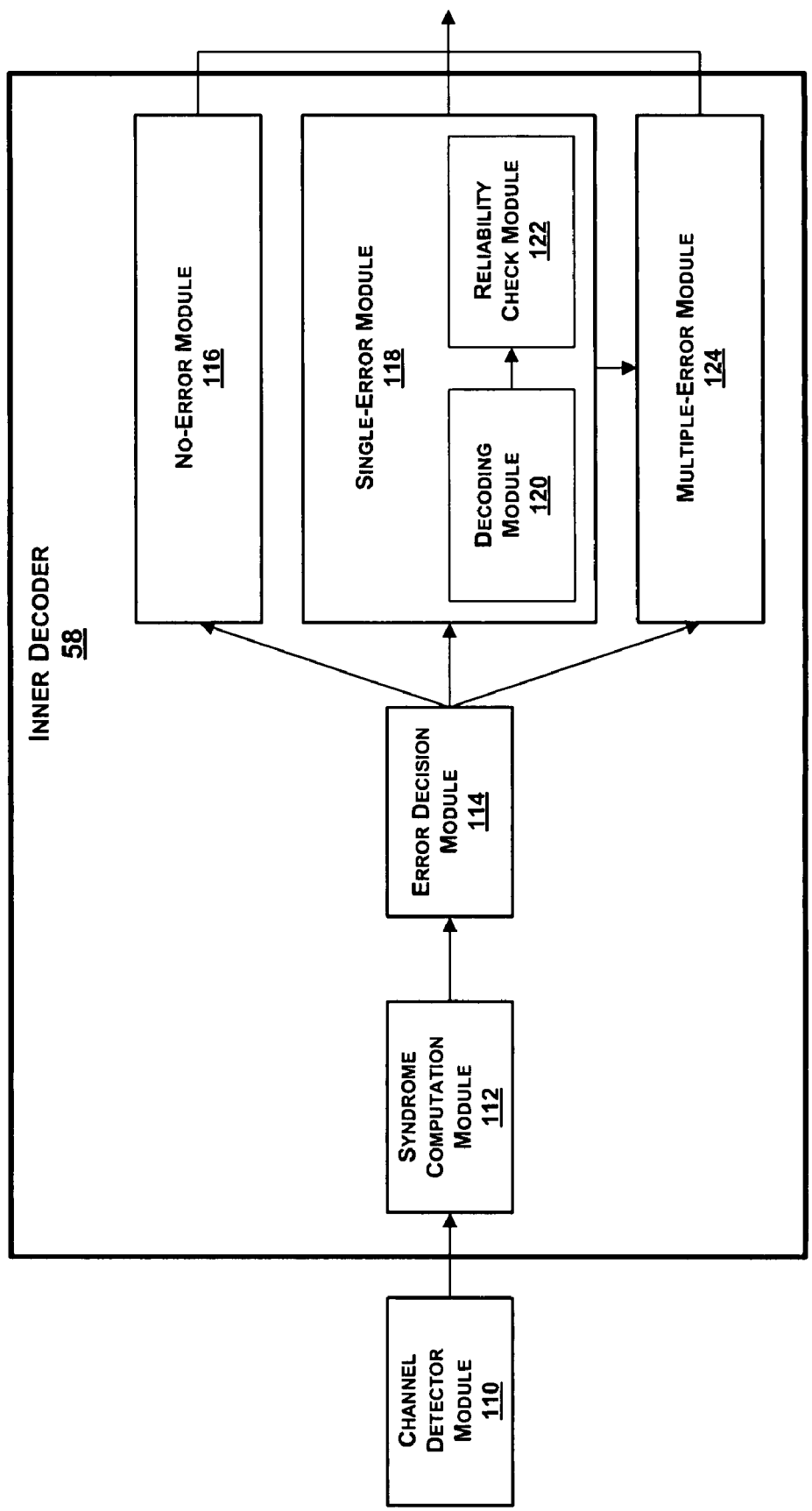
FIG. 4 is a block diagram illustrating exemplary details of an inner decoder.

FIG. 4 is a block diagram illustrating exemplary details of inner decoder 58. As illustrated in the example of FIG. 4, a channel detector 110 may receive a channel output word $y_k$. In the example of FIG. 4, channel output word $y_k$ may be considered to be equal to the original waveform for codeword $c_k$ outputted by modulator 54 after the effects of inter-symbol interference and noise. More specifically, channel output word $y_k$ may be considered to be equal to an original codeword $c_k$ convolved with an inter-symbol interference response $h_k$ of length $l_i$ plus noise. In other words, $y_k = C_k * h_k + n_k$, where $c_k$ is the original version of a codeword, where $h_k$ represents the effects of inter-symbol interference on the original version of the codeword, where $n_k$ represents a zero-mean noise sequence with variance $\sigma_2$, and where the symbol "*" denotes convolution.

When channel detector 110 receives channel output word $y_k$, channel detector 110 may generate an estimated codeword $r_k$. Channel detector 110 may generate estimated codeword $r_k$ by removing from the channel output word $y_k$ the estimated effects of inter-symbol interference and additive white Gaussian noise attributable to the "channel" through which the channel output word $y_k$ passed (e.g., data storage medium 6, communication channel 32, etc.). Note that estimated codeword $r_k$ may not be equal to the original codeword $c_k$ because the estimated effects of inter-symbol interference and noise may not be the same as the actual effects of the "channel" on the channel output word $y_k$.

After channel detector 110 generates the estimated codeword $r_k$, a syndrome computation module 112 in inner decoder 58 computes one or more syndrome polynomials based on estimated codeword $r_k$ and final generator polynomial g(x). In accordance with a first exemplary technique, syndrome computation module 112 may compute a syndrome polynomial based on estimated codeword $r_k$ and final generator polynomial g(x) by dividing estimated codeword $r_k$ by final generator polynomial g(x). In accordance with a secondary exemplary technique, syndrome computation module 112 may construct the syndrome polynomial s(x)=$r_k$ mod g(x) based on computation of multiple syndrome polynomials $s_{gi}(x)$ that is equal to $r_k$ mod $g_i(x)$, where i=1,2,3, ..., where $g_i(x)$ is a factor in the final generator polynomial g(x).

An error decision module 114 in inner decoder 58 may use the one or more syndrome polynomials computed by syndrome computation module 112 to determine whether the one or more syndrome polynomials computed by syndrome computation module 112 indicates that the estimated codeword $r_k$ includes no instances of any of the dominant error patterns, a single instance of one of the dominant error patterns, or multiple instances of one or more of the dominant error patterns. For instance, error decision module 114 may determine that estimated codeword $r_k$ includes a single error when the syndrome polynomial $s_g(x)$ corresponds to a dominant error pattern. For instance, in accordance with the first exemplary technique described in the preceding paragraph, error decision module 114 may determine that estimated codeword $r_k$ includes multiple instances of one or more dominant error patterns when the syndrome polynomial computed by syndrome computation module 112 is associated with multiple instances of one or more dominant error patterns. In accordance with the second exemplary technique described in the preceding paragraph, error decision module 114 may, for example, determine that estimated codeword $r_k$ includes multiple instances of one or more dominant error patterns when the syndrome polynomial $s_g(x)$ based on estimated codeword $r_k$ and the preliminary generator polynomial g'(x) is equal to zero and the syndrome polynomial $S_p(x)$ based on estimated codeword $r_k$ and the external factor p'(x) is not equal to zero.

If error decision module 114 determines that the syndrome polynomials indicate that estimated codeword $r_k$ does not include an instance of a dominant error pattern, a no-error module 116 generates a reconstructed message polynomial m'(x) based on the estimated codeword $r_k$. If the estimated codeword $r_k$ is a systematic code, no-error module 116 may generate a reconstructed message polynomial m'(x) based on the estimated codeword $r_k$ by dropping parity bits in the estimated codeword $r_k$. Once no-error module 116 has generated the reconstructed message polynomial m'(x), inner decoder 58 may output a reconstructed message $m_k$ that is characterized by the reconstructed message polynomial m'(x).

If error decision module 114 determines that the syndrome polynomials indicate that estimated codeword $r_k$ includes a single instance of a dominant error pattern, a single-error module 118 in inner decoder 58 attempts to detect and correct the error. As illustrated in the example of FIG. 4, single-error module 118 includes a decoding module 120 that identifies an error polynomial associated with the one or more syndrome polynomials captured by syndrome computation module 112. After identifying the error polynomial associated with the one or more syndrome polynomials, decoding module 120 may generate a corrected codeword polynomial c(x) by subtracting the identified error polynomial from an estimated codeword polynomial r(x) that characterizes estimated codeword $r_k$.

Decoding module 120 may determine whether a syndrome polynomial s'(x) associated with the corrected codeword polynomial c(x) is equal to the all-zero polynomial. If decoding module 120 determines that the syndrome polynomial s'(x) is not an all-zero polynomial, the estimated codeword $r_k$ may, despite the prediction of error decision module 114, contain more than one instance of an error pattern. Accordingly, if decoding module 120 determines that the syndrome polynomial s'(x) is not an all-zero polynomial, decoding module 120 may activate multiple-error module 124, thereby starting a process to correct multiple errors. On the other hand, if decoding module 120 determines that the syndrome polynomial s'(x) is equal to the all-zero polynomial, a reliability check module 122 in single-error module 118 may calculate a reliability measure of the corrected codeword c(x).

If the reliability measure of the corrected codeword c(x) is not greater than a particular threshold (i.e., the corrected codeword c(x) does not satisfy a reliability check), reliability check module 122 may activate multiple-error module 124, thereby causing multiple-error module 124 to attempt to correct multiple error patterns. This disclosure describes an exemplary technique to perform this reliability check with regard to multiple-error module 124, below.

If reliability check module 122 determines that the reliability measure of the corrected codeword c(x) is greater than or equal to the particular threshold (i.e., the corrected codeword c(x) satisfies the reliability check), single-error module 118 may compute message polynomial m'(x) based on the corrected codeword c(x) and output the message polynomial m'(x).

If error decision module 114 determines that the syndrome polynomials generated by syndrome computation module 112 indicate that estimated codeword $r_k$ includes two or more instances of one or more dominant error patterns, e.g., by determining that syndrome polynomials $s_g(x)$ and $s_p(x)$ correspond to two or more instance of one or more dominant error pattern, error decision module 114 may activate multiple-error module 124. When activated, multiple-error module 124 may attempt to correct multiple error patterns within estimated codeword $r_k$. This disclosure describes exemplary details of multiple-error module 124 with regard to FIG. 6 and an exemplary operation of multiple-error module 124 with regard to FIG. 8. In some embodiments, the techniques may be directed to a decoding module with the features illustrated in FIG. 4.

Figure 5:
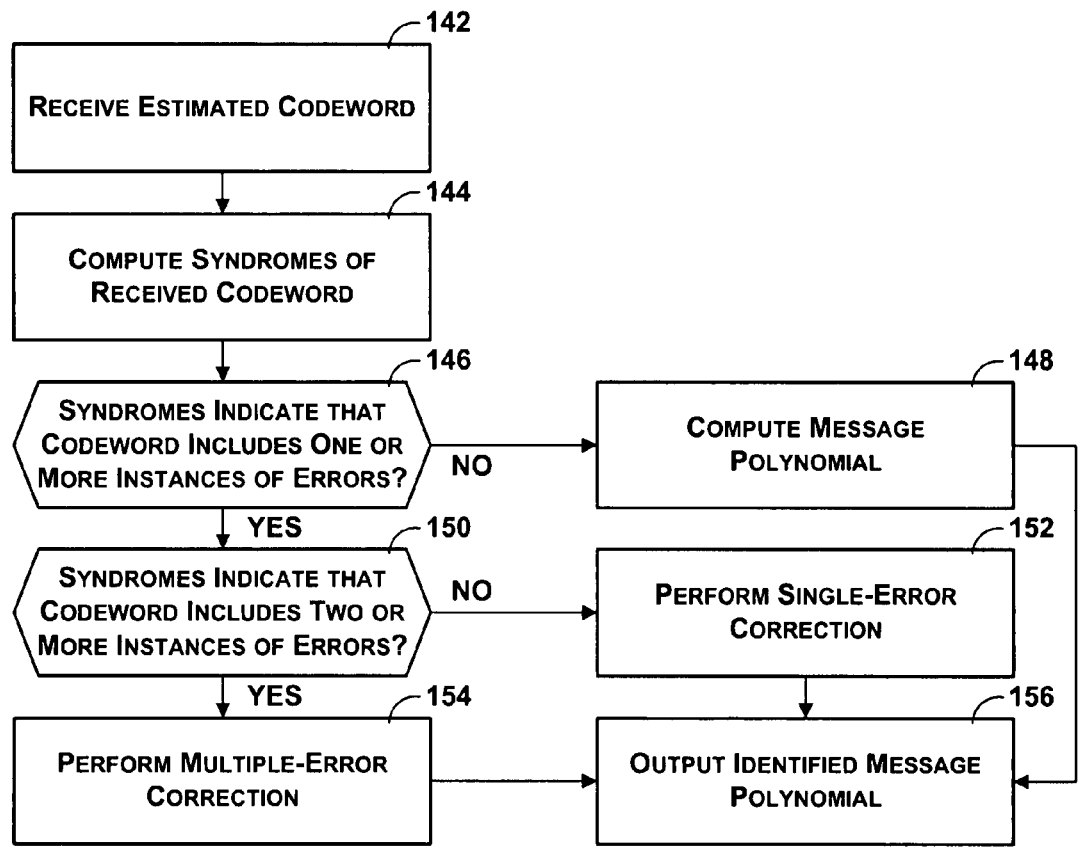
FIG. 5 is a flowchart illustrating exemplary operation of the inner decoder.

FIG. 5 is a flowchart illustrating exemplary operation of inner decoder 58. Inner decoder 58 may receive an estimated codeword $r_k$ from detector 56 (142). As described above, channel detector 56 may receive a channel output word $y_k$ and generate estimated codeword $r_k$. Estimated codeword $r_k$ may be a version of the channel output word $y_k$ without the estimated effects of inter-symbol interference and the estimated effects of noise.

Syndrome computation module 112 computes one or more syndrome polynomials based on the estimated codeword $r_k$ (144). In accordance with a first technique, syndrome computation module 112 may compute a syndrome polynomial s(x) as the remainder resulting from a division of an estimated codeword polynomial r(x) that characterizes the estimated codeword $r_k$ by the final generator polynomial g(x) (i.e., s(x) =r(x) mod g(x)). In accordance with a second technique, syndrome computation module 112 may compute a syndrome $s_g(x)$ as a remainder resulting from a division of the estimated codeword polynomial r(x) by the preliminary generator polynomial g'(x) in the final generator polynomial g(x). Furthermore, in accordance with this second technique, syndrome computation module 112 may compute a syndrome $s_p(x)$ as a remainder resulting from a division of the estimated codeword polynomial r(x) by the external factor p'(x) in the final generator polynomial g(x).

After syndrome computation module 112 computes a syndrome polynomial of the estimated codeword $r_k$, error decision module 114 determines whether the captured syndrome polynomials indicate that the estimated codeword $r_k$ contains one or more instances of one or more dominant error patterns (146). Syndrome computation module 112 may use preliminary generator polynomial g'(x) to compute a syndrome polynomial $s_g(x)$ and may use external factor p'(x) to capture a syndrome polynomial $s_p(x)$. In this example, error decision module 114 may determine that the computed syndrome polynomials indicate that the estimated codeword $r_k$ contains multiple instances of one or more dominant error patterns when either syndrome polynomial $s_g(x)$ is not equal to zero and/or when syndrome polynomial $s_p(x)$ is not equal to zero. In other words, error decision module 114 may determine that the computed syndrome polynomials indicate that the estimated codeword $r_k$ contains no instances of any dominant error patterns when syndrome polynomial $s_g(x)$ and syndrome polynomial $s_p(x)$ are both equal to zero.

If error decision module 114 determines that the syndrome polynomials indicate that the estimated codeword $r_k$ does not contain one or more instances of a dominant error pattern ("NO" of 146), error decision module 112 may activate no-error module 116, thereby causing no-error module 116 to generate a reconstructed message polynomial m'(x) based on estimated codeword $r_k$ (148). If error decision module 114 determines that the syndrome polynomials indicate that the estimated codeword $r_k$ does contain one or more errors ("YES" of 146), error decision module 112 may determine whether the computed syndrome polynomials indicate that the estimated codeword $r_k$ includes multiple instances of one or more dominant error patterns (150).

If error decision module 112 determines the computed syndrome polynomials indicate that the estimated codeword $r_k$ does not include multiple instances of one or more dominant error patterns ("NO" of 150), error decision module 112 may activate single-error module 118, thereby causing single-error module 118 attempt to decode the estimated codeword $r_k$ with one error (152). On the other hand, if error decision module 114 determines that the syndrome polynomials generated by syndrome computation module 112 indicate that the estimated codeword $r_k$ contains multiple instances of one or more dominant error patterns ("YES" of 150), error decision module 114 may activate multiple-error module 124, thereby causing multiple-error module 124 to attempt to perform multiple error correction (154). This disclosure describes an exemplary operation of multiple-error module 124 with regard to FIG. 9.

After no-error module 116, single-error module 118, or multiple-error module 124 identifies a message polynomial m'(x), inner decoder 58 may output the identified message polynomial m'(x) (156).

Figure 6:
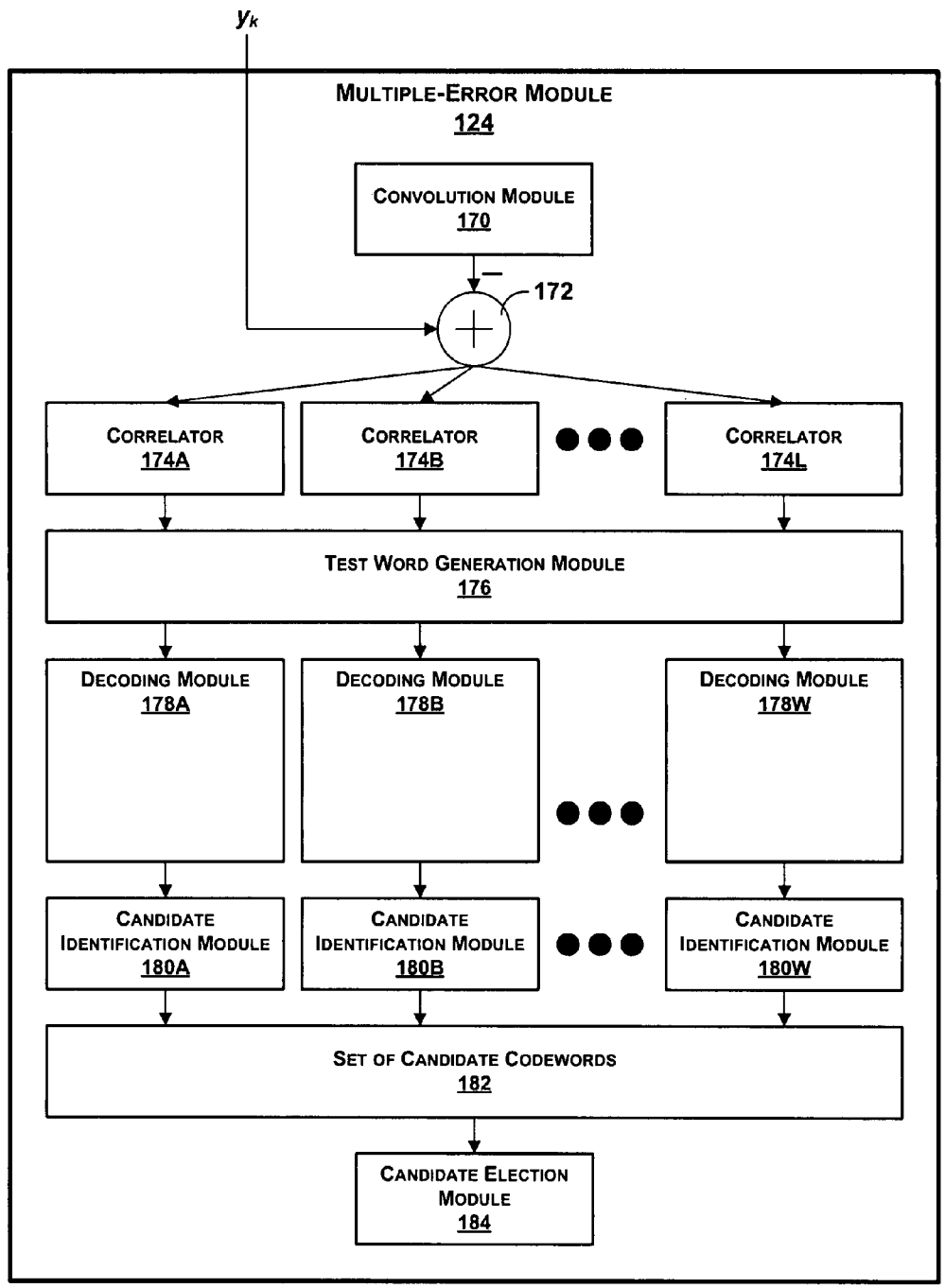
FIG. 6 is a block diagram illustrating exemplary details of a multiple-error module in the inner decoder of FIG. 4.

FIG. 6 is a block diagram illustrating exemplary details of multiple-error module 124 in inner decoder 58. As illustrated in the example of FIG. 6, multiple-error module 124 includes a convolution module 170. After channel detector 110 generates the estimated codeword $r_k$, convolution module 170 convolves the estimated codeword $r_k$ with a value $h_k$, where $h_k$ is an estimated inter-symbol interference ("ISI") channel response of length $l_h$. In other words, convolution module 170 calculates $(r_k * h_k)$.

After convolution module 170 convolves the estimated codeword $r_k$ and ISI channel response $h_k$, a channel error module 172 in inner decoder 58 generates a channel error signal $q_k$ that represents errors in estimated codeword $r_k$ that are not correctable by removing estimated inter-symbol interference. Channel error module 172 may generate the channel error signal $q_k$ by subtracting $(r_k * h_k)$ from the channel output word $y_k$. Otherwise stated, $q_k = y_k - (r_k * h_k) = (c_k - r_k) * h_k + n_k$. In general terms, an instance of a dominant error pattern $e_i$ having length $l_i$ that occurs at positions from k=j to k=j+$l_i$-1 may be denoted as $[e^{(i)}]_j^{j+l_i-1}$. Given this denotation, channel error signal $q_k$ can be written as:

$$q_k = (c_k - r_k) * h_k + n_k = [e^{(i)}]_j^{j+l_i-1} * h_k + n_k = [s^{(i)}]_j^{j+l_i-1} + n_k$$

where the error-event sequence $s_k^{(i)}$ is given by $s_k^{(i)}=e_k^{(i)}*h_k$, and $l_h^i$ is defined as $l_i^h=l_i+l_h-2$.

After channel error module 172 generates channel error signal $q_k$, a set of correlators 174A through 174L (collectively, "correlators 174") may compute probabilities of various positions in channel error signal $q_k$ include instances of dominant error patterns. In other words, correlators 174 may determine the degree to which various error polynomials correlate to the channel error signal $q_k$. Each of correlators 174 may incorporate the maximum a posteriori (MAP) probability from either outer decoder 60 or channel detector 110. For purposes of explanation, this disclosure denotes a probability measure of an instance of an error pattern $e_j$ starting at a position i as $C(e_j^{(i)})$. Each one of correlators 174 may compute probability measures of various positions in channel error signal $q_k$ being starting positions of instances of a different dominant error pattern. For example, correlator 174A may compute probability measures of various positions in channel error signal $q_k$ being starting positions of instances of the dominant error pattern $\pm\{2\}$, correlator 114B may compute probabilities of various positions in correlator sequence $q_k$ being starting positions of instances of the dominant error pattern $\pm\{2\ -2\}$, and so on.

Each of correlators 174 may use the following formula to compute a probability that an instance of a dominant error pattern $e_j$ starts at a position i within the received codeword r:

$$c(e_j^{(i)}) \triangleq \frac{1}{2\sigma^2}D_j^{(i)} - \log A_j^{(i)}$$

where $D_j^{(i)}$ is defined as $$\sum_{k=j}^{j+l_i^h} [q_k^2 - (q_k - s_k^{(i)})^2]$$

and where $A_j^{(i)}$ is defined as $$\frac{P([s^{(i)}]_j^{j+l_i^h})}{P([\tilde{s}^{(i)}]_j^{j+l_i^h})}.$$

In this equation $$[\tilde{s}^{(i)}]_j^{j+l_i^h} = \prod_{k=0, \varepsilon_k^{(i)} \neq 0}^{l_i} P(c_{j+k} = r_{j+k}) \text{ and}$$

$$P([s^{(i)}]_j^{j+l_i^h}) == \prod_{k=0, \varepsilon_k^{(i)} \neq 0}^{l_i} P(c_{j+k} = -c_{j+k}).$$

The following discussion illustrates the rationale for the above formula. The reliability measure for each error starting position j of a target error pattern $e_j(x)$ can be computed by the following local posteriori probabilities:

$$P([s^{(i)}]_j^{j+l_i^h} \mid [y]_j^{j+l_i^h}, [r]_j^{j+l_i^h}) = P([s^{(i)}]_j^{j+l_i^h} \mid [q]_j^{j+l_i^h})$$

where $j \in \{0, \ldots, n-1\}$ and n is equal to number of symbols in correlator input sequence $q_k$. Using Bayes' theorem, the posteriori probability can be rewritten as $$P([s^{(i)}]_j^{j+l_i^h} \mid [q]_j^{j+l_i^h}) = \frac{P([q]_j^{j+l_i^h} \mid [s^{(i)}]_j^{j+l_i^h})P([s^{(i)}]_j^{j+l_i^h})}{P([q]_j^{j+l_i^h})}.$$

Here, $P([q]_j^{j+l_i^h})$ is approximated by $$P([q]_j^{j+l_i^h}) \cong P([q]_j^{j+l_i^h} \mid [s^{(i)}]_j^{j+l_i^h})P([s^{(i)}]_j^{j+l_i^h}) + P([q]_j^{j+l_i^h} \mid [\tilde{s}^{(i)}]_j^{j+l_i^h})P([\tilde{s}^{(i)}]_j^{j+l_i^h})$$

where $[\tilde{s}^{(i)}]_j^{j+l_i^h}$ is the most probable possible error pattern and by definition, this is the all-zero pattern, i.e., the most probable competing local pattern is that associated with the channel detector output sequence (maximum likelihood word) itself.

Because channel error sequence $q_k$ is a zero-mean statistically independent Gaussian random variable with variance $\sigma^2$, the likelihood probabilities $$P([q]_j^{j+l_i^h} \mid [s^{(i)}]_j^{j+l_i^h})$$

and $$P([q]_j^{j+l_i^h} \mid [\tilde{s}^{(i)}]_j^{j+l_i^h})$$

are $$P([q]_j^{j+l_i^h} \mid [s^{(i)}]_j^{j+l_i^h}) = \frac{1}{\sqrt{2\pi\sigma^2}}e^{-\frac{1}{2\sigma^2}\sum_{k=j}^{j+l_i^h}(q_k - s_k^{(i)})^2}$$

$$P([q]_j^{j+l_i^h} \mid [\tilde{s}^{(i)}]_j^{j+l_i^h}) = \frac{1}{\sqrt{2\pi\sigma^2}}e^{-\frac{1}{2\sigma^2}\sum_{k=j}^{j+l_i^h}(q_k)^2}$$

The probabilities $$P([s^{(i)}]_j^{j+l_i^h}) \text{ and } P([\tilde{s}^{(i)}]_j^{j+l_i^h})$$

are given by $$P([s^{(i)}]_j^{j+l_i^h}) = P([e^{(i)}]_k^{j+l_i-1}) = \prod_{k=0, e_k^{(i)} \neq 0}^{l_j-1} P(c_{j+k} = r_{j+k})$$

$$P\left([\tilde{s}^{(i)}]_j^{j+l_i^h}\right) = \prod_{k=0, e_k^{(i)} \neq 0}^{l_i-1} P(c_{j+k} = r_{j+k})$$

Note that the length-$l_i$ error pattern sequence $[e^{(i)}]_0^{l_i-1}$ does not necessarily have $l_i$ erroneous bits. For an equally-probable $c_k$, i.e., $P(c_k=\pm 1)=0.5$, we have $$P\left([s^{(i)}]_j^{j+l_i^h}\right) = P\left([\tilde{s}^{(i)}]_j^{j+l_i^h}\right).$$

However, if the interleaved extrinsic information $\lambda_k^e$ of an outer detector/decoder is available and serves as the a priori probability estimate, i.e., $$P(c_k = +1) = \frac{e^{\lambda_k^e}}{1 + e^{\lambda_k^e}} \text{ and } P(c_k = -1) = \frac{1}{1 + e^{\lambda_k^e}}$$

for $$\lambda_k^e = \log \frac{P(c_k = +1)}{P(c_k = -1)}, \text{ then } P\left([s^{(i)}]_j^{j+l_i^h}\right) \neq P\left([\tilde{s}^{(i)}]_j^{j+l_i^h}\right).$$

Using the results, the posteriori probability $$P\left([s^{(i)}]_j^{j+l_i^h} \mid [q]_j^{j+l_i^h}\right)$$

can be expressed as $$P\left([s^{(i)}]_j^{j+l_i^h} \mid [q]_j^{j+l_i^h}\right) = \frac{1}{1 + \exp[-D_j^{(i)}/2\sigma^2]A_j^{(i)}}$$

where $D_j^{(i)}$ and $A_j^{(i)}$ are defined by $$D_j^{(i)} \equiv \sum_{k=j}^{j+l_i^h} [q_k^2 - (q_k - s_k^{(i)})^2] \text{ and } A_j^{(i)} \equiv \frac{P\left([\tilde{s}^{(i)}]_j^{j+l_i^h}\right)}{P\left([s^{(i)}]_j^{j+l_i^h}\right)}$$

The quantity $D_j^{(i)}$ represents the output of a finite-window correlator at a particular locality and $A_j^{(i)}$ is a measure of the a priori probability of the local error pattern corresponding to $[s^{(i)}]_j^{j+l_i^h}$. A log-domain measure of the local a posteriori probability $$P\left([s^{(i)}]_j^{j+l_i^h} \mid [q]_j^{j+l_i^h}\right)$$

is given by the following local error-pattern correlator:

$$C(e_j^{(i)}) \equiv \frac{1}{2\sigma^2} D_j^{(i)} - \log A_j^{(i)}.$$

In accordance with a variation of the local error-pattern correlator taking into account signal-dependent medium noise, correlator modules 174 may incorporate pattern-dependent noise prediction.

After correlators 174 compute local reliability measures for instances of error patterns within the estimated codeword $r_k$, a test word generation module 176 uses the local reliability measures to generate a set of test words that includes W test words, where W is a positive integer. This disclosure may also refer to this set of test word as a list of test words. For this reason, this disclosure may refer to the technique described with reference to FIG. 6 as "list-based decoding." Each test word is a channel detector output word with one or more instances of the dominant error patterns injected. By injecting instances of error patterns into positions of the estimated codeword $r_k$ that are likely to contain the instances of the error patterns, all but one of the instances of a dominant error pattern in the original codeword may be corrected. In other words, adding instances of error patterns at various locations of the estimated codeword $r_k$ may effectively "knock out" instances of error patterns previously existing in the estimated codeword $r_k$. In general, test words that contain only a single instance of an error pattern can be corrected in the manner used by single-error module 118.

After test word generation module 176 generates the set of test words, decoding modules 176A through 176W (collectively, "decoding modules 176") may "decode" individual test words in the set of test words. Multiple-error module 124 may include one decoding module for each test word in the set of test words. Decoding modules 176 may decode individual test words in the set of test words in parallel. When any one of decoding modules 178 decodes a test word, the decoding module may generate a "valid" codeword when a syndrome polynomial associated with the test word or the decoded test word is the all-zero polynomial. This disclosure describes exemplary details of decoding modules 176 with regard to FIG. 7, below.

In the example of FIG. 6, multiple-error module 124 may include candidate identification modules 180A through 180W (collectively, "candidate identification modules 180"). Each of candidate identification modules 180 corresponds to one of decoding modules 178. When one of decoding modules 178 generates a valid codeword, a corresponding one of candidate identification modules 180 may determine whether the valid codeword is sufficiently reliable. The candidate identification module may determine whether the valid codeword is sufficiently reliable by running a reliability check. If the candidate identification module determines that the valid codeword is sufficiently reliable, the candidate identification module may identify the valid codeword as a candidate codeword. In general terms, candidate identification modules 180 identify valid codewords as candidate codewords when the valid codewords are sufficiently reliable.

In order to determine whether the reconstructed message polynomials are sufficiently reliable, candidate identification modules 180 may perform a reliability check on the reconstructed message polynomials. Candidate identification modules 180, when performing the reliability check, may use a reliability measure $C(e_j^{(i)})$ for the identified error polynomial.

Reliability check module 122 may then determine whether reliability measure $C(e_j^{(i)})$ is greater than or equal to $$-\frac{E^{(i)}}{2\sigma^2},$$

where $E^{(i)}$ is defined as $\|[s]_j^{j+l_i^h}\|$.

To illustrate this, given an error event $[e^{(i)}]_j^{j+l_i-1}$ and channel error sequence $$[q]_j^{j+l_i^h} = [s^{(i)} + n]_j^{j+l_i^h},$$

$$C(e_j^{(i)}) = \frac{1}{2\sigma^2} \sum_{k=j}^{j+l_i^h} \left[(s_k^{(i)})^2 + 2s_k^{(i)} n_k\right] - \log A_j^{(i)}$$

$$= \frac{1}{2\sigma^2}\left[E^{(i)} + \sum_{k=j}^{j+l_i^h} 2s_k^{(i)} n_k\right] - \log A_j^{(i)}$$

where $E^{(i)} \equiv \|[s]_j^{j+l_i^h}\|^2$. Channel detector 110 (FIG. 4) may produce the error pattern $[e^{(i)}]_j^{j+l_i-1}$ which is considered to be closest to the received codeword sequence in terms of the Euclidean metric, i.e., $$\sum_{k=j}^{j+l_i^h} (s_k^{(i)} + n_k)^2 < \sum_{k=j}^{j+l_i^h} n_k^2.$$

By rearranging the above equation, it is seen that $$E^{(i)} + \sum_{k=j}^{j+l_i^h} 2s_k^{(i)} n_k < 0,$$

and consequently, $C(e_j^{(i)}) < -\log A_j^{(i)}$.

If there is no error event at the positions from j to $j+l_i-1$, i.e., $[q]_j^{j+l_i^h} = [n]_j^{j+l_i^h}$, then the correlator gives:

$$C(e_j^{(i)}) = \frac{1}{2\sigma^2} \sum_{k=j}^{j+l_i^h} \left[-(s_k^{(i)})^2 + 2s_k^{(i)} n_k\right] - \log A_j^{(i)}$$

$$= \frac{1}{2\sigma^2}\left[-E^{(i)} + \sum_{k=j}^{j+l_i^h} 2s_k^{(i)} n_k\right] - \log A_j^{(i)}$$

Because channel detector 110 correctly chooses the transmitted codeword sequence in this case, the Euclidean metric relationship is $$\sum_{k=j}^{j+l_i^h} (s_k^{(i)} + n_k)^2 > \sum_{k=j}^{j+l_i^h} n_k^2.$$

This implies that $$-E^{(i)} + \sum_{k=j}^{j+l_i^h} 2s_k^{(i)} n_k > -2E^{(i)}$$

and $$C(e_j^{(i)}) > -\frac{E^{(i)}}{\sigma^2} - \log A_j^{(i)}.$$

Hence, the correlator-based reliability measure is bounded by $$C(e_j^{(i)}) < -\log A_j^{(i)} \text{ for } [q]_j^{j+l_i^h} = [s^{(i)} + n]_j^{j+l_i^h}$$

$$C(e_j^{(i)}) > -\frac{E^{(i)}}{\sigma^2} - \log A_j^{(i)} \text{ for } [q]_j^{j+l_i^h} = [n]_j^{j+l_i^h}.$$

Therefore, for equally-probable $c_k$'s, i.e., $\log A_\rho^{(i)} = 0$, an assumed $x^j e_i(x)$, $i \in \{1, \ldots, L\}$ and $j \in \{0, \ldots, n-1\}$, can be considered as a probable error pattern, if the corresponding reliability measure $C(e_j^{(i)})$ satisfies the following threshold-based reliability check:

$$C(e_j^{(i)}) \geq -\frac{E^{(i)}}{2\sigma^2}.$$

Figure 11:
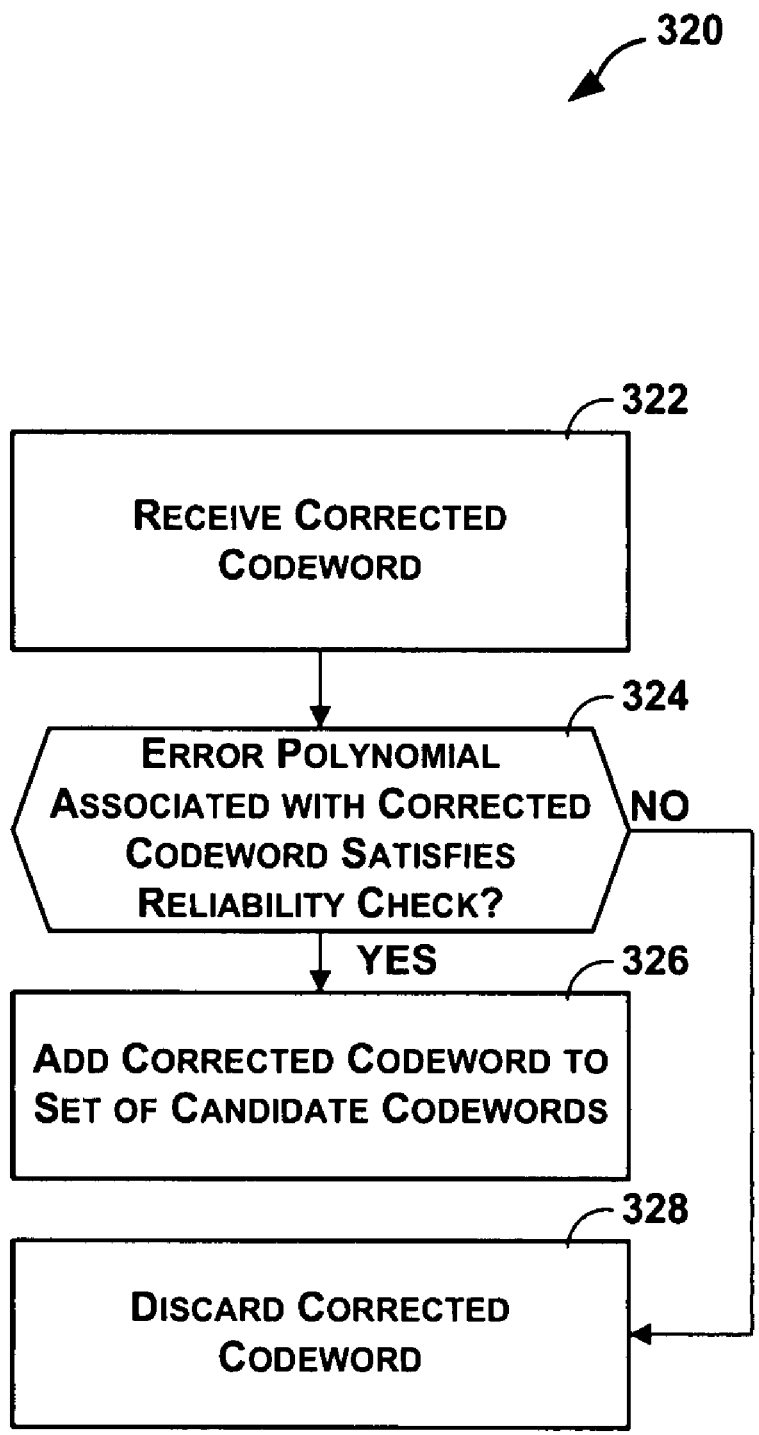
FIG. 11 is a flowchart illustrating exemplary operation of a decoding module in the multiple-error module.

Each of candidate identification modules 180 may use the exemplary operation described with regard to FIG. 11 to determine whether to identify a valid codeword generated by one of decoding modules 178 is a candidate codeword. When candidate identification modules 180 identify valid codewords generated by decoding modules 178 as candidate codewords, candidate identification modules 180 may add the identified valid codewords to a set of candidate codewords 182.

A candidate election module 184 in multiple-error module 124 elects one of the candidate codewords in set of candidate codewords 184. Candidate election module 184 may then obtain a reconstructed message polynomial based on the elected one of the candidate codewords. After obtaining the reconstructed message polynomial, inner decoder 58 may output the reconstructed message polynomial. In order to elect a candidate codeword, candidate election module 184 may determine whether the set of candidate codewords 182 is empty. If the set of candidate codewords 182 is empty, candidate election module 184 may output a message polynomial based directly on the estimated codeword $r_k$.

On the other hand, if the set of candidate codewords 182 is not empty, candidate election module 184 may calculate the reliability measures of individual candidate codewords by summing the local reliability measures of each of the error polynomials used to generate the candidate codewords. Candidate election module 184 may then identify the one of the candidate codewords that has the greatest reliability measure. After identifying the one of the candidate codewords that has the greatest reliability measure, candidate election module 184 may output the candidate codeword that has the greatest reliability measure. These procedures may be the same as estimating the probability of each candidate codeword based on the probabilities of each component local error pattern of the candidate codewords and then finding the candidate codeword with the highest probability.

As discussed above with regard to the example of FIG. 2, outer decoder 60 may require "soft values" as inputs and inner decoder 58 may output "soft values" to output decoder 60. Inner decoder 58 may generate the soft values in a variety of ways. For instance, inner decoder 58 may, for each candidate codeword, approximate the a posteriori probability of the candidate codeword as a product of the a posteriori probabilities of the constituent single error patterns in the candidate codeword with respect to estimated codeword $c_k$ generated by channel detector 110. To illustrate this, let c be a candidate codeword that includes M error patterns as compared to a most-likely candidate codeword c'. In this case, inner decoder 58 may estimate the a posteriori probability of candidate codeword c by multiplying the probability estimates of the M error patterns in the candidate codeword c. As discussed above, inner decoder 58 may calculate the probability estimates of each of the M error patterns in the candidate codeword c using a prior probability ("APP")-based finite-window correlators 174, each of which is matched to a single one of the dominant error patterns. Finite-window correlators 174 may compute the probability or the reliability measure in the probability domain or in the log-probability domain.

The candidate codeword list constructed by candidate identification modules 180 may be used to evaluate bit-level reliabilities that constitute the soft output information supplied by inner decoder 58. Once the codeword probability or reliability measures are obtained for each candidate codeword in the list, the conversion of word-level reliabilities into the bit-level reliability of a given bit position can be done using the well-established method of grouping the candidate codewords into two groups according to the binary value of the hard decision bit in that bit position and then performing group-wise summing of the word-level probabilities.

In computing the word-level reliability or probability measures, finite-window correlators 174 may evaluate the local error pattern probabilities and then construct the codeword probability based on the possible constituent error pattern probabilities. Namely, the a posteriori probability of each candidate codeword can be approximated as the product of the a posteriori probabilities of its constituent single error patterns with respect to the channel detector output word. Let c be a candidate codeword with, say, M error-pattern corruption with respect to the ML word r. Then, the a posteriori probability of this particular test word, which is denoted as P(c|r, y), can be estimated by multiplying the probability estimates of the M local error patterns (y here denotes the channel observation at the detector input). Again, the local pattern reliability is obtained by running APP-based finite-window correlators matched to the dominant patterns. That is, the probability of $e_i(x)$ starting at position $\rho_i$, i.e., $x^{\rho_i}e_i(x)$, can be computed, based on the local error-pattern correlator.

Figure 7:
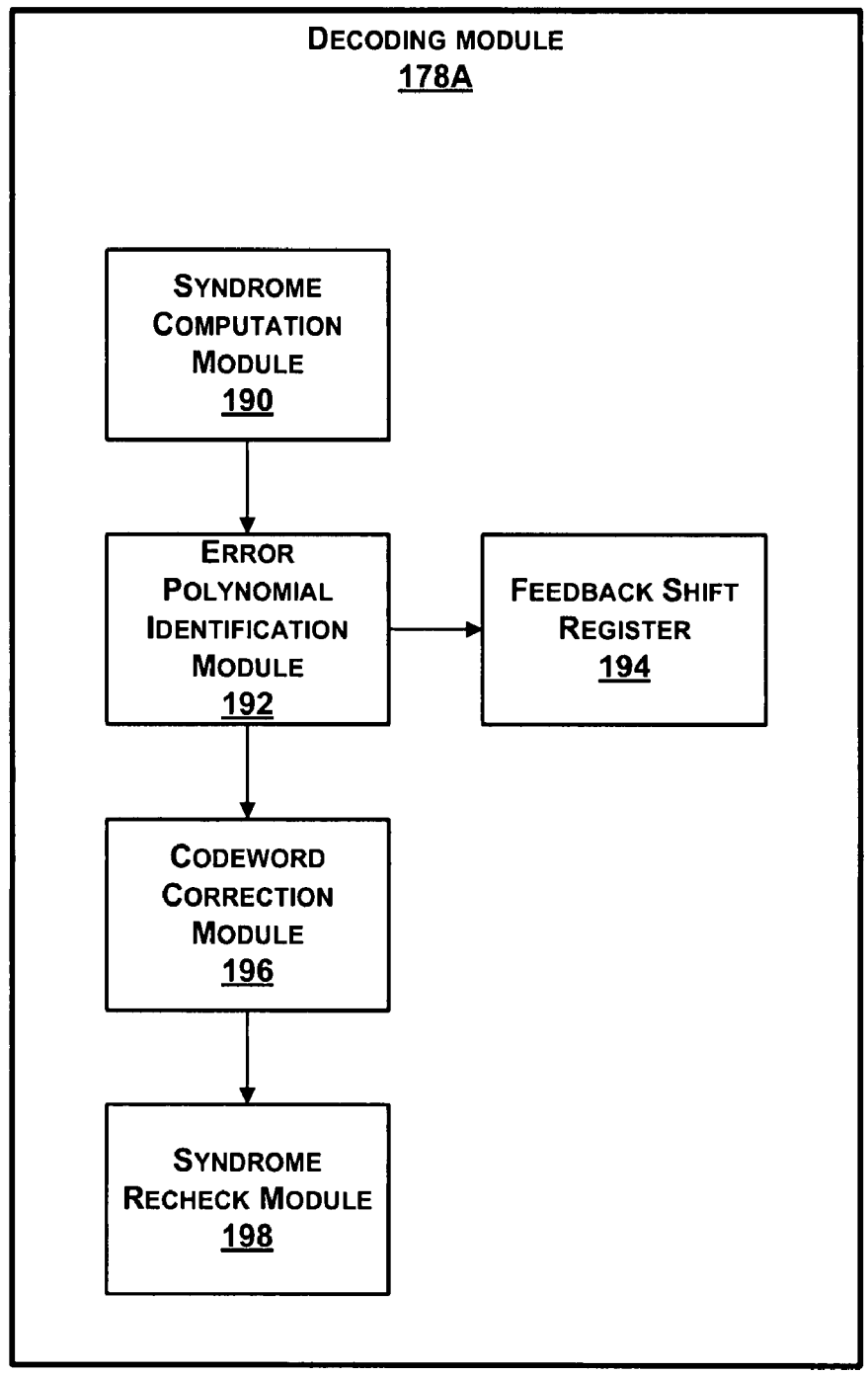
FIG. 7 is a block diagram illustrating exemplary details of a decoding module.

FIG. 7 is a block diagram illustrating exemplary details of a decoding module. While the exemplary details in FIG. 7 are explained with regard to decoding module 178A, similar details may be present in decoding modules 178B through 178W in multiple-error module 124, decoding module 120 in single-error module 118, and no-error module 116.

As illustrated in the example of FIG. 7, decoding module 178A includes a syndrome computation module 190. Syndrome computation module 190 may begin an operation to decode a test word by first computing a syndrome polynomial s(x) associated with the test word.

After computing the syndrome polynomial s(x) associated with the test word, error polynomial identification module 192 may identify an error polynomial e(x) associated with the syndrome polynomial s(x). As illustrated in the example of FIG. 7, error polynomial module 192 may use a feedback shift register 194 in decoding module 178A as part of an operation to identify an error polynomial associated with the syndrome polynomial s(x). Storing a complete map between syndrome polynomials and error polynomials may require the storage of a considerable amount of data. In order to reduce the need to store a mapping between each potential syndrome polynomial and an error polynomial, error polynomial identification module 192 may store one representative syndrome polynomial for each dominant error pattern.

The representative syndrome polynomial for a dominant error pattern may be the syndrome polynomial produced when an instance of the dominant error pattern starts at the first position of the test word. As discussed above, syndrome polynomials associated with instances of a single error pattern at different positions within a codeword repeat after a specific number of positions. Hence, by shifting the syndrome the specific number of times within feedback shift register 194, it may be possible to determine whether or not the codeword produces a syndrome polynomial that is equal to a representative codeword. For this reason, when error polynomial identification module 192 receives a syndrome polynomial s(x) from syndrome computation module 190, error polynomial identification module 192 may insert the codeword into feedback shift register 194.

After inserting the codeword into feedback shift register 194, error polynomial identification module 192 may shift the syndrome in feedback shift register 194 until the syndrome in feedback shift register 194 corresponds with a representative syndrome polynomial or until the syndrome codeword has shifted within feedback shift register 194 a sufficient number of times to determine that there is no representative syndrome polynomial match. This disclosure describes exemplary operations by which error polynomial identification module 192 identifies error polynomials associated with syndrome polynomials s(x) with regard to FIG. 11 below.

After error polynomial identification module 192 identifies an error polynomial e(x), a codeword correction module 196 in decoding module 178A may subtract the identified error polynomial e(x) from a polynomial characterizing the test word, thereby generating a "corrected" test word. A syndrome recheck module 198 may then identify the syndrome polynomial associated with the "corrected" test word. If syndrome recheck module 198 determines that the syndrome polynomial associated with the "corrected" test word is the all-zero polynomial, syndrome recheck module 198 outputs the "corrected" test word. Otherwise, if syndrome recheck module 198 determines that the syndrome polynomial associated with the "corrected" test word is not the all-zero polynomial, syndrome recheck module 198 may not output the "corrected" test word. In some embodiments, the techniques may be directed to a decoding module with the features illustrated in FIG. 7.

Figure 8:
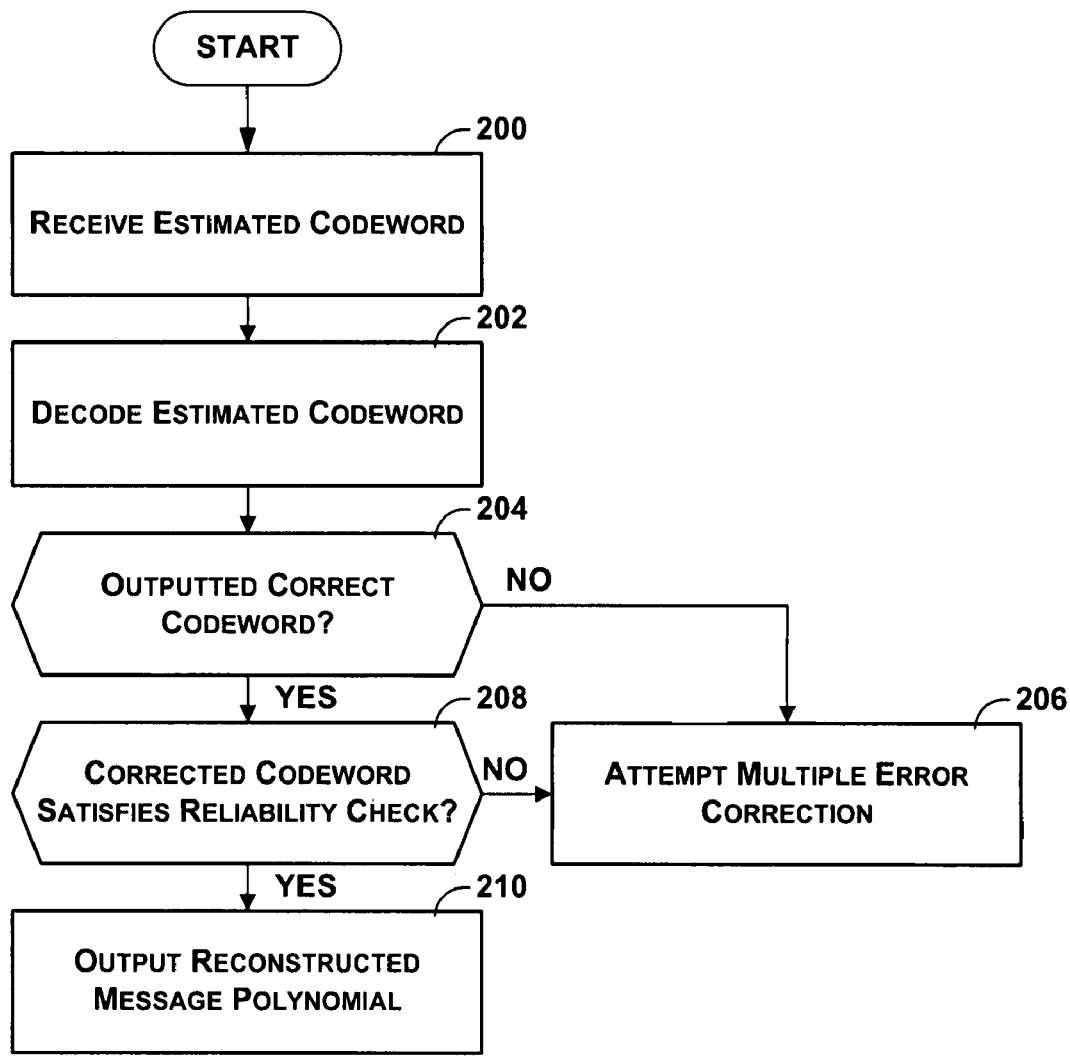
FIG. 8 is a flowchart illustrating exemplary operation of a single-error module in the inner decoder of FIG. 4

FIG. 8 is a flowchart illustrating an exemplary operation of single-error module 118. When single-error module 118 is activated, single-error module 118 may receive an estimated codeword $r_k$ (200). After receiving the estimated codeword $r_k$, decoding module 120 in single-error module 118 decodes the estimated codeword $r_k$ (202). As describe with regard to FIG. 10, decoding module 120 may output a corrected codeword when a syndrome polynomial associated with the corrected codeword is equal to the all-zero polynomial.

After decoding module 120 decodes the estimated codeword $r_k$, reliability check module 122 may determine whether decoding module 120 outputted a corrected codeword (204) If decoding module 120 does not output a corrected codeword ("NO" of 204), single-error module 122 may activate multiple-error module 124, thereby causing multiple-error module 124 to attempt multiple error correction on the estimated codeword $r_k$ (206).

On the other hand, if reliability check module 122 determines that decoding module 120 outputted a corrected codeword ("YES" of 204), reliability check module 122 may determine whether the corrected codeword satisfies a reliability check (208). As described above, reliability check module 122 may determine that the corrected codeword satisfies the reliability check when $$C(e_j^{(i)}) \geq -\frac{E^{(i)}}{2\sigma^2}.$$

If reliability check module 122 determines that the corrected codeword does not satisfy the reliability check ("NO" of 208), reliability check module 122 may activate multiple-error module 124, thereby causing multiple-error module 124 to attempt multiple error correction on the estimated codeword $r_k$ (206). If reliability check module 122 determines that the corrected codeword satisfies the reliability check ("YES" of 208), single-error module 118 may compute a reconstructed message polynomial m'(x) based on the corrected codeword (210). After computing the reconstructed message polynomial m'(x), single-error module 118 may output the reconstructed message polynomial m'(x).

Figure 9:
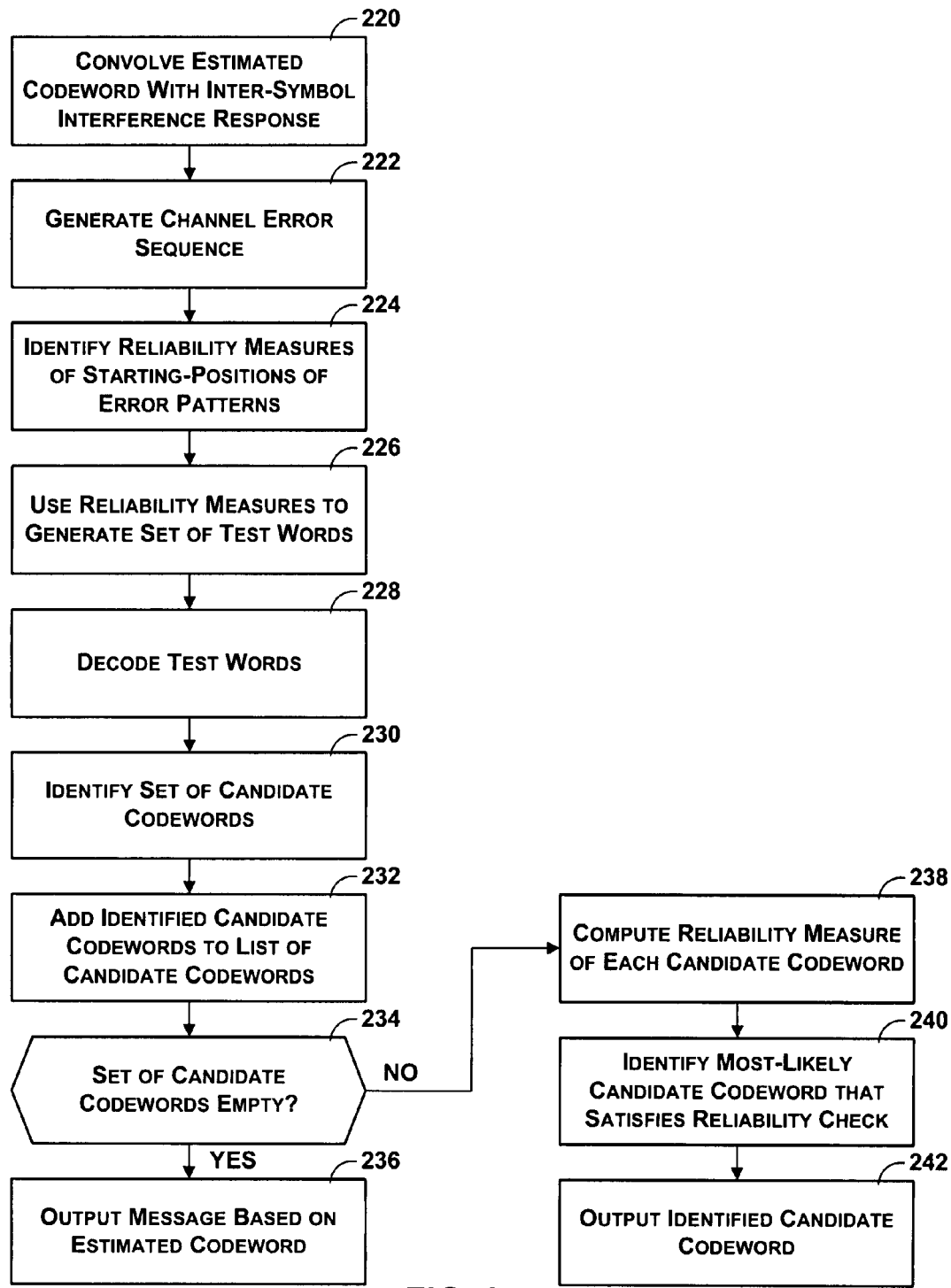
FIG. 9 is a flowchart illustrating exemplary operation of the multiple-error module.

FIG. 9 is a flowchart illustrating an exemplary operation of multiple-error module 124. When multiple-error module 124 is activated, convolution module 170 in multiple-error module 124 convolves the estimated word $r_k$ with an inter-symbol interference response pattern $h_k$ (220). Next, channel error module 172 generates a channel error sequence $q_k$ by subtracting the resulting sequence from the received by channel detector 110 (222).

Next, each of correlators 174 may calculate local reliability measures for instances of a dominant error pattern starting at each position within estimated word $r_k$ (224). As discussed above, correlators 174 may, for example, identify the local reliability measure for an instance of a dominant error pattern that starts at a position i within the received word r using the formula:

$$C(e_j^i) \equiv \frac{1}{2\sigma^2} D_j^{(i)} - \log A_j^{(i)},$$

where $$D_j^{(i)} \equiv \sum_{k=j}^{j+t_i^h} \left[q_k^2 - (q_k - s_k^{(i)})^2\right] \text{ and } A_j^{(i)} \equiv \frac{P\left([\tilde{s}^{(i)}]_j^{j+t_i^h}\right)}{P\left([s^{(i)}]_j^{j+t_i^h}\right)}.$$

It should be appreciated that pattern-dependent noise prediction can be incorporated in the calculation of $Dj^{(i)}$.

Next, test word generation module 176 may use the identified most-probable error starting positions to generate a set of test words w (226). Test word generation module 176 may begin its operation by constructing a vector $v_i$ of error polynomials for each dominant error pattern $e_i$. A vector $v_i$ for a dominant error pattern $e_i$ includes error polynomials that characterize instances of error pattern $e_i$ at the starting positions identified by correlators 174. Error polynomials in each vector $v_i$ may be arranged in order of the reliability measures calculated by correlators 174. Otherwise stated, $v_i = \{x^{i_1}e_i(x), x^{i_2}e_2(x), \ldots, x^{i_m}e_i(x)\}$, where the reliability measure of $x^{i_1}e_i(x)$ is greater than or equal to the reliability measure of $x^{i_2}e_i(x)$, the reliability measure of $x^{i_2}e_i(x)$ is greater than or equal to the reliability measure of $x^{i_3}e_i(x)$, and so on. Error polynomials in each vector $v_i$ may also be obtained by collecting only those starting positions for which the outputs of the correlator associated with error pattern $e_i$ exceed a certain threshold level. In this case, error polynomials in $v_i$ are not necessarily ordered.

After test word generation module 176 constructs a vector $v_i$ of error polynomials for each dominant error pattern $e_i$, test word generation module 176 may identify a given number of the most probable error polynomials in vectors $v_i$. Test word generation module 176 may store in a vector $\tilde{v}$ the given number of the most probable error polynomials in vectors $v_i$. For purpose of explanation the given number of the most probable error polynomials in $\tilde{v}$ is denoted $\tilde{m}$. For example, test word generation module 176 may generate vector $\tilde{v}$ such that vector $\tilde{v}$ includes the twenty most probable error polynomials in the combination of vectors $v_i$. Error polynomials in vector $\tilde{v}$ may be arranged by probability. It should be noted that vector $\tilde{v}$ may include more than one error polynomial associated with a single dominant error pattern.

When test word generation module 176 has generated vector $\tilde{v}$, test word generation module 176 may generate test words by adding to the channel detector output word or the received polynomial r(x) each of $\tilde{m}_1$ most probable error polynomials in vector $\tilde{v}$, where $\tilde{m}_1$ is any integer less than or equal to $\tilde{m}$. This step creates $\tilde{m}_1$ test words each of which contains one error ploynomial with respect to the received word r(x). Test word generation module 176 may subsequently generate test words by adding to the received polynomial r(x) each of $\tilde{m}_2$ most probable pairs of error polynomials in vector $\tilde{v}$, where $\tilde{m}_2$ is any integer less than or equal to $$\binom{\tilde{m}_2}{2}.$$

This step creates $\tilde{m}_2$ test words each of which that contains two error polynomials with respect to the received word r(x). The combined probability of a pair of error polynomials can be obtained by multiplying the probabilities of the constituent error polynomials. This process of adding an increasing number of probable combinations of error polynomials to the received word r(x) may continue to create test words each of which contains up to M−1 error polynomials with respect to r(x). The total number of test words created is then equal to $\tilde{m}_1 + \tilde{m}_2 + \ldots + \tilde{m}_{M-1}$.

There exist many other ways of creating a reasonable set of test words with varying degrees of complexity and performance. In an alternative example, test word generation module 176 may generate the set of this invention.

After test word generation module 176 generates the set of test words w, decoding modules 178 decode test words in the set of test words w (228). When decoding modules 178 decode test words, the decoding modules output codewords when the syndrome polynomials associated with decoded versions of the test words are equal to the all-zero polynomial. This disclosure describes an exemplary operation of one of decoding modules 178 to a codeword (e.g., a test word) regard to FIG. 10.

Next, candidate identification modules 180 identify candidate codewords among the codewords generated by decoding modules 178 (230). Each of candidate identification modules 180 may, for example, use the exemplary operation described with regard to FIG. 11 to determine whether a codeword generated by one of decoding modules 178 is to be identified as a candidate codeword. When candidate identification modules 180 identify candidate codewords, candidate identification modules 180 may add the identified candidate codewords to set of candidate codewords 182 (232).

After candidate identification modules 180 identify the set of candidate codewords 182, candidate election module 184 may determine whether the set of candidate codewords is empty (234). If the set of candidate codewords is empty ("YES" of 234), candidate election module 184 may output a reconstructed message polynomial m'(x) that results from decoding the estimated codeword $c_k$ (236).

On the other hand, if the set of candidate codewords is not empty ("NO" of 234), candidate election module 184 may calculate the reliability measures of an individual candidate codeword by summing the local reliability measures of each of the error polynomials used to generate the candidate codeword (238). Candidate election module 184 may then identify the one of the candidate codewords that has the greatest reliability measure (240). After identifying the one of the candidate codewords that has the greatest reliability measure, candidate election module 184 may output the candidate codeword that has the greatest reliability measure (242).

Figure 10:
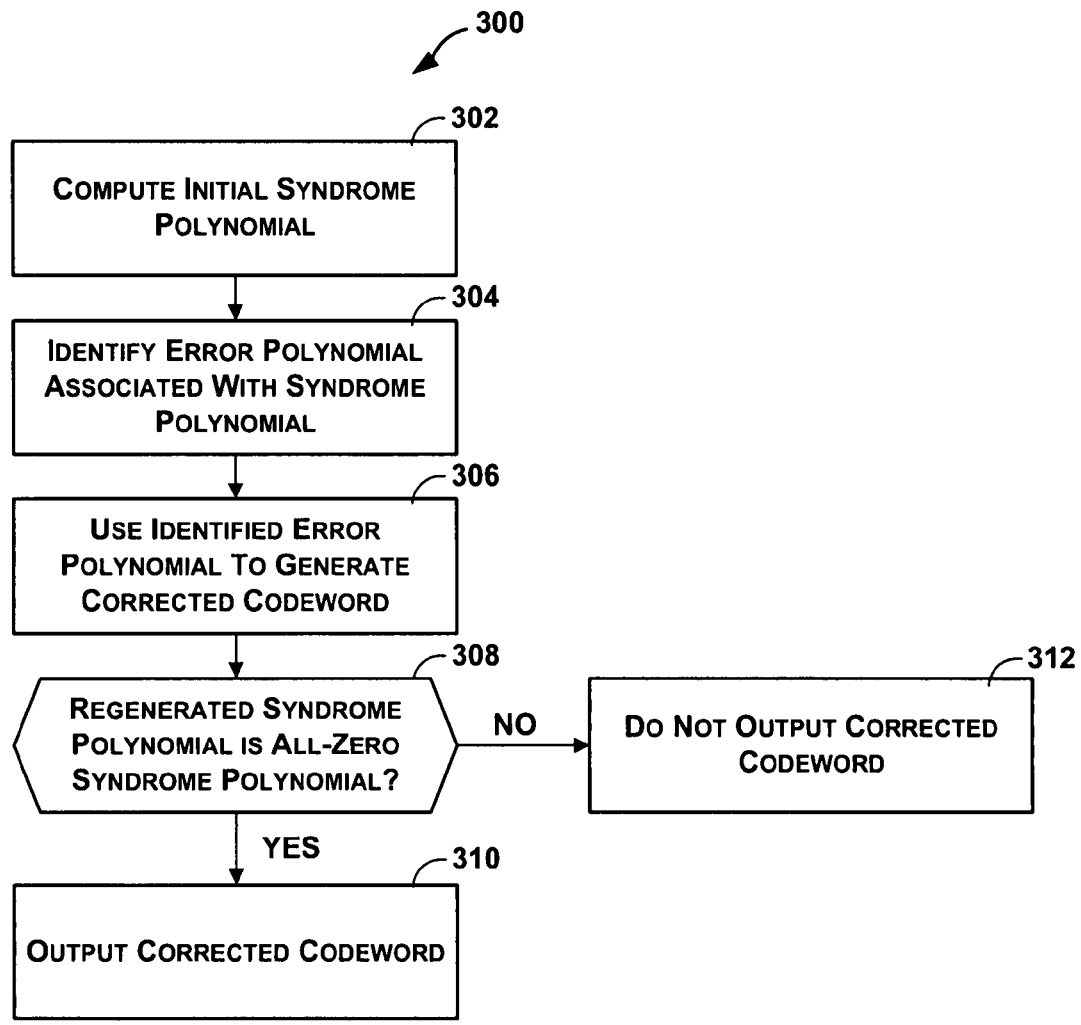
FIG. 10 is a flowchart illustrating exemplary operation of a set of test words.

FIG. 10 is a flowchart illustrating an exemplary operation 300 performed by decoding modules 178. For purposes of explanation, and without loss of generality, exemplary operation 300 in FIG. 10 is explained with regard to decoding module 178A. Nevertheless, any of decoding modules 178, decoding module 120 or error correction module 118 may perform exemplary operation 300. In one aspect, error correction module 118 may be viewed as a combination of decoding modules 178 and respective candidate identification modules 180.

In accordance with exemplary operation 300, syndrome computation module 190 in decoding module 178A may first compute an initial syndrome polynomial s(x) for a word (302). For instance, syndrome computation module 190 may compute initial syndrome polynomial s(x) for a test word. After syndrome computation module 190 computes initial syndrome polynomial s(x), error polynomial identification module 192 in decoding module 178A may identify an error polynomial e(x) associated with the initial syndrome polynomial s(x) (304). For instance, error polynomial identification module 192 may identify an error polynomial associated with the initial syndrome polynomial using the exemplary operation illustrated in FIG. 12.

After error polynomial identification module 192 identifies the error polynomial associated with the initial syndrome polynomial, codeword correction module 196 in decoding module 178A may use the error polynomial associated with the initial syndrome polynomial to generate a corrected codeword polynomial (306). Codeword correction module 196 may, for example, use the error polynomial associated with the initial syndrome polynomial to generate the corrected codeword polynomial by subtracting the error polynomials associated with the initial syndrome polynomial from the test word polynomial.

After codeword correction module 196 generates the corrected codeword polynomial, syndrome recheck module 198 may determine whether a syndrome polynomial associated with the corrected codeword polynomial is equal to the all-zero polynomial (308). If the syndrome polynomial associated with the corrected codeword polynomial is equal to the all-zero polynomial ("YES" of 308), syndrome recheck module 198 may output the corrected codeword (310). Otherwise, if the syndrome polynomial associated with the corrected codeword polynomial is not equal to the all-zero polynomial ("NO" of 308), syndrome recheck module 198 may not output the corrected codeword (312).

FIG. 11 is a flowchart illustrating an exemplary operation 320 of one of candidate identification modules 180. For purposes of explanation, and without loss of generality, this disclosure explains exemplary operation 320 with regard to candidate identification module 180A. Nevertheless, any of candidate identification modules 180 may perform exemplary operation 320.

If decoding module 178A outputs a corrected codeword, candidate identification module 180A may receive the corrected codeword c(x) (322). After receiving the corrected codeword c(x), candidate identification module 180A may determine whether an error polynomial associated with the corrected codeword c(x) satisfies a reliability check (324). As described above, candidate identification module 180A may, for example, determine that the error polynomial associated with the corrected codeword c(x) satisfies the reliability check when $$C(e_j^{(i)}) \geq -\frac{E^{(i)}}{2\sigma^2}.$$

If the error polynomial associated with the corrected codeword c(x) satisfies the reliability check ("YES" of 324), candidate identification module 180A may add the corrected codeword c(x) to the set of candidate codewords (326). Otherwise, if the error polynomial associated with the corrected codeword c(x) does not satisfy the reliability check ("NO" of 324), candidate identification module 180A may discard the corrected codeword c(x) (328).

Figure 12:
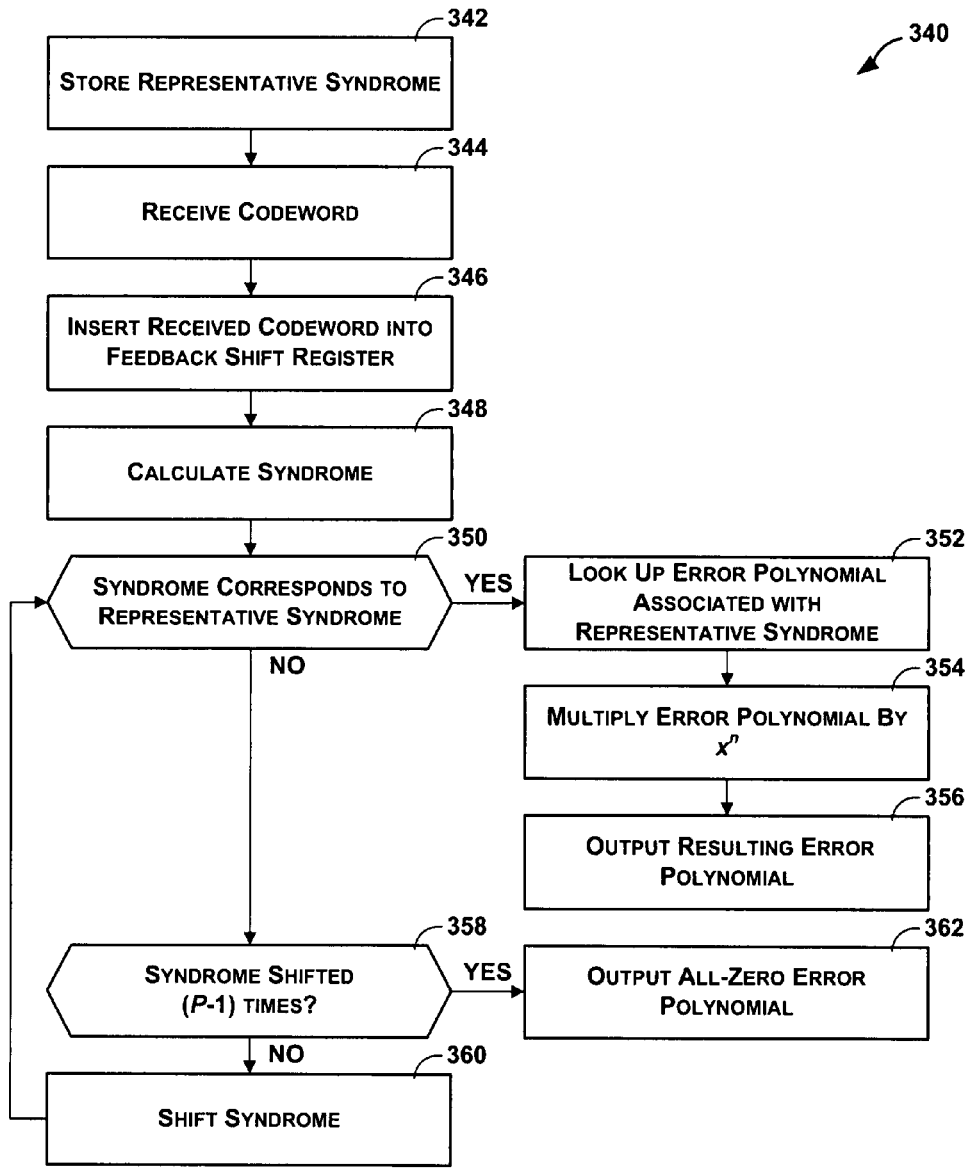
FIG. 12 is a flowchart illustrating exemplary operation of an error module.

FIG. 12 is a flowchart illustrating an exemplary operation 340 to identify an error polynomial $e_i(x)$ associated with a syndrome polynomial s(x) of a received word. For purposes of explanation, and without loss of generality, this disclosure explains exemplary operation 340 with regard to error polynomial identification module 192 of decoding module 178A. Nevertheless, error polynomial identification modules in other ones of decoding modules 178B through 178W and decoding module 120 may perform exemplary operation 340.

Initially, error polynomial identification module 192 stores a representative syndrome associated with each dominant error pattern $e_i$ (342). For instance, error polynomial identification module 192 may, for each error pattern $e_i$, store a syndrome that results from dividing a word that includes an instance of dominant error pattern $e_i$ starting at the first position and zeros in the remaining bit positions. Error polynomial identification module 192 may, for example, store the representative syndromes in a main memory of device 2, a computer-readable medium, a set of registers, or another type of computer-readable medium.

After error polynomial identification module 192 has stored representative syndrome associated with each dominant error pattern, error polynomial identification module 192 may receive a word (344). When error polynomial identification module 192 receives the word, error polynomial identification module 192 may insert the received word into feedback shift register 194 (346). Inserting the received word into feedback shift register 194 causes each coefficient of a received polynomial r(x) that characterizes the received word to be inserted into a corresponding location within feedback shift register 194. In this manner, an entire word is fed into feedback shift register 194.

Next, error polynomial identification module 192 may calculate a syndrome based on the values in feedback shift register 194 (348). Error polynomial identification module 192 may, for example, calculate the syndrome based on a first or last portion of the values of the feedback shift register 194, e.g., the first or last fourteen values. After calculating the syndrome, error polynomial identification module 192 may determine whether the calculated syndrome corresponds to one of the representative syndromes previously stored by error polynomial identification module 192 (350). For example, if syndrome polynomial $s(x)$ representing the syndrome produced by generator polynomial $g(x)=1+x^3+x^5+x^8$ is equal to $1+(1)x+(0)x^2+(0)x^3+(0)x^4+(0)x^5+(0)x^6+(0)x^7=1+x$ and error polynomial identification module 192 has previously stored the syndrome polynomial $1+x$, then error polynomial identification module 192 may determine that the calculated syndrome corresponds to one of the representative syndrome polynomials previously stored by error polynomial identification module 192.

If error polynomial identification module 192 determines that the calculated syndrome or a syndrome polynomial $s(x)$ representing the syndrome corresponds to one of the previously stored syndrome polynomials ("YES" of 350), error polynomial identification module 192 may identify an error polynomial $e(x)$ associated with the representative syndrome $e_r(x)$ (352). For instance, error polynomial identification module 192 may use a look-up table to look up representative error polynomial $e_r(x)$. Next, error polynomial identification module 192 may multiply the error polynomial $e_r(x)$ by $x^n$ (354), n is the number of times the syndrome has been shifted within feedback shift register 194. In this case, the error polynomial would be multiplied by $x^0$ since the received word has not been shifted within feedback shift register 194. Multiplying error polynomial $e_r(x)$ by $x^n$ results in an error polynomial $x^n e_r(x)$ that characterizes an instance of an error pattern that starts at position n. After multiplying the error polynomial $e_r(x)$ by $x^n$, error polynomial identification module 192 may output the resulting error polynomial $x^n e_r(x)$ (356). As described in detail herein, the error polynomial output may then be added to the received word r to generate a corrected codeword.

If error polynomial identification module 192 determines that the calculated syndrome polynomial $s(x)$ does not correspond to one of the representative syndrome ("NO" of 350), error polynomial identification module 192 may determine whether the syndrome has been cyclically shifted within feedback shift register 194 (P−1) times, where P is equal to the period of the corresponding generator polynomial (358). If the syndrome has not been cyclically shifted within feedback shift register 194 (P−1) times ("NO" of 358), error polynomial identification module 192 may perform a cyclic shift of the syndrome by one position in feedback shift register 194 (360). In other words, each coefficient of the syndrome in feedback shift register 194 moves to a next position within feedback shift register 194 with a coefficient in a last position in feedback shift register 194 moving to a first position in feedback shift register 194. Consequently, it may be said that error polynomial identification module 192 identifies the error polynomial associated with the syndrome polynomial based on one of the representative error polynomials that is associated with a syndrome polynomial produced by a cyclic shift of the syndrome. After cyclically shifting the syndrome one position in feedback shift register 194, error polynomial identification module 192 determines whether the syndrome corresponds to the stored representative of the syndrome with the previously stored syndrome (350), and so on. If the syndrome has been cyclically shifted within feedback shift register 194 (P−1) times ("YES" of 358), error polynomial identification module 192 may output an all zero error polynomial (362). In other words, error polynomial identification module 192 may output a syndrome polynomial in which the coefficients of each terms are equal to zero. In this case, the estimated codeword is regarded as the corrected codeword.

The error polynomial identification module 192 may use a number of smaller feedback shift registers that may run in parallel. Let the overall generator polynomial assume the highly general form: $g(x)=g_1(x)\,g_2(x)\ldots g_G(x)$, where each factor is not necessarily irreducible. The overall syndrome is $s(x)=r(x) \bmod g(x)=w(x) \bmod g(x)$. We can also generate alternative syndrome values $s_i(x)=r(x) \bmod g_i(x)=w(x) \bmod g_i(x)$, $1\leq i\leq G$. The overall syndrome value can be obtained based on the G alternative syndrome values. The error-pattern type and position identification maybe done more effectively by computing these "G-dimensional" syndrome values.

Figure 13:
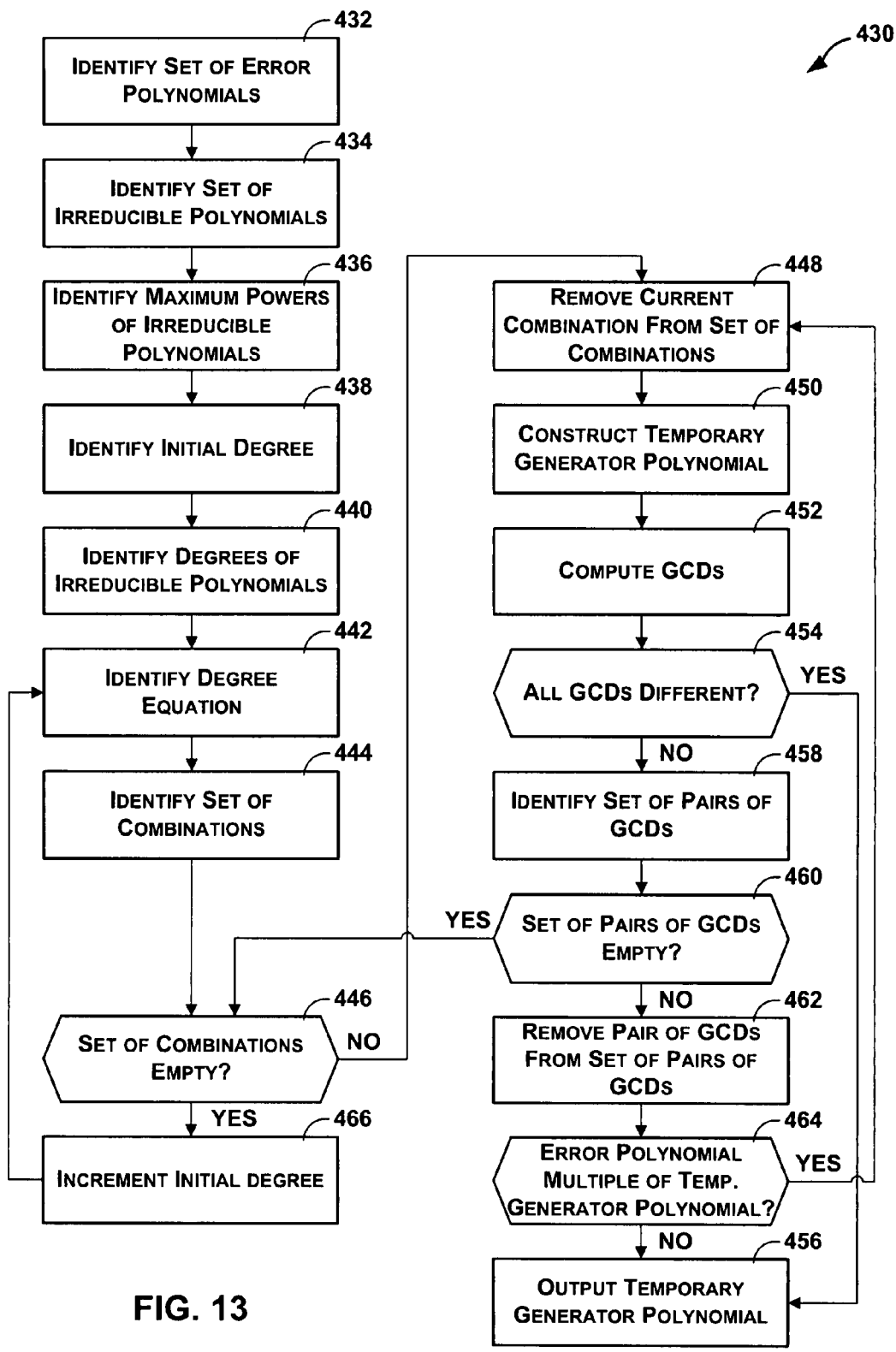
FIG. 13 is a flowchart illustrating a first exemplary operation of a generator polynomial module.

FIG. 13 is a flowchart illustrating a first exemplary operation 430 to identify a lower-degree preliminary generator polynomial. In operation 430, generator polynomial module 14 identifies a set of error polynomials $e_1(x)$ through $e_L(x)$ for a set of dominant error patterns, where L is the number of dominant error patterns (432). Next, generator polynomial module 14 identifies a set of irreducible polynomials $p_1(x)$ through $p_K(x)$ (434). Each irreducible polynomial $p_1(x)$ through $p_K(x)$ is a factor of error polynomials $e_1(x)$ through $e_L(x)$. K is the number of distinct irreducible polynomials that are factors of error polynomials $e_1(x)$ through $e_L(x)$. For example, generator polynomial module 14 may identify the set of irreducible polynomials $p_1(x)=(1+x), p_2(x)=(1+x+x^2)$, $p_3(x)=(1+x+x^2+x^3+x^4), p_4(x)=(1+x+x^3)$, $p_5(x)=(1+x+X^3)$, $p_6(x)=(+x^3+x^6)$.

Once generator polynomial module 14 has identified irreducible polynomials $p_1(x)$ through $p_K(x)$, generator polynomial module 14 may identify the maximum powers $d_1$ through $d_K$ associated with respective ones of irreducible polynomials $p_1(x)$ through $p_k(x)$ (436). Continuing the previous example, generator polynomial module 14 may identify the maximum power $d_1$ of irreducible polynomial $p_K(x)$ as 7, the maximum power $d_2$ of irreducible polynomial $p_2(x)$ as 2, the maximum power $d_3$ of irreducible polynomial $p_3(x)$ as 2, the maximum power $d_4$ of irreducible polynomial $p_4(x)$ as 1, the maximum power $d_5$ of irreducible polynomial $p_5(x)$ as 1, and the maximum power $d_6$ of irreducible polynomial $p_6(x)$ as 1.

After identifying the maximum powers $d_1$ through $d_K$ associated with respective ones of irreducible polynomials $p_1(x)$ through $p_K(x)$, generator polynomial module 14 identifies an initial degree $\Delta'$ (438). The initial degree $\Delta'$ is a smallest possible power $d_i$ such that $(2^{d_i}-1)$ is greater than or equal to L, the number of dominant error patterns. Continuing the example of the previous paragraph, if the number of dominant error patterns is 10, $d_1$ is equal to 7 because $(2^7-1)=127$ is the lowest one of maximum powers $d_1$ through $d_K$ such that $(2^{d_i}-1)$ is greater than or equal to 10. Note that the next-highest one of maximum powers $d_1$ through $d_K$ is equal to 2 and $(2^2-1)=3$, which is not greater than or equal to 10.

After identifying the initial degree $\Delta'$, generator polynomial module 14 identifies the degrees $m_1$ through $m_K$ of irreducible polynomials $p_1(x)$ through $p_K(x)$ (440). Continuing the previous example, the degree $m_1$ of $p_1(x)$ is equal to 1, the degree $m_2$ of $p_2(x)$ is equal to 2, the degree $m_3$ of $p_3(x)$ is equal to 4, the degree $m_4$ of $p_4(x)$ is equal to 3, the degree $m_5$ of $p_5(x)$ is equal to 3, and the degree $m_6$ of $p_6(x)$ is equal to 6.

Generator polynomial module 14 may then identify a degree equation of the form $\Delta'=m_1\gamma_1+m_2\gamma_2+\ldots+m_K\gamma_K$, where $m_1$ through $m_K$ are the degrees of irreducible polynomials $p_1(x)$ through $p_K(x)$ and where $\gamma_1$ through $\gamma_K$ are non-negative integers, and $\Delta'$ is the initial degree (442). Continuing the previous example, generator polynomial module 14 identifies a degree equation of the form $7=(\gamma_1)+2(\gamma_2)+4(\gamma_3)+3(\gamma_4)+3(\gamma_5)+6(\gamma_6)$.

Next, generator polynomial module 14 identifies a set of all possible combinations of non-negative integers $\gamma_1$ through $\gamma_K$ such that $\Delta'=m_1\gamma_1+m_2\gamma_2+\ldots+m_K\gamma_K$ (444). Continuing the previous example, generator polynomial module 14 may identify the combination $\gamma_1=0$, $\gamma_2=0$, $\gamma_3=1$, $\gamma_4=1$, $\gamma_5=0$, and $\gamma_6=0$ as one such combination because $7=(0)+2(0)+4(1)+3(1)+\gamma_3(0)+6(0)$. In the previous example, generator polynomial module 14 may also identify the combination $\gamma_1=1$, $\gamma_2=0$, $\gamma_3=0$, $\gamma_4=0$, $\gamma_5=0$, and $\gamma_6=1$ as another such combination because $7=(1)+2(0)+4(0)+3(0)+3(0)+6(1)$.

After identifying the set of possible combinations, generator polynomial module 14 determines whether the set of possible combinations is empty (446). If generator polynomial module 14 determines that the set of possible combinations is not empty ("NO" of 446), generator polynomial module 14 removes one of the combinations from the set of possible combinations (448). This disclosure refers to this removed one of the combinations as the "current combination." After removing the current combination from the set of possible combinations, generator polynomial module 14 may construct a temporary generator polynomial $g'(x)$ based on the current combination (450). Temporary generator polynomial $g'(x)$ is of the form $g'(x)=p_1^{\gamma_1}(x)p_2^{\gamma_2}(x)\ldots p_K^{\gamma_K}(x)$, where $\gamma_1$ through $\gamma_K$ are the values in the current combination. Continuing the ongoing example, if the combination $\gamma_1=1$, $\gamma_2=0$, $\gamma_3=0$, $\gamma_4=0$, $\gamma_5=0$, and $\gamma_6=1$ is the current combination, generator polynomial module 14 may construct the temporary generator polynomial $g'(x)=(1+x)^1(1+x+X^2)^0 (1+x+x^2+x^3+X^4)^0 (1+x+x^3)^0 (1+x^2+x^3)^0 (1+x^3+X^6)^1=(1+x)(1+x^3+x^6)$.

After identifying temporary generator polynomial $g'(x)$, generator polynomial module 14 computes the greatest common divisors ("GCDs") of temporary generator polynomial $g'(x)$ and each of error polynomials $e_1(x)$ through $e_L(x)$ (452). For purposes of explanation, this disclosure refers to the GCDs of temporary generator polynomial $g'(x)$ and error polynomials $e_1(x)$ through $e_L(x)$ as $c_1(x)$ through $C_L(x)$.

Next, generator polynomial module 14 determines whether each of GCDs $c_1(x)$ through $C_L(x)$ are different (454). If generator polynomial module 14 determines that each GCDs $c_1(x)$ through $C_L(x)$ are different ("YES" of 454), generator polynomial module 14 outputs $g'(x)$ as the preliminary generator polynomial $g'(x)$ (456).

Otherwise, if generator polynomial module 14 determines that one or more of GCDs $c_1(x)$ through $C_L(x)$ are equal ("NO" of 456), generator polynomial module 14 identifies a set of pairs of GCDs $c_1(x)$ through $C_L(x)$, such that each the GCDs in each pair of GCDs is equal (458). Next, generator polynomial module 14 may determine whether the set of GCD pairs is empty (460). If the set of GCD pairs is not empty ("NO" of 460), generator polynomial module 14 removes a pair of GCDs $\{c_i(x), c_j(x)\}$ from the set of GCD pairs, where i and j are integers between 1 and L, and i does not equal j (462). For purposes of explanation, this disclosure may refer to this GCD pair as the "current GCD pair." After removing the current GCD pair from the set of GCD pairs, generator polynomial module 14 determines whether any error polynomial of the form $e^t(x)=e_i(x)+x^\mu e_j(x)$ is a multiple of temporary generator polynomial $g^t(x)$ for any integer μ between 1 and n, n representing the number of symbols in a codeword (464). In error polynomial $e^t(x)=e_i(x)+x^\mu e_j(x)$, $e_i(x)$ is the error polynomial corresponding to GCD $c_i(x)$ and $e_j(x)$ is the error polynomial corresponding to GCD $c_j(x)$. If there is no error polynomial of the form $e^t(x)=e_i(x)+x^\mu e_j(x)$ that is a multiple of temporary generator polynomial $g^t(x)$ ("NO" of 464), generator polynomial module 14 outputs the $g^t(x)$ as the preliminary generator polynomial $g^t(x)$ (456). On the other hand, if one or more error polynomials of the form $e^t(x)=e_i(x)+x^\mu e_j(x)$ are multiples of temporary generator polynomial $g^t(x)$ for any μ between 1 and n ("YES" of 464), generator polynomial module 14 removes the current combination from the set of combinations.

If generator polynomial module 14 determines that the set of GCD pairs is empty ("YES" of 460), generator polynomial module 14 loops back and again determines whether the set of possible combinations is empty (446). If generator polynomial module 14 determines that the set of possible combination is not empty ("NO" of 446), generator polynomial module 14 may remove another combination from the set of possible combinations, and so on. However, if generator polynomial module 14 determines that the set of possible combinations is empty ("YES" of 446), generator polynomial module 14 increments initial degree $\Delta'$ by one (466). After incrementing initial degree $\Delta'$, generator polynomial module 14 may again identify a degree equation of the form $\Delta'=m_1\gamma_1+m_2\gamma_2+\ldots+m_K\gamma_K$, where $m_1$ through $m_K$ are the degrees of irreducible polynomials $p_1(x)$ through $p_K(x)$ and where $\gamma_1$ through $\gamma_K$ are non-negative integers, and $\Delta'$ is the incremented initial degree (442), and so on.

In the ongoing example given in the preceding paragraphs, greatest common divisors of error polynomials $e_1(x)$ through $e_L(x)$ and temporary generator polynomials $g^t(x)$ based on combinations of $\gamma_1$ through $\gamma_K$ are distinct when initial degree $\Delta'=7$. Furthermore, for each temporary generator polynomial $g^t(x)$ based on combinations of $\gamma_1$ through $\gamma_K$ when initial degree $\Delta'=7$, there are one or more GCDs $c_i(x)$ and $c_j(x)$ of error polynomials $e_i(x)$ through $e_L(x)$ and the temporary generator polynomial $g'(x)$ where $d_i(x)$ is equal to $d_j(x)$ and where an error polynomial of the form $e_i(x)+x^\mu e_j(x)$ is a multiple of temporary generator polynomial $g^t(x)$ for one or more values of μ, where μ is an integer between 1 and the number of symbols in a codeword.

However, in the ongoing example given in the preceding paragraphs, generator polynomial module 14 may successfully identify two different preliminary generator polynomials based on combinations of $\gamma_1$ through $\gamma^K$ when initial degree $\Delta'$ is equal to 8. For instance, generator polynomial module 14 may successfully identify the preliminary generator polynomial $g'(x)=p_1^2(x)\,p_2^1(x)\,p_3^1(x)\,p_4^0(x)\,p_5^0(x)\,p_6^0(x)=1+x^3+x^5+x^8$ based on $\gamma_1=2$, $\gamma_2=1$, $\gamma_3=1$, $\gamma_4=0$, $\gamma_5=0$, $\gamma_6=0$ when initial degree $\Delta'=8$. In addition, generator polynomial module 14 may successfully identify the preliminary generator polynomial $g'(x)=p_1^2(x)\,p_2^0(x)\,p_3^0(x)\,p_4^0(x)\,p_5^0(x)\,p_6^1(x)=1+x^2+x^3+x^5+x^6+x^8$ based on $\gamma_1=2$, $\gamma_2=0$, $\gamma_3=0$, $\gamma_4=0$, $\gamma_5=0$, $\gamma_6 1=$when initial degree $\Delta'=8$. Note that the degrees of both of these preliminary generator polynomials is 8, whereas the degree of the preliminary generator polynomial of the form $g'(x)=p_1^{d_1}(x)\,p_2^{d_2}(x)\ldots p_K^{d_K}(x)$, described above, is 31. Because the degree of the preliminary generator polynomials identified in operation 430 have lower degrees, hardware implementations of decoding module 12 that use the preliminary generator polynomials identified in operation 430 may be less complex than hardware implementations of decoding module 12 that use preliminary generator polynomials of the form $g'(x)=p_1^{d_1}(x)p_2^{d_2}(x)\ldots p_K^{d_K}(x)$.

Figure 14:
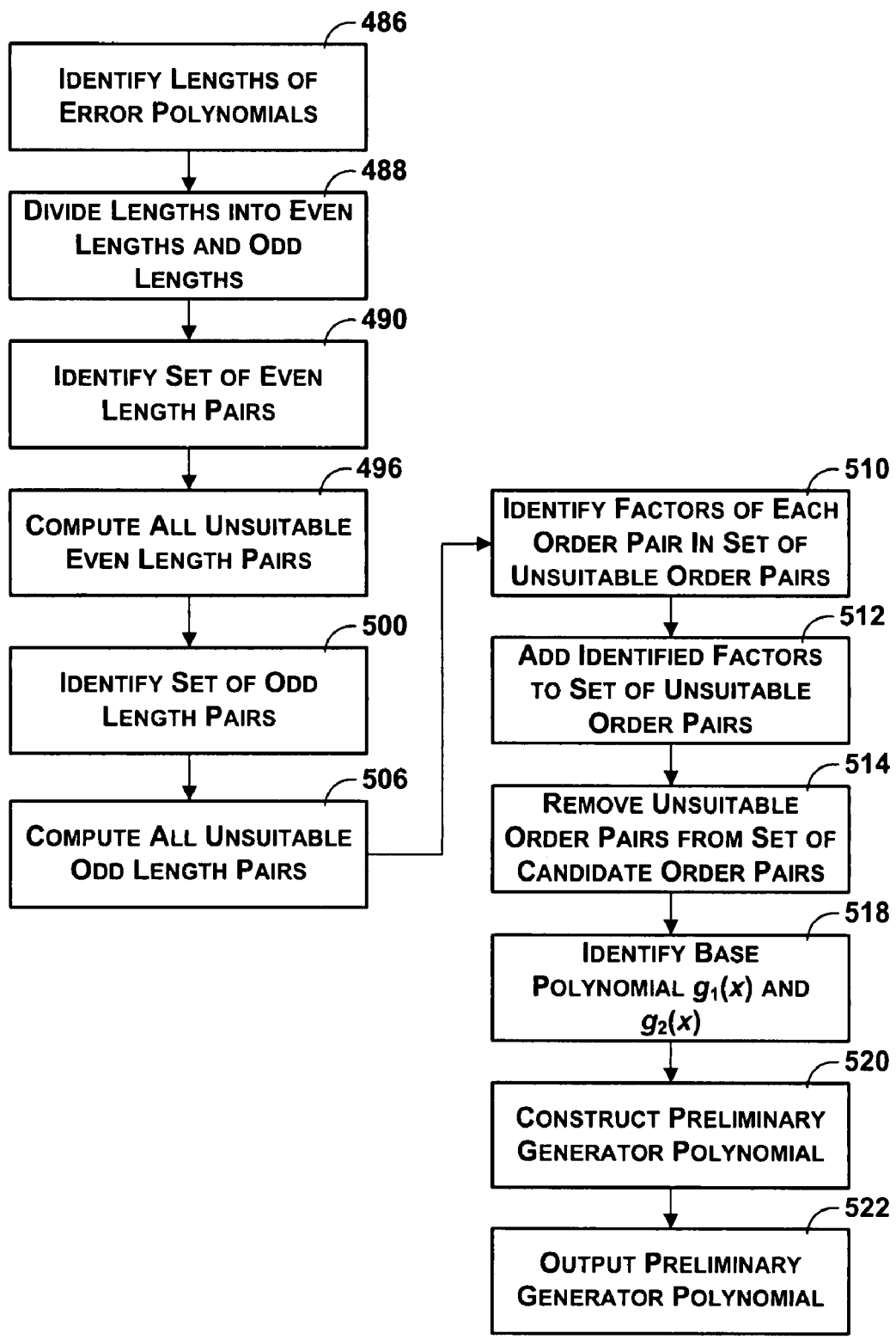
FIG. 14 is a flowchart illustrating a second exemplary operation of the generator polynomial module.

FIG. 14 is a flowchart illustrating a second exemplary operation 480 to identify a lower-degree preliminary generator polynomial. In order to use operation 480, every coefficient of each term of each of error polynomials up to a given length must be equal to 1. Unlike the operation 430 in FIG. 12, operation 480 is not search based. Rather, operation 480 exploits the following theorem:

Theorem 1: Let preliminary generator polynomial $g'(x)=g_1(x)g_2(x)$, where base polynomial $g_1(x)$ is either $(1+x^{p_1})$ or its factor having an order of $p_1$, while base polynomial $g_2(x)$ is either $(1+x+x^2+\ldots+x^{p_2-1})$ or its factor having an order of $p_2$. Then, given all-ones error polynomials $e_i(x)$ of length $l_i$ and $e_j(x)$ of length $l_j$, $l_i > l_j > 0$, the corresponding syndrome sets $S_i$ and $S_j$ are distinct, if and only if $$\{p_1, p_2\} \neq \left\{\frac{(l_i \pm l_j)}{2m}, \frac{(l_i \mp l_j)}{2n}\right\}$$

for any positive integers m and n.

In particular, operation 480 uses Theorem 1 to rule out the pairs of orders (i.e., "order pairs") that cannot give rise to distinct syndrome polynomial sets. This disclosure refers to such order pairs as "unsuitable" order pairs in the sense that the corresponding base polynomials $g_1(x)$'s and $g_2(x)$'s are to be avoided in constructing preliminary generator polynomial $g'(x)$. Assuming L different lengths $$\binom{L}{2}$$

order pairs corresponding to the same number of length pairs need to be produced. Theorem 1, however, reveals that only those length pairs for which $(l_i \pm l_j)$ is even need to be examined. This is because $(l_i \pm l_j)/2m$ cannot be an integer for any positive integer m if $(l_i \pm l_j)$ is odd. Hence, generator polynomial module 14 only needs to examine those length pairs $l_i$ and $l_j$ that are either both even or both odd. Thus, given L all-ones error polynomials, it may not be necessary for generator polynomial module 14 to exhaust all $$\binom{L}{2}$$

possible length order pairs. Rather, generator polynomial module 14 may separately consider a set of even lengths and a set of odd lengths in identifying the unsuitable order pairs. Moreover, once generator polynomial module 14 obtains the unsuitable order pair $$\left\{\frac{(l_i + l_j)}{2}, \frac{(l_i - l_j)}{2}\right\}, l_i >$$

$l_j$, then generator polynomial module 14 automatically determines all the factors $$\left\{\frac{(l_i + l_j)}{2m}, \frac{(l_i - l_j)}{2n}\right\},$$

s to be unsuitable order pairs. Generator polynomial module 14 may obtain the acceptable order pairs after eliminating all unsuitable order pairs.

Applying this reasoning, generator polynomial module 14 may first identify the orders $o_1$ through $o_L$ of each of error polynomials $e_1(x)$ through $e_L(x)$. Next, generator polynomial module 14 may identify a set of candidate order pairs that includes each possible order pair $\{o_i, o_j\}$, where i and j are integers from 1 to L.

Once generator polynomial module 14 has identified the set of candidate order pairs, generator polynomial module 14 may identify lengths $l_1$ through $l_L$ (486). Lengths $l_1$ through $l_L$ are equal to the lengths of respective ones of error polynomials $e_1(x)$ through $e_L(x)$. For example, the error patterns listed in Table 1 above, generator polynomial module 14 may identify the lengths $\{1, 2, 3, 4, 5, 6, 7, 8, 9, 10\}$. Next, generator polynomial module 14 may divide lengths $l_1$ through $l_L$ into two sets: a set of even lengths $L_{even}$ and a set of odd lengths $L_{odd}$ (488). Continuing the previous example, the set of even lengths $L_{even}$ is equal to $\{2, 4, 6, 8, 10\}$ and the set of odd lengths $L_{odd}$ is equal to $\{1, 3, 5, 7, 9\}$.

After dividing lengths $l_1$ through $l_L$ in to $L_{even}$ and $L_{odd}$, generator polynomial module 14 may identify a set of even length pairs (490). The set of even length pairs includes each pair of lengths in $L_{even}$. Generator polynomial module 14 computes all unsuitable order pairs (496). For example, generator polynomial module 14 may may remove a length pair $\{l_i, l_j\}$ from the set of even length pairs, where $l_i$ is greater than $l_j$ (494). For purposes of explanation, this disclosure refers to the length pair removed from the set of even length pairs as the "current even length pair." Continuing the previous example, generator polynomial module 14 may, for instance, remove a length pair $\{6, 2\}$ from the set of even length pairs. Next, generator polynomial module 14 may use $l_i$ and $l_j$ of the current even length pair to compute the following unsuitable order pair: use $l_i$ and $l_j$ of the current length pair to compute the following:

$$\left\{\frac{(l_i + l_j)}{2}, \frac{(l_i - l_j)}{2}\right\}.$$

Continuing the ongoing example, for the length pair $\{6, 2\}$, generator polynomial module 14 may compute the order pair $\{(6+2)/2, (6-2)/2\}=\{4, 2\}$. After computing this order pair, generator polynomial module 14 may add this order pair to a set of unsuitable order pairs. Once generator polynomial module 14 has added this order pair to the set of unsuitable order pairs, generator polynomial module 14 may loop back and again determine whether the set of even length pairs is empty (492), and so on.

After computing all unsuitable even length pairs, generator polynomial module 14 may identify a set of odd length pairs (500). The set of odd length pairs includes each pair of lengths in $L_{odd}$. After identifying the set of odd length pairs, generator polynomial module 14 may compute all unsuitable odd length pairs (506). Generator polynomial module 14 may compute unsuitable odd length pairs in a similar manner described above with respect to the even length pairs.

Generator polynomial module 14 may, in this manner, identify the following unsuitable order pairs for the identified length pairs:

| $[l_{e_1}, l_{e_2}]$ | Unsuitable order pairs | $[l_{o_1}, l_{o_2}]$ | Unsuitable order pairs |
|---|---|---|---|
| [4, 2] | {3, 1} | [3, 1] | {2, 1} |
| [6, 2] | {4, 2} | [5, 1] | {3, 2} |
| [8, 2] | {5, 3} | [7, 1] | {4, 3} |
| [10, 2] | {6, 4} | [9, 1] | {5, 4} |
| [6, 4] | {5, 1} | [5, 3] | {4, 1} |
| [8, 4] | {6, 2} | [7, 3] | {5, 2} |
| [10, 4] | {7, 3} | [9, 3] | {6, 3} |
| [8, 6] | {7, 1} | [7, 5] | {6, 1} |
| [10, 6] | {8, 2} | [9, 5] | {7, 2} |
| [10, 8] | {9, 1} | [9, 7] | {8, 1} |

Generator polynomial module 14 may identify the factors of each order pair in the set of unsuitable order pairs (510). For instance, the order pairs {1, 1}, {1, 2}, {2, 2}, and {4, 1} are factors of the order pair {4, 2}. After identifying the factors of each order pair in the set of unsuitable order pairs, generator polynomial module 14 may add the identified factors to the set of unsuitable order pairs (512).

Next, generator polynomial module 14 may remove the order pairs in the set of unsuitable order pairs from the set of candidate order pairs (514). The order pairs that remain in the set of candidate order pairs after generator polynomial module 14 removes the unsuitable order pairs are "acceptable" order pairs. In this manner, generator polynomial module 14 may identify a set of acceptable order pairs. In the continuing example, the order pairs {1, 10}, {2, 9}, {3, 8}, and {5, 6} are the order pairs remaining in the set of candidate order pairs.

Generator polynomial module 14 may identify base polynomial $g_1(x)$ as either $(1+x^{O_j})$ or its factor and may identify base polynomial $g_2(x)$ as either $1+x+x^2+ \ldots +x^{O_j-1}$ or its irreducible factor (518). Generator polynomial module 14 may then construct a preliminary generator polynomial $g'(x)$ as $g_1(x) g_2(x)$ (520). Continuing the previous example, generator polynomial module 14 may identify the following preliminary generator polynomials based on the remaining order pairs in the set of candidate order pairs:

$g'(x)=(1+x)(1+x+x^2+x^3+x^4+x^5+x^6+x^7+x^8+x^9)$ from $\{\hat{p}_1, \hat{p}_2\}=\{1,10\}$, $g'(x)=(1+x)(1x+x^2+x^3+x^4+x^5+x^6+x^7+x^8+x^9+x^{10})$ from $\{\hat{p}_1, \hat{p}_2\}=\{1,11\}$, $g'(x)=(1+x^2)(1+x^3+x^6)$ from $\{\hat{p}_1, \hat{p}_2\}=\{2,9\}$, $g'(x)=(1+x^3)(1+x+x^2+x^3+x^4+x^5+x^6+x^7)$ from $\{\hat{p}_1, \hat{p}_2\}=\{3, 8\}$, and $g'(x)=(1+x^2)(1+x+x^2)(1+x+x^2+x^3+x^4)$ from $\{\hat{p}_1, \hat{p}_2\}=\{6, 5\}$.

After constructing preliminary generator polynomial $g'(x)$, generator polynomial module 14 may output preliminary generator polynomial $g'(x)$ (522). In operation 480, generator polynomial module 14 may use any acceptable order pair to generate base polynomial $g_1(x)$ and $g_2(x)$. Hence, it may not be necessary in operation 480 to loop back and perform any action with regard to remaining acceptable order pairs in the set of candidate order pairs.

Note that a similar technique may be based on the following discussion. Suppose that a generator polynomial $g(x)$ is in the form of $g(x)=g_1(x) g_2(x)$ where the orders of $g_1(x)$ and $g_2(x)$ are $p_1$ and $p_2$, respectively. Here, we assume $g_1(x)$ is a factor of $(1+x^{p_1})$ or itself, and $g_2(x)$ is a factor of $(1+x+x^2+ \ldots +x^{p_2-1})$ or itself. Note that $(1+x^{p_2})=(1+x)(1+x+X^2+ \ldots +x^{p_2-1})$. Then, the following theorem provides information about the lengths of error polynomials for which the same syndrome sets are yielded.

Theorem 1: Given $g(x)=g_1(x)g_2(x)$ where the respective orders of $g_1(x)$ and $g_2(x)$ are $p_1$ and $p_2'$ the same syndrome set for error polynomials $e_i(x)$ and $e_j(x)$ of lengths $(mp_1+np_2)$ and $|mp_1-np_2|$ is produced for any positive integers m and n.

Proof. For binary polynomials $a(x)$ of length $mp_1$ and $b(x)$ of length $np_2$, consider error polynomials $e_i(x)=a(x)+x^{mp_1}b(x)$ and $e'_j(x)=a(x)+b(x)$. The error polynomials $e_i(x)$ of length $(mp_1+np_2)$ and $e'_j(x)$ of length $|mp_1-np_2|$ can be written as $$e_i(x) = (1 + \ldots + x^{mp_1-1} + x^{mp_1} + \ldots + x^{mp_1+np_2-1})$$

$$e'_j(x) = x^{\min[mp_1, np_2]}(1 + \ldots + x^{|mp_1-np_2|-1})$$

$$= x^{\min[mp_1, np_2]}e_j(x)$$

Where error polynomial $e_j(x)=(1+ \ldots +x^{|mp_1-np_2|-1})$ and error polynomial $e_j(x)=0$ if $mp_1=np_2$. Then, $e_i(x)+e'_j(x)=[a(x)+x^{mp_1}b(x)]+[a(x)+b(x)]=b(x)(1+x^{mp_1})$ over GF(2). Since $g_1(x)$ is a factor of $(1+x^{mp_1})$ for any $m \geq 1$, $e'_i(x)+e'_j(x)$ is a multiple of $g_1(x)$. Also, $b(x)(1+x)=(1+x^{np_2})$ is a multiple of $(1+x^{p_2})=(1+x)(1+x+ \ldots +x^{p_2-1})$, and $g_2(x)$ is a factor of $(1+x+ \ldots +x^{p_2-1})$. Correspondingly, $b(x)$ is a multiple of $g_2(x)$. Therefore, $e_i(x)+e'_j(x)=b(x)(1+x^{mp_1})=g_1(x) g_2(x)Q(x)=g(x)Q(x)$. It can be re-written as $$e_i(x)+x^{\min[mp_1, np_2]}e_j(x)=g(x)Q(x).$$

From the previous argument, this means that generator polynomial $g(x)$ produces the same syndrome sets for error polynomial $e_i(x)$ of length $(mp_1+np_2)$ and $e_j(x)$ of length $|mp_1-np_2|$ for any positive integers m and n. From Theorem 1, given a set of length pairs of target error patterns, a set of order pairs that produces the same syndrome sets for the target error patterns of those lengths can be obtained. This can be summarized in the following corollary:

Corollary 1: For error polynomials $e_i(x)$ and $e_j(x)$ of lengths $l_i$ and $l_j$, $l_i \geq l_j$, a generator polynomial $g(x)$, consisting of any two factors whose order pairs are $$\left\{ \frac{(l_i \pm l_j)}{2m}, \frac{(l_i \mp l_j)}{2n} \right\}$$

for positive integers m and n, produces the same syndrome polynomial sets.

Proof. Let $l_i$ and $l_j$ denote $(mp_1+np_2)$ and $|mp_1-np_2|$, respectively. Then, $p_1$ and $p_2$ can be obtained by $$p_1 = \frac{l_i \pm l_j}{2m} \text{ and } p_2 = \frac{l_i \mp l_j}{2n}$$

where the sign in the nominator is determined by the sign of $(mp_1-np_2)$. Based on Theorem 1, if generator polynomial $g(x)$ consists of any two factors whose order pairs are $\{p_1, p_2\}$ then this generator polynomial $g(x)$ produces the same syndrome polynomial sets for error polynomials of lengths $$\left( m\frac{l_i \pm l_j}{2m} + n\frac{l_i \mp l_j}{2n} \right) \text{ and } \left| m\frac{l_i \pm l_j}{2m} - n\frac{l_i \mp l_j}{2n} \right|,$$

which become $l_i$, and $l_j$, respectively.

It is seen in corollary 1 that $(l_i \pm l_j)$ should be an even integer in order for the orders $p_1$ and $p_2$ to be positive integers. This in turn means that if $l_i$ is an even (or odd) integer, then $l_j$ should also be an even (or odd) integer. Thus, given L target error polynomials, we do not have to consider $$\binom{L}{2}$$

length pairs. Rather, a set of even-numbered lengths and a set of odd-numbered lengths are separately considered for finding unsuitable order pairs that cannot produce distinct syndrome sets for all target error polynomials. Moreover, once an unsuitable order pair $$\left\{ \frac{(l_i \pm l_j)}{2}, \frac{(l_i \mp l_j)}{2} \right\}$$

for each length pair $\{l_i, l_j\}$ is obtained, it is not necessary to find additional order pairs with dividing factors m and n, because the elements in any extra order pairs are nothing but factors of the elements in the order pair, i.e., $$\left\{ \frac{(l_i \pm l_j)}{2m}, \frac{(l_i \mp l_j)}{2n} \right\}.$$

Hence, given a set of unsuitable order pairs, acceptable order pairs can be obtained by eliminating all the unsuitable order pairs and their factors, among any possible order pairs. Then, with the acceptable order pairs, we can construct generator polynomials that guarantee distinct syndrome sets.

FIG. 15 is a block diagram illustrating an alternate implementation of inner decoder 58. Inner decoder 58 illustrated in FIG. 15 may be used to employ the principles of the following discussion. Given a degree-r preliminary generator polynomial g'(x) of order p that is tailored to target error patterns $e_i(x)$'s, $i \in \{1, \ldots, L\}$, consider the following polynomial $$g(x) = g'(x) p'(x)$$

where p'(x) is a degree-m primitive polynomial which is not a factor of any error polynomials $e_i(x)$'s. For purposes of explanation, this disclosure refers to p'(x) as an "external factor." Also, the corresponding order $(2^m-1)$ is relatively prime top, i.e., $GCD[p, 2^m-1]=1$. Then, the order p' of generator polynomial g(x) is simply obtained as $$p' = p \times (2^m - 1)$$

because p' is the smallest integer, such that both preliminary generator polynomial g'(x) and external factor p'(x) are factors of $(x^{p'}+1)$. When final generator polynomial g(x) is regarded as a generator polynomial, a (p', p'-r-m) cyclic code is produced. A unique mapping between syndrome sets and target error patterns is preserved with preliminary generator polynomial g'(x), but now that preliminary generator polynomial g'(x) is multiplied by external factor p'(x), the periods of new syndrome sets are increased by the order of external factor p'(x).

For comparison, a t-burst-error-correcting Fire code, based on the following generator polynomial $g_f(x)$, is considered:

$$g_f(x) = (x^{2t-1}+1) p(x)$$

Here, p(x) is a degree-m primitive polynomial, and the degree m should be greater than or equal to t. Given t, the least redundancy is obtained in the case of m=t. The order $p_f$ of $g_f(x)$ is the LCM of 2t-1 and $2^m-1$, i.e., $$p_f = LCM\,[2t-1,\, 2^m-1].$$

As a result, a $(p_f, p_f-2t+1-m)$ Fire code can be constructed, and the Fire code can algebraically correct any single burst-error of length t or less.

A difference between the two cyclic codes is in the construction methodologies of generator polynomials g(x) and $g_f(x)$. While a factor $(x^{2t-1}+1)$ in $g_f(x)$ is determined only by the maximum length t of burst errors to be corrected, irrespective of dominant error patterns, a lowest-degree polynomial in g(x) is systematically constructed that guarantees distinct syndrome sets for given L target error patterns.

The (p', p'-r-m) cyclic code can also be extended, with extension parameter s', into a (p's', p's'-r-m) cyclic code, because $(x^{p's'}+1)$ is a multiple of final generator polynomial g(x) for any positive integer s'. Recall that a (ps, ps-r) cyclic code constructed by preliminary generator polynomial g'(x) consists of s sub-blocks. Now, the (p's', p's'-r-m) cyclic code based on final generator polynomial g(x) contains s' sub-blocks. It is seen that by assuming a fixed codeword length, i.e., p's'=ps, s' is always smaller than s, because $p'=p \times (2^m-1) > p$. The number of sub-blocks in the (p's', p's'-r-m) cyclic code can be expressed as $$s' = \frac{s}{(2^m - 1)}.$$

If m is large enough, s' becomes considerably small. Then, the number of ways that a wrong error-type decision is made due to E erroneous sub-blocks, $2 \leq E \leq s'$, can be computed, by replacing s by s' in (1), as $$\sum_{i=2}^{s'} \binom{s'}{i} = 2^{s(2^m-1)^{-1}} - (1 + s \cdot (2^m - 1)^{-1}).$$

By choosing a degree-m p'(x) such that its order $(2^m-1)$ is equal to s, it is possible to algebraically correct a single occurrence of a target error pattern without any mis-correction. This makes sense because if $s=2^m-1$, then s'=1 because $s'=s/(2^m-1)$, and the corresponding (p's', p's'-r-m) cyclic code consists of only one sub-block.

It has been shown that a mirror-image error polynomial $e(x)=x^{p\mu}e_i(x)+x^{pv}e_i(x)$, $0 \leq \mu < v \leq (s-1)$, cannot be detected with a (p's', p's'-r-m) cyclic code based on generator polynomial g(x). However, with a (p's', p's'-r-m) cyclic code based on final generator polynomial g(x), this error polynomial e(x) can be identified, as long as both pμ and pv are not multiples of $p'=p \times (2^m-1)$. Since p' is much greater than p, the number of possibilities is very small. In particular, when s'=1 from $s=(2^m-1)$, μ and v cannot be different, because $0 \leq \mu < v \leq (s'-1)=0$. Consequently, when s'=1, there exists no mirror-image error pattern that produces the zero syndrome.

This is an important property for discriminating between single and multiple occurrences. Most multiple occurrences are mistaken as a single target error pattern, and subsequently mis-correction is made. Miscorrection often creates a mirror-image error pattern, so that its syndrome becomes zero and it is impossible to detect the presence of the error pattern. However, the probability that a mirror-image error pattern occurs in a (p's', p's'-r-m) cyclic code based on final generator polynomial g(x) can be greatly reduced when the code consists of only a few sub-blocks or one sub-block. Therefore, it is possible to recognize a significant portion of mis-correction by the syndrome re-check. Moreover, single and multiple occurrences can also be determined by the syndrome re-check. For a single occurrence, the re-computed syndrome for a decoded codeword must be zero, otherwise, it must be multiple occurrences.

Besides the syndrome re-check, some highly-probable multiple occurrences that consist of combinations of the most dominant error patterns can be distinguished by extra syndrome mapping. A degree-r preliminary generator polynomial g'(x) utilizes L different syndrome sets for identifying L target error patterns. Let $n_L$ be the number of syndrome elements in the L syndrome sets. Because preliminary generator polynomial g'(x) produces a total of $(2^r-1)$ syndromes, the number of unused syndromes are $(2^r-1)-n_L$, where $n_L \leqq (2^r-1)$. When preliminary generator polynomial g'(x) is multiplied by a degree-m external factor p'(x), final generator polynomial g(x) of degree (r+m) is constructed, and this final generator polynomial g(x) produces a total of $(2^{r+m}-1)$ syndromes. Now, the number of syndrome elements in L syndrome polynomial sets becomes $n_L \cdot (2^m-1)$, and the number of unused syndromes is $(2^{r+m}-1)-n_L \cdot (2^m-1) = 2^m(2^r-n_L)+n_L-1$. When m is large enough, the number of unused syndrome polynomials is substantially increased. Accordingly, it may be possible to have extra mappings between the unused syndrome sets and highly-probable multiple occurrences.

The exemplary implementation of inner decoder 58 illustrated in FIG. 15 may employ the principles in the foregoing discussion. For instance, as illustrated in the example of FIG. 15, inner decoder 58 includes a maximum a posteriori ("MAP") detector 540. MAP detector 540 may receive an estimated encoded input stream from detector 56. When MAP detector 540 receives the estimated encoded input stream, MAP detector 540 may remove the estimated effects of inter-symbol interference from the input stream and ouput an estimated stream. A slicer 542 may then "slice" the estimated stream into a series of estimated codewords. A syndrome computation module 544 may then, for each estimated codeword $\hat{c}_k$, use final generator polynomial g(x) to calculate a syndrome polynomial s(x). An error decision module 546 may then determine whether the calculated syndrome polynomial s(x) corresponds to an all-zero polynomial, a known single error polynomial, or a known multiple error polynomial.

After error decision module 546 makes this determination, error decision module 546 may pass this syndrome polynomial to a set of error decoders 548A through 548D (collectively "error decoders 548"). Error decoders 548 may operate in parallel, serial, or some combination of parallel or serial.

If the syndrome polynomial corresponds to an all-zero polynomial, error decoder 548A may extract the message from the estimated codeword $\hat{c}_k$ and output the message. If the syndrome polynomial corresponds to a known single error polynomial, error decoder 548B may determine whether the error polynomial could be located in more than one position. If the error polynomial could be located in more than one position, error decoder 548B may identify the reliability measures associated with each of the possible positions. Error decoder 548B may then correct the estimated codeword $\hat{c}_k$ by subtracting the error polynomial from the estimated codeword at the most likely position. After correcting the estimated codeword $\hat{c}_k$, error decoder 548B may provide the corrected codeword back to syndrome When syndrome computation module 544 receives the corrected codeword, syndrome computation module 544 computes the syndrome polynomial of the corrected codeword. Error decision module 546 may then determine whether the syndrome polynomial of the corrected codeword is an all-zero syndrome polynomial, whether the syndrome polynomial corresponds to a known single error polynomial, or whether the syndrome polynomial corresponds to a known multiple error polynomial. The determination of error decision module 546 is then passed to error decoders 548. Error decoders 548 may then perform correction as appropriate. The components of inner decoder 58 may repeat this sequence until the syndrome polynomial is an all-zero syndrome polynomial.

It should be noted that the exemplary implementation in FIG. 15 may be used in conjunction with a supplemental decoder 550. Supplemental decoder 550 may include a random-error correction decoder matched to the generator polynomial g'(x). The generator polynomial g'(x) possesses a certain minimum distance property, meaning that a traditional random-error correcting decoder may be used in conjunction with the above decoding methods. The use of a random error decoder may cover the error events for which the number of erroneous bits is less than half the minimum distance. This may enhance the overall coverage of the correctable error events by the third decoder module, as the third decoder module no longer needs to worry about the events covered by the random decoder (i.e., the fourth decoder module). Furthermore, error decoder 548B module does not need to use its resources (i.e., the syndrome sets) to cover other error events. For example, with $d_{min}$ of 8, supplemental decoder 550 is able to correct any combination of up to three erroneous bits. As a result, supplemental decoder 550 may be able to handle the first two error events in the double occurrence list and the first in the triple occurrence list and the first two error events in the double occurrence list may be excluded from the target set for the third decoder module.

Supplemental decoder 550 may use any conventional random error correcting decoder (e.g., Berlekamp-Massey algebraic decoder) using the minimum distance property inherent in g'(x) in combination with the first through the third decoder modules. For example, a random error decoder can be implemented in parallel with above decoders.

Although the techniques above use a single syndrome to identify an error polynomial, in an alternate embodiment, the error polynomial may be identified using a syndrome pair. Like the embodiment described in detail above, a syndrome pair $\{s_{g',i}(x), s_{p',i}(x)\}$ may be associated with each dominant error pattern $e_i$. A syndrome polynomial $s_{g',i}(x)$ in syndrome polynomial pair $\{s_{g',i}(x), s_{p',i}(x)\}$ is a syndrome polynomial generated by dividing a received codeword polynomial r(x) that includes an instance of dominant error pattern $e_i$ by preliminary generator polynomial g'(x). That is, $s_{g',i}(x)=r(x)+g'(x)Q_{g'}(x)$, where $Q_{g'}(x)$ is a quotient polynomial. Similarly, syndrome polynomial $s_{p',i}(x)$ in syndrome polynomial pair $\{s_{g',i}(x), s_{p',i}(x)\}$ is a syndrome polynomial generated by dividing a received codeword polynomial r(x) that includes an instance of dominant error pattern $e_i$ by external factor p'(x). That is, $s_{p',i}(x)=r(x)+p'(x)Q_{p'}(x)$, where $Q_{p'}(x)$ is a quotient polynomial.

Upon receiving a word, the decoding device may calculate a syndrome, e.g., using a feedback shift register. The decoding device determines whether the syndrome polynomial $s_{g'}(x)$ is equal to zero and whether a syndrome polynomial $s_{p'}(x)$ is not equal to zero in a manner similar to that described above. The decoding device may determine that the computed syndrome polynomials indicate that the estimated codeword r contains multiple instances of one or more dominant error patterns when either syndrome polynomial $s_{g'}(x)$ is not equal to zero and/or when syndrome polynomial $s_{p'}(x)$ is not equal to zero. In other words, error decision module 114 may determine that the computed syndrome polynomials indicate that the estimated codeword r contains no instances of any dominant error patterns when syndrome polynomial $s_g(x)$ and syndrome polynomial $s_p(x)$ are both equal to zero. In this manner similar techniques may be determine errors using 2-dimensional syndromes.

The techniques described herein may be implemented in hardware, software, firmware, or any combination thereof. Any features described as modules or components may be implemented together in an integrated logic device or separately as discrete but interoperable logic devices. If implemented in software, the techniques may be realized at least in part by a computer-readable medium comprising instructions that, when executed, performs one or more of the methods described above. The computer-readable medium may form part of a computer program product, which may include packaging materials. The computer-readable medium may comprise random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates code in the form of instructions or data structures and that can be accessed, read, and/or executed by a computer.

The code may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structures or any other structure suitable for implementation of the techniques described herein, including one or more processors. In addition, in some aspects, the functionality described herein may be provided within dedicated software modules or hardware modules configured for encoding and decoding, or incorporated in a combined encoder-decoder (CODEC).

The functions may be applied to any type of data including but not limited to music data, video data, multimedia data, or other entertainment data, financial data, security data, business data, government data, military data, marketing data, sales data, medical patient data, medical diagnostic data, medical imaging data, data representing graphical or textual content, image data, chemical data, geographic data, mapping data, television broadcast data, radio broadcast data, email data, Internet data, personal data, or the like.

Hence, the techniques may be implemented in any of a variety of communication and data storage devices, including disk read/write controllers, optical, magnetic, magneto-optical or other data storage media read or write controllers, bus controllers, wired or wireless modems, wired or wireless receivers, wired or wireless transmitters, encoders, decoders, or processors any of which may process, store, read, write, encode or decode a variety of data. As mentioned previously, the techniques described in this disclosure may be used in a wide variety of electronic devices.

For example, a hard disk read/write controller in a data storage system may apply error pattern correcting cyclic codes to generate a codeword that contains data read from a data storage medium. The hard disk read/write controller may then transmit the codeword to a processor in the data storage system. The processor may then decode the codeword and determine whether there are any errors in the codeword. Soft information based list decoding likewise may be used in such applications. If there are no errors in the codeword or the processor may correct errors in the codeword, the processor may store the data contained in the codeword to a memory unit in the data storage system. If there are errors in the codeword, the processor may be able to correct the errors. In this example, if the processor is unable to correct the errors, the processor may instruct the hard disk read/write controller to move a read/write head of the hard disk to read the data from the data storage medium again.

Various example implementations have been described. These and other implementations are within the scope of the following claims.

The invention claimed is:

1. A method comprising:
   receiving a message in an electronic communication system; and
   generating a codeword based on the message and a generator polynomial g(x) that contains an irreducible factor that is present in a set of targeted error polynomials that represent one or more targeted error patterns,
   wherein the generator polynomial g(x) is of a form g(x)=g'(x)p'(x), where g'(x) is a preliminary generator polynomial selected such that there exist a plurality of distinct syndrome sets for the targeted error patterns, and p'(x) is an external factor that is not a factor of any error polynomial in the set of targeted error polynomials.

2. The method of claim 1, wherein each of the syndrome sets corresponds with only one of the targeted error patterns of the set of targeted error patterns and one or more possible starting positions for the corresponding targeted error pattern.

3. The method of claim 1, further comprising:
   identifying one of a string of consecutive ones, a string of consecutive zeros and a string of alternating ones and zeros within the generated codeword that exceeds a threshold string length; and
   forcing an error pattern within the generated codeword.

4. The method of claim 3, wherein forcing an error pattern within the generated codeword comprises forcing an error pattern that may be removed at a receiver side.

5. The method of claim 3, wherein the forced error pattern comprises one of the targeted error patterns.

6. The method of claim 1, further comprising transmitting the codeword via a communication interface.

7. The method of claim 1, further comprising storing the codeword on a data storage medium.

8. A device comprising an encoding module that receives a message and generates a codeword based on the message and a generator polynomial g(x) that contains an irreducible factor that is present in a set of targeted error polynomials that represent one or more targeted error patterns, wherein the generator polynomial g(x) is of a form g(x)=g'(x)p'(x), where g'(x) is a preliminary generator polynomial selected such that there exist a plurality of distinct syndrome sets for the targeted error patterns, and p'(x) is an external factor that is not a factor of any error polynomial in the set of targeted error polynomials.

9. The device of claim 8, further comprising a data storage medium, wherein the encoding module writes the generated codeword to the data storage medium.

10. The device of claim 8, further comprising a transmitter that transmits the generated codeword to a communication network.

11. The device of claim 8, wherein each of the syndrome sets corresponds with only one of the targeted error patterns of the set of targeted error patterns and one or more possible starting positions for the corresponding targeted error pattern.

12. The device of claim 8, wherein the encoding module identifies one of a string of consecutive ones, a string of consecutive zeros, and a string of alternating ones and zeros within the generated codeword that exceeds a threshold string length and forces an error pattern within the generated codeword.

13. The device of claim 12, wherein forcing an error pattern within the generated codeword comprises forcing an error pattern that may be removed at a receiver side.

14. The device of claim 12, wherein the forced error pattern comprises one of the targeted error patterns.

15. A non-transitory computer-readable medium comprising instructions that, when executed, cause one or more processors to:

receive a message in an electronic communication system; and generate a codeword based on the message and a generator polynomial $g(x)$ that contains an irreducible factor that is present in a set of targeted error polynomials that represent one or more targeted error patterns, wherein the generator polynomial $g(x)$ is of a form $g(x)=g'(x)p'(x)$, where $g'(x)$ is a preliminary generator polynomial selected such that there exist a plurality of distinct syndrome sets for the targeted error patterns, and $p'(x)$ is an external factor that is not a factor of any error polynomial in the set of targeted error polynomials.

16. The non-transitory computer-readable medium of claim 15, wherein the generator polynomial $g(x)$ is of a form $g(x)=g'(x)p'(x)$, where $g'(x)$ is a preliminary generator polynomial selected such that there exist a plurality of distinct syndrome sets for the targeted error patterns, and $p'(x)$ is an external factor that is not a factor of any error polynomial in the set of targeted error polynomials.

17. The non-transitory computer-readable medium of claim 16, wherein each of the syndrome sets corresponds with only one of the targeted error patterns of the set of targeted error patterns and one or more possible starting positions for the corresponding targeted error pattern.

18. An apparatus comprising:

means for receiving a message in an electronic communication system; and means for generating a codeword based on the message and a generator polynomial $g(x)$ that contains an irreducible factor that is present in a set of targeted error polynomials that represent one or more targeted error patterns, wherein the generator polynomial $g(x)$ is of a form $g(x)=g'(x)p'(x)$, where $g'(x)$ is a preliminary generator polynomial selected such that there exist a plurality of distinct syndrome sets for the targeted error patterns, and $p'(x)$ is an external factor that is not a factor of any error polynomial in the set of targeted error polynomials.

19. The apparatus of claim 18, wherein each of the syndrome sets corresponds with only one of the targeted error patterns of the set of targeted error patterns and one or more possible starting positions for the corresponding target error pattern.

20. The apparatus of claim 18, further comprising:

means for identifying one of a string of consecutive ones, a string of consecutive zeros and a string of alternating ones and zeros within the generated codeword that exceeds a threshold string length; and means for forcing an error pattern within the generated codeword.

21. The apparatus of claim 20, wherein means for forcing an error pattern within the generated codeword comprises means for forcing an error pattern that may be removed at a receiver side.

22. The apparatus of claim 20, wherein the forced error pattern comprises one of the targeted error patterns.

23. The apparatus of claim 18, further comprising means for transmitting the codeword via a communication interface.

24. The apparatus of claim 23, further comprising means for storing the codeword on a data storage medium.

* * * * *